(12) United States Patent
Ohara et al.

(10) Patent No.: US 10,651,253 B2
(45) Date of Patent: May 12, 2020

(54) LIGHT EMITTING ELEMENT, DISPLAY PANEL, DISPLAY DEVICE, ELECTRONIC DEVICE AND METHOD FOR PRODUCING LIGHT EMITTING ELEMENT

(71) Applicant: Sharp Kabushiki Kaisha, Osaka (JP)

(72) Inventors: Masanori Ohara, Osaka (JP); Hideki Uchida, Osaka (JP); Katsuhiro Kikuchi, Osaka (JP); Satoshi Inoue, Osaka (JP); Yuto Tsukamoto, Osaka (JP); Kazuki Matsunaga, Osaka (JP); Eiji Koike, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 347 days.

(21) Appl. No.: 15/518,953

(22) PCT Filed: Oct. 9, 2015

(86) PCT No.: PCT/JP2015/078813
§ 371 (c)(1),
(2) Date: Apr. 13, 2017

(87) PCT Pub. No.: WO2016/060089
PCT Pub. Date: Apr. 21, 2016

(65) Prior Publication Data
US 2017/0243932 A1    Aug. 24, 2017

(30) Foreign Application Priority Data
Oct. 16, 2014    (JP) .................. 2014-212090

(51) Int. Cl.
*H01L 27/32* (2006.01)
*H01L 51/52* (2006.01)
(Continued)

(52) U.S. Cl.
CPC ...... *H01L 27/3248* (2013.01); *H01L 27/3258* (2013.01); *H01L 27/3262* (2013.01);
(Continued)

(58) Field of Classification Search
None
See application file for complete search history.

(56) References Cited

U.S. PATENT DOCUMENTS

2010/0176717 A1* 7/2010 Lee ................ H01L 51/5271
313/504
2014/0306200 A1* 10/2014 Jinta ............... H01L 27/3218
257/40
(Continued)

FOREIGN PATENT DOCUMENTS

| JP | 2012-221811 A1 | 11/2012 |
|----|----------------|---------|
| JP | 2014-045166 A  | 3/2014  |
| KR | 10-2007-0041240 A | 4/2007 |

*Primary Examiner* — Shaun M Campbell
*Assistant Examiner* — Aneta B Cieslewicz
(74) *Attorney, Agent, or Firm* — ScienBiziP, P.C.

(57) ABSTRACT

A light emitting element including at least a first trench portion having an indented shape within a single light emitting region. The first trench portion includes a first electrode, an EL layer, and a second electrode. The first electrode, the EL layer, and the second electrode are layered in this order and in contact with each other. At least one of the first electrode or the second electrode includes a reflective electrode.

10 Claims, 13 Drawing Sheets

(51) Int. Cl.
*H01L 51/50* (2006.01)
*G09G 3/3225* (2016.01)
(52) U.S. Cl.
CPC ...... *H01L 27/3276* (2013.01); *H01L 51/5012* (2013.01); *H01L 51/5271* (2013.01); *G09G 3/3225* (2013.01); *H01L 2227/323* (2013.01)

(56) References Cited

U.S. PATENT DOCUMENTS

2014/0306241 A1\* 10/2014 Hirakata ............. H01L 51/5281 257/79
2015/0138463 A1 5/2015 Jinta et al.
2016/0149154 A1\* 5/2016 Park ................... H01L 51/5209 257/40

\* cited by examiner

LIGHT EMITTING ELEMENT, DISPLAY PANEL, DISPLAY DEVICE, ELECTRONIC DEVICE AND METHOD FOR PRODUCING LIGHT EMITTING ELEMENT

TECHNICAL FIELD

The present disclosure relates to a light emitting element, a display panel, a display device, an electronic device, and a method for producing a light emitting element.

BACKGROUND ART

In recent years, flat panel displays have been utilized in various products and fields, and there are demands for flat panel displays having even larger sizes, even higher picture quality, and even lower power consumption.

In view of such circumstances, organic electroluminescent (referred to as EL below) display devices provided with organic EL elements utilizing the electroluminescence of organic materials are attracting much attention as flat panel displays due to their excellent qualities, such as low voltage driving, high responsiveness, and self-luminosity, while being in a completely solid state.

An organic EL display device has a configuration including, for example, thin film transistors (TFTs) provided on a substrate, such as a glass substrate, and organic EL elements provided on the substrate connected to the TFTs.

Organic EL elements are light emitting elements capable of emitting light at high luminance using low voltage direct current driving, and have a configuration in which a first electrode, an organic EL layer, and a second electrode are layered in this order.

An organic EL layer is an organic compound layer including a light emitting layer. A full color organic EL display device generally includes organic EL elements of each color for red (R), green (G), and blue (B) formed in an array on the substrate as sub pixels. TFTs are employed in a full color organic EL display device to display pictures by selectively causing these organic EL elements to emit light at a desired luminance.

However, generally, a portion of light from the light generated in the light emitting layer of each of the organic EL elements is not externally extracted from the organic EL element, but instead, propagates inside the organic EL element and is trapped within the organic EL element due to reflection, such as at the interfaces between the first electrode or the second electrode and the organic EL layer.

Thus, regarding organic EL display devices, there is a proposal for a method of externally extracting the portion of the light trapped within the organic EL elements. In the proposed method, light which is being reflected at interfaces, propagating within the organic EL elements, and not externally extractable from the organic EL elements (being attenuated due to a light propagation distance limit) is reflected using a plurality of walls and sloping banks having reflecting properties (see, for example, PTL 1).

FIG. 13A is a plan view illustrating a schematic configuration of sub pixels 510R, 510G, and 510B in an organic EL display device 500 described in PTL 1. FIG. 13B is a cross-sectional view taken along line J-J of the sub pixel 510R illustrated in FIG. 13A.

As illustrated in FIG. 13A, the organic EL display device 500 has a configuration in which a plurality of sub pixels 510R, 510G, and 510B configured to exhibit each of three different colors, red (R), green (G), and blue (B), are each arranged within a display region.

As illustrated in FIG. 13B, the sub pixels 510R are each divided into a plurality of light emitting regions 510Ra by partitions 527 serving as non-light-emitting regions (see FIG. 13B). Similarly, the sub pixels 510G and 510B are each divided into a plurality of light emitting regions 510Ga and 510Ba.

As illustrated in FIG. 13B, the organic EL display device 500 includes a substrate 520 on which TFT circuit portions 521 are formed, and side layers 523 disposed on the substrate 520, with a flattened layer 522 interposed between the substrate 520 and the side layers 523. A first electrode 525 is disposed on the flattened layer 522 and the side layers 523. Reflection structures 526 are formed by the side layers 523 and the first electrode 525.

As illustrated in FIG. 13A, first electrodes 525 are isolated from each other for each of the sub pixels 510R, 510G, and 510B. The first electrode 525 for each of the sub pixels 510R, 510G, and 510B is electrically connected to a different respective TFT circuit portion 521 (TFT drive circuit) through a contact portion 524. A plurality of light emitting regions within the same sub pixel, for example, the plurality of light emitting regions 510Ra within the sub pixel 510R, have a common first electrode 525, and so are driven by the same TFT circuit portion 521.

As illustrated in FIG. 13B, the partitions 527 are disposed on the first electrode 525, and cover the first electrode 525 on the side layers 523 and the first electrode 525 at the contact portion 524.

An organic EL layer 528 including at least a light emitting layer is disposed above the first electrode 525. A second electrode 529 is disposed on the organic EL layer 528 spanning across an entire display region 501. Organic EL elements are configured by the first electrode 525, the organic EL layer 528, and the second electrode 529. Since the partitions 527 are disposed on the first electrode 525, the organic EL layer 528 above the reflection structures 526 does not emit light. Regions within trenches 530 (indentations) formed by the partitions 527 and lying between the partitions 527 are employed as the light emitting regions 510Ra, 510Ga, and 510Ba.

According to PTL 1, the reflection structures 526 include inclined faces at the side layers 523, and, out of the light emitted by the light emitting regions, light travelling in the in-plane direction of the substrate 520 is reflected by the first electrode 525 on the inclined faces.

Thus, according to PTL 1, a portion of light trapped within the organic EL elements is reflected by the reflection structures 526 at the trenches 530, enabling external extraction from the organic EL elements, and enabling the light extraction efficiency to be increased.

CITATION LIST

Patent Literature

PTL 1: Japanese Unexamined Patent Application Publication No. 2012-221811A (published Nov. 12, 2012).

SUMMARY

Technical Problem

However, in PTL 1, each of the sub pixels 510R, 510G, and 510B is provided with a plurality of trenches 530 provided side-by-side at a predetermined trench pitch P along the horizontal direction in an island pattern (see FIG.

13B). In PTL 1, the inter-trench space S (see FIG. 13B), where the partition 527 is disposed, is a non-light-emitting region.

Namely, the organic EL display device 500 of PTL 1 has a configuration including, within the sub pixel 510R, for example, a plurality of light emitting regions 510Ra partitioned by a plurality of non-light-emitting regions arising from presence of the partition walls 527, with one of the trenches 530 formed in each one of the light emitting regions 510Ra.

Thus, in PTL 1, the surface area of the light emitting regions within each of the sub pixels 510R, 510G, and 510B is defined by the size in plan view of openings, each of the openings being defined by two partitions 527, in other words, by the surface area in plan view of the trenches 530 within each of the sub pixels 510R, 510G, and 510B.

The organic EL display device 500 of PTL 1 includes the partitions 527 on the reflection structures 526 as described above. Namely, the organic EL display device 500 of PTL 1 has a configuration including an insulating layer provide within the trenches 530. Accordingly, superfluous reflection occurs in which a portion of the light generated in the organic EL layer 528 may be reflected by an interface between the first electrode 525 and the insulating layer (the partition 527) forming the reflection structure 526 or the like, and propagates within the insulating layer without being externally extracted.

In view of the above circumstances, an object of the present disclosure is to provide a light emitting element, a display panel, a display device, and an electronic device capable of externally extracting light generated in the light emitting layer with good efficiency, and a method for producing a light emitting element of the same.

Solution to Problem

To address the above issues, a light emitting element of an aspect of the present invention is a light emitting element including a substrate, an interlayer insulating layer on the substrate, a first electrode, an electroluminescent layer including at least a light emitting layer, and a second electrode. The first electrode, the electroluminescent layer, and the second electrode are layered in this order with an interlayer insulating layer interposed between the substrate and the first electrode. One electrode out of the first electrode and the second electrode includes a reflective electrode. At least one trench having an indented shape is disposed within a single light emitting region. The at least one trench includes the first electrode, the electroluminescent layer, and the second electrode, the first electrode, the electroluminescent layer, and the second electrode being layered in this order and in contact with each other.

To address the above issues, a display panel according to an aspect of the present invention includes a plurality of the light emitting elements, the plurality of the light emitting elements being arranged.

To address the above issues, a display device according to an aspect of the present invention includes the display panel 2.

To address the above issues, an electronic device according to an aspect of the present invention includes the light emitting element.

To address the above issues, a method for producing a light emitting element according to an aspect of the present invention is a method including: forming at least one trench in an interlayer insulating layer layered on a substrate, the at least one trench being formed in a region for forming a light emitting region; forming a first electrode on the interlayer insulating layer, the first electrode including a trench surrounding the trench of the interlayer insulating layer forming an edge cover on the first electrode, the edge cover surrounding the trench in the first electrode, covering end portions of the first electrode where the trench in the first electrode is not formed, and including an opening at the light emitting region; and forming an electroluminescent layer and a second electrode on the first electrode, the electroluminescent layer including at least a light emitting layer, and the first electrode, the electroluminescent layer, and the second electrode being layered in this order and in contact with each other at the trench in the first electrode. In such a method, a reflective electrode is used as one electrode out of the first electrode and the second electrode.

Advantageous Effects of Invention

According to an aspect of the present invention, the trenches in the above light emitting element each include the first electrode, the electroluminescent layer, and the second electrode, the first electrode, the electroluminescent layer, and the second electrode being layered in this order and in contact with each other, and do not include an insulating layer on a reflection structure, as is the case in PTL 1.

Thus, in the above light emitting element, light from the light emitting regions is reflected from a reflective electrode without interposing an insulating layer. Thus, in the above light emitting element, superfluous reflection like that of PTL 1 does not occur, enabling light generated in the light emitting layer to be externally extracted with good efficiency.

Thus, an aspect of the present invention enables the provision of a light emitting element, a display panel, a display device, and an electronic device capable of externally extracting light generated in the light emitting layer with good efficiency, and the provision of a method for producing a light emitting element of the same.

DESCRIPTION OF EMBODIMENTS

A detailed description follows regarding embodiments of the present invention.

First Embodiment

A description follows regarding an embodiment of the present invention, on the basis of FIGS. 1A and 1B to FIGS. 4A to 4C.

In the following, a description is given of an example of a case in which light emitting elements including an EL element according to the present embodiment are employed as pixel circuits (sub pixel circuit portions) in a display device.

Schematic Configuration of Display Device

The display device according to the present embodiment includes an active electroluminescent display panel (EL panel) including active pixels, or a passive EL panel without active elements within pixels. The display device of the present embodiment may also further include a driver, such as a gate scan driver or source driver, depending on the design scheme of the display device.

In the present embodiment, a description follows of an example of an organic EL display device, as an example of a display device according to the present embodiment. The organic EL display device is provided with an active matrix organic EL panel using, as a substrate for mounting EL elements, a substrate (active matrix substrate, semiconductor substrate) formed with thin film transistors (TFTs) as active elements. The active matrix organic EL panel includes, as respective pixel circuits (sub pixel circuit portions), a plurality of light emitting elements configured by organic EL elements provided, as EL elements, above the substrate with an interlayer insulating layer interposed between the organic EL elements and the substrate.

Moreover, in the following, a description is given of an example of a case in which an EL panel includes, as sub pixels, pixel circuits (sub pixel circuit portions) formed from light emitting elements of red (R), green (G), and blue (B). In the following, the light emitting elements (pixel circuits) according to the present embodiment are referred to as "sub pixel circuit portions".

Figure 2A:
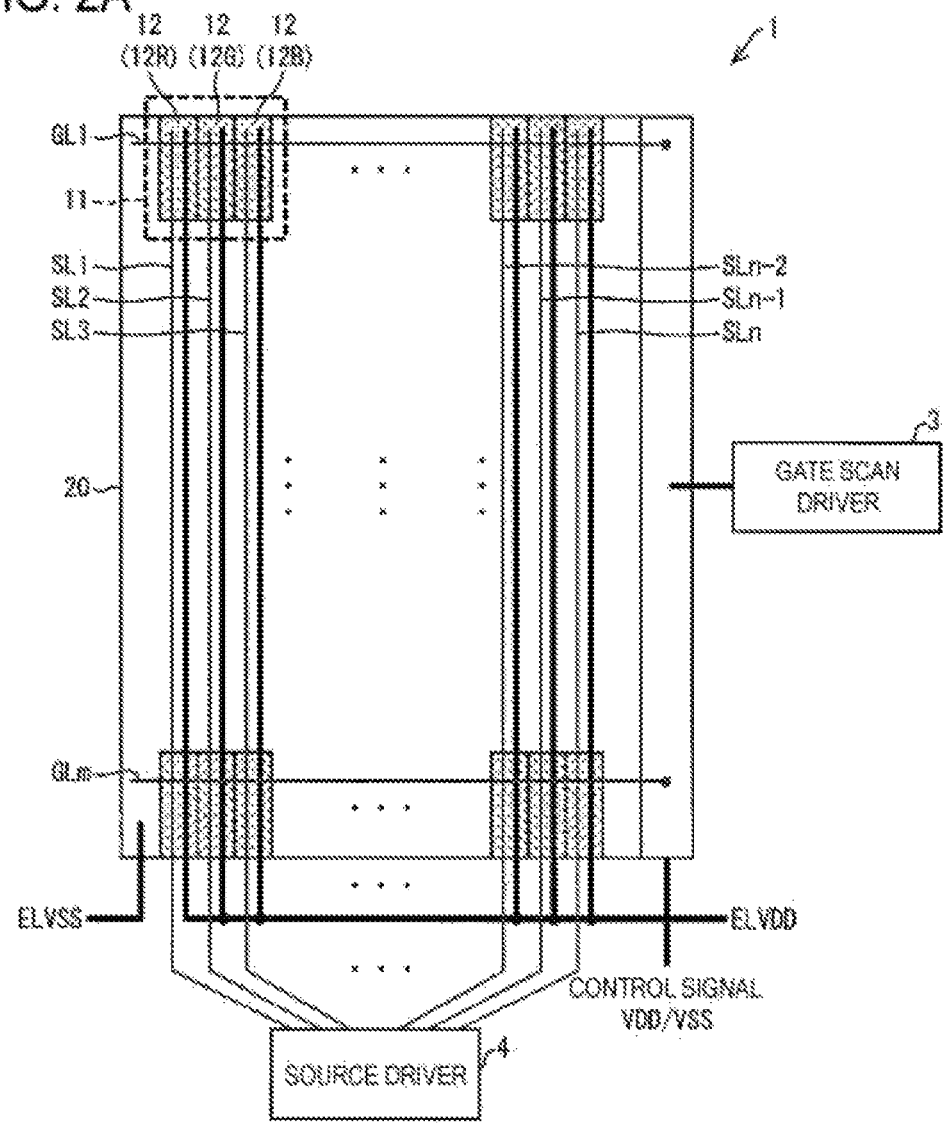
FIG. 2A is a plan view illustrating a schematic configuration of a display device according to the first embodiment of the present invention.
Figure 2B:
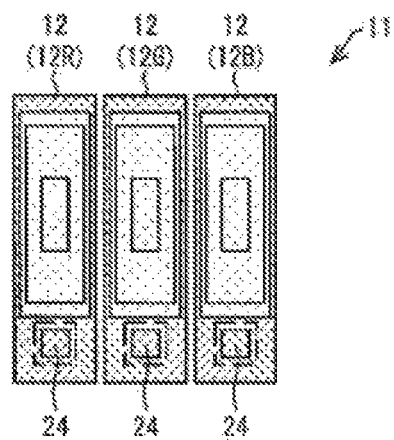
FIG. 2B is a plan view illustrating a schematic configuration of a pixel circuit portion illustrated in FIG. 2A.

FIG. 2A is a plan view illustrating a schematic configuration of a display device 1 according to the present embodiment. FIG. 2B is a plan view illustrating a schematic configuration of a pixel circuit portion 11 illustrated in FIG. 2A.

The display device 1 according to the present embodiment is an organic EL display device for color display using the three primary colors RGB.

The display device 1 according to the present embodiment includes, as illustrated in FIG. 2A: a display panel 2 (display unit) formed from an active matrix organic EL panel; drivers, such as a gate scan driver 3 (gate driver) and a source driver 4; a power source circuit unit, such as a high level power source circuit unit, a low level power source circuit unit, and a logic power source circuit unit, which is not illustrated; and a display control circuit unit, which is not illustrated. More detailed description follows.

Display Panel 2

The display panel 2 includes a plurality of (m) scanning lines GL1 to GLm, and a plurality of (n) data lines SL1 to SLn, each orthogonal to the scanning lines GL1 to GLm, the plurality (m) of scanning lines GL1 to GLm and the plurality of (n) data lines SL1 to SLn being provided in a predetermined position. In the present embodiment, m and n are both integers of 2 or greater.

In the following, when there is no particular need to discriminate, the scanning lines GL1 to GLm are referred to collectively as "scanning lines GL", and the data lines SL1 to SLn are referred to collectively as "data lines SL".

The display panel 2 includes a plurality of (m×n) sub pixel circuit portions 12 provided as sub pixels corresponding to respective intersection points in which the scanning lines GL (scanning lines GL1 to GLm) and the data lines SL (data lines SL1 to SLn) intersect.

In the present embodiment, the display panel 2 includes, as illustrated in FIGS. 2A and 2B, pixel circuit portions 11 each formed from the sub pixel circuit portions 12 (light emitting elements, pixel circuits) of each of three colors for the three different colors RGB to be exhibited. The pixel circuit portions 11 are provided as pixels in a matrix pattern, as illustrated in FIG. 2A.

In the following, the sub pixel circuit portions 12 configuring the R sub pixels are referred to as "R sub pixel circuit portions 12R", the sub pixel circuit portions 12 configuring the G sub pixels are referred to as "G sub pixel circuit portions 12G", and the sub pixel circuit portions 12 configuring the B sub pixels are referred to as "B sub pixel circuit portions 12B".

The R sub pixel circuit portions 12R, the G sub pixel circuit portions 12G, and the B sub pixel circuit portions 12B are arranged in the extension direction of the scanning lines GL, repeatedly in this order.

The R sub pixel circuit portions 12R, the G sub pixel circuit portions 12G, and the B sub pixel circuit portions 12B are each arranged in the extension direction of the respective data lines SL for every color sub pixel circuit portion.

The display panel 2 includes a plurality of power source lines to supply a high level potential ELVDD (referred to below as "high level power source lines" and indicated by the same reference sign as the high level power source potential, ELVDD) to drive EL elements 40 (see FIG. 1) in each of the respective sub pixel circuit portions 12, the plurality of power source lines being provided in a predetermined position. The display panel 2 also includes a plurality of power source lines to supply a low level potential ELVSS (referred to below as "low level power source lines" and indicated by the same reference sign as the low level potential. ELVSS), lower than the high level potential ELVDD, to drive EL elements 40 in each of the respective sub pixel circuit portions 12, the plurality of power source lines being provided in a predetermined position. The high level potential ELVDD and the low level potential ELVSS are each fixed potentials.

The high level power source lines ELVDD are wired parallel to the data lines SL, and, while not illustrated, the low level power source lines ELVSS are wired parallel to the scanning lines GL.

The display panel 2 includes a plurality of (m) emission lines (light emission control lines, not illustrated) wired parallel to the respective scanning lines GL to control the timing of light emission/non-light-emission of the EL elements 40 in the sub pixel circuit portions 12.

Each of the sub pixel circuit portions 12 according to the present embodiment has a configuration including an EL element 40 provided on a semiconductor substrate 20, with an interlayer insulating layer 31, described later, interposed between the semiconductor substrate 20 and the EL element 40 (see FIG. 1B). At each of the sub pixel circuit portions 12, the semiconductor substrate 20 includes respective wiring, such as the scanning line GL, the data line SL, the high level power source line ELVDD, the low level power source line ELVSS, and emission line (not illustrated), and a TFT circuit portion 22 (see FIGS. 1A and 1B), serving as a drive circuit portion (pixel circuit portions) to drive the EL element 40 in each of the sub pixel circuit portions 12.

The high level power source lines ELVDD are connected to the high level power source circuit unit (not illustrated). A voltage of the high level potential ELVDD, this being a higher potential than the voltage of the low level potential ELVSS applied to a second electrode 43 (cathode) of the EL element 40, is applied to the high level power source lines ELVDD in order to supply the first electrode 41 (anode) of the EL element 40 in each of the sub pixel circuit portions 12 with a drive current (light emission current) depending on display data. The low level power source lines ELVSS are connected to the low level power source circuit unit (not illustrated).

The high level power source line ELVDD in each of the sub pixel circuit portions 12 is wiring for supplying the high level potential ELVDD, supplied from the high level power source circuit unit, to the EL element 40 in each of the sub pixel circuit portions 12. The low level power source line ELVSS in each of the sub pixel circuit portions 12 is wiring for supplying the low level potential ELVSS, supplied from the low level power source circuit unit, to the EL element 40 in each of the sub pixel circuit portions 12.

Moreover, each of the scanning lines GL and each of the emission lines are each connected to the gate scan driver 3, and the data lines SL are connected to the source driver 4.

The scanning line GL is wiring for supplying a scanning signal, to select the EL element 40 of the sub pixel circuit portion 12 for which light emission is desired, to the TFT circuit portion 22 of the sub pixel circuit portion 12. The emission line is wiring for supplying a light emission control signal, to control the timing of light emission/non-light-emission of the above EL element 40, to the TFT circuit portion 22 of the above sub pixel circuit portion 12.

The data line SL is wiring for supplying a data signal (data voltage), determined on the basis of a source control signal output from the display control circuit unit (not illustrated), to the TFT circuit portion 22 of the above sub pixel circuit portion 12.

Driver

As described above, the display device 1 includes drivers, including the gate scan driver 3 and the source driver 4, provided therein.

The gate scan driver 3 drives each of the scanning lines GL and each of the emission lines on the basis of a control signal, such as a clock signal clk received from the display control circuit unit (not illustrated).

The gate scan driver 3 includes a plurality of shift registers (not illustrated) and a plurality of buffers (not illustrated), and the scanning lines GL1 to GLm are selected in sequence from the scanning line GL1 by output signals being supplied from each stage of the shift registers to the corresponding scanning line GL via corresponding buffers.

The gate scan driver 3 includes a plurality of control transistors to change the potential of each of the emission lines to high level (VDD) or to low level (VSS), a plurality of power source lines (referred to below as "high level logic power source lines VDD") to supply the high level potential VDD to each of the emission lines via the control transistors, and a plurality of power source lines (referred to below as "low level logic power source lines VSS) to supply a low level potential VSS to each of the emission lines via the control transistors. The gate scan driver 3 allows each of the sub pixel circuit portions 12 to be in a light emission or non-light-emission state by sequentially supplying light emission control signals at a potential of either the high level (VDD) or the low level (VSS) to each of the emission lines on the basis of control signals, such as the clock signal clk.

The source driver 4 is connected to each of the data lines SL and drives each of the data lines SL.

The source driver 4 includes shift registers, sampling circuits, latch circuits, D/A converters, buffers, and the like (not illustrated). The source driver 4 sequentially stores one row's worth of display data (video data) on the basis of the source control signals output from the above display control unit, converts display data (gradation data) for each of the sub pixels included in the one row's worth of display data into data voltages (gradation voltages), and supplies the data voltages to the corresponding data lines SL.

FIG. 2A is a diagram illustrating an example of a case in which the gate scan driver 3 is a monolithic circuit (monolithic gate) fabricated monolithically on the display panel 2 at, for example, one side of the display panel 2, and in which the source driver 4 is formed by an integrated circuit (IC) chip (source driver IC) provided at an external portion of the display panel 2. However, the present embodiment is not limited to the configuration.

For example, gate scan drivers 3 may be disposed at both sides of the display panel 2 (namely, at two opposing sides thereof). In such cases, of gate scan drivers 3 being disposed at both sides of the display panel 2, the odd numbered rows of scanning lines GL and the even numbered rows of scanning lines GL may be driven by different gate scan drivers 3, or what is referred to as an interlaced structure may be adopted in which the plurality of scanning lines GL are treated as a set, connection terminals are alternately lead out to the two respective sides of the display panel 2, and the gate drivers 3 on the two respective sides of the display panel 2 drive the corresponding scanning lines GL.

The source driver 4 may also be formed monolithically on the display panel 2, or source drivers 4 may be formed on both sides of the display panel 2. The gate scan driver 3 may also be formed by an IC chip (gate driver IC).

In the present embodiment, the gate scan driver and an emission driver are formed integrated together. However, it goes without saying that the gate scan driver and the emission driver may each be provided separately.

Power Source Circuit Unit

As described above, the display device 1 includes the power source circuit units, such as the high level power source circuit unit, the low level power source circuit unit, and the logic power source circuit unit.

The high level power source circuit unit supplies the high level potential ELVDD to the high level power source lines ELVDD and the low level power source circuit unit supplies the low level potential ELVSS to the low level power source lines ELVSS.

The logic power source circuit unit supplies either the high level potential VDD or the low level potential VSS as logic power source potentials to the high level logic power source line VDD and the low level logic power source line VSS provided in the gate scan driver 3.

Display Control Circuit Unit

The display control circuit unit controls the source driver 4 and the gate scan driver 3 by sending the display data (video data) and the source control signals to the source driver 4 and by sending scan control signals to the gate scan driver 3. The source control signals include, for example, control signals such as a source start pulse and a source clock. The scan control signals include, for example, control signals such as a scan start pulse and a scan clock (clock signal clk).

Sub Pixel Circuit Portion 12 Configuration

Next, more detailed description follows regarding a configuration of the sub pixel circuit portions 12 in the above display panel 2.

Note that, as illustrated in FIG. 2B, the configuration is basically the same in the R sub pixel circuit portion 12R, the G sub pixel circuit portion 12G, and the B sub pixel circuit portion 12B.

Figure 1A:
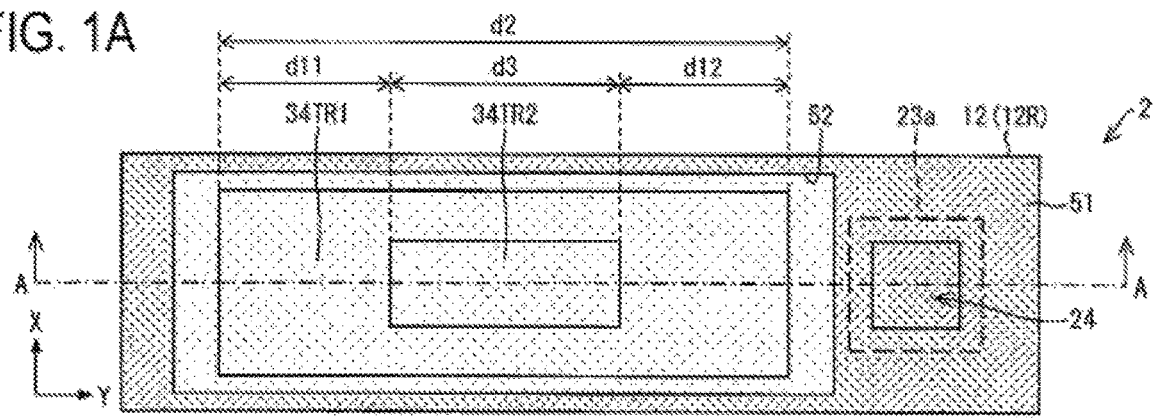
FIG. 1A is a plan view illustrating a schematic configuration of a sub pixel circuit portion of a display panel according to a first embodiment of the present invention.
Figure 1B:
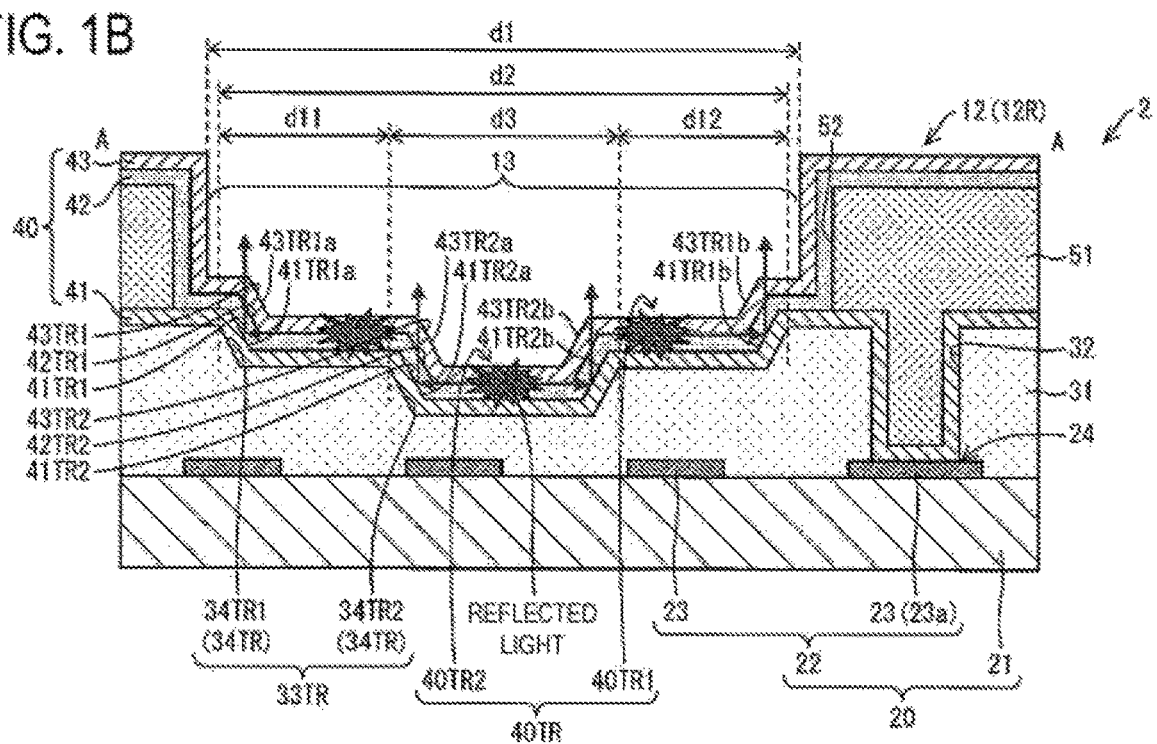
FIG. 1B is a cross-section arrow view taken along line A-A of the sub pixel circuit portion of the display panel illustrated in FIG. 1A.

Accordingly, FIGS. 1A and 1B are diagrams illustrating a configuration of the sub pixel circuit portion 12 by employing an R sub pixel circuit portion 12R as an example of the sub pixel circuit portion 12.

FIG. 1A is a plan view (transparent view) illustrating a schematic configuration of a sub pixel circuit portion 12 of the display panel 2 according to the present embodiment, FIG. 1B is a cross-section arrow view taken along line A-A of the sub pixel circuit portion 12 of the display panel 2 illustrated in FIG. 1A.

As illustrated in FIG. 1B, the display panel 2 includes the EL element 40 layered on the semiconductor substrate 20 with the interlayer insulating layer 31 interposed between the EL element 40 and the semiconductor substrate 20.

The EL element 40 has a configuration in which the first electrode 41, the EL layer 42, and the second electrode 43 are layered in this order.

An edge cover 51 is formed at end portions (pattern end portions) of the first electrode 41 in each of the sub pixel circuit portions 12 and covers the end portions.

Although not illustrated, the display panel 2 preferably has a sealing structure including a sealing member, such as a sealing film or a sealing substrate. The EL elements 40 can be protected from water or the like by covering the EL elements 40 with a sealing film such as an inorganic film (not illustrated), or by covering the EL elements 40 with a sealing substrate such as a cover glass (not illustrated). As required, a filler resin layer may be employed to fill between the EL elements 40, and the sealing film or sealing substrate.

Next, detailed description follows regarding each of the configurations illustrated in FIGS. 1A and 1B.

Semiconductor Substrate 20

The semiconductor substrate 20 includes an insulating substrate 21, serving as a base, and, on the insulating substrate 21, the TFT circuit portions 22 (the drive circuit portions, pixel circuit portions) and the various wiring lines described above, such as the scanning lines GL, the data lines SL, the high level power source lines ELVDD, the low level power source lines ELVSS, and the emission lines (not illustrated in FIGS. 1A and 1B) to drive the EL elements 40.

Examples of the insulating substrate 21 include: inorganic substrates formed from inorganic materials, such as glass, quartz, or a ceramic; and also plastic substrates formed from a plastic, such as polyethylene terephthalate, a polycarbazole, or a polyimide. As an example, a glass substrate, such as an alkali-free glass substrate may be employed for the insulating substrate 21. As the insulating substrate 21, for example, a coated substrate may be employed, having an insulating material, such as silicon oxide ($SiO_2$) or an organic insulating material coated on a metal substrate formed from a metal, such as aluminum (Al) or iron (Fe), or a substrate such as a metal substrate containing Al or the like, the surface of which has been subjected to insulation treatment using a method such as anode oxidation, may be employed.

The insulating substrate 21 employed is not limited to a specific substrate when the display panel 2 is a top-emitting display panel in which light is emitted from the EL elements 40 upwards, namely, from the opposite side of the EL elements 40 to the semiconductor substrate 20 side. However, when the display panel 2 is a bottom-emitting display panel in which light is emitted from the EL elements 40 downwards, namely, from the semiconductor substrate 20 at the back face side of the insulating substrate 21, a transparent or semi-transparent substrate material is employed for the insulating substrate 21.

The TFT circuit portion 22 is provided for each of the sub pixel circuit portions 12. The TFT circuit portion 22 controls current to the EL element 40 according to the gradation voltage. The configuration of the TFT circuit portion 22 is not limited to a specific configuration, as long as the TFT circuit portion 22 is able to drive the sub pixel circuit portion 12 individually. Examples of the TFT circuit portion 22 include a TFT circuit portion having only a switch function such as a function to switch ON/OFF, a TFT circuit portion including a memory function, a TFT circuit portion including only a function to supply current to unit pixels, a TFT circuit portion including a function to regulate a supplied current amount, and a TFT circuit portion including two or more of the above functions.

The TFT circuit portion 22 including such functions can be configured by, for example, drive transistors, control transistors, storage capacitors, or the like, either as a single element or a freely-selected combination of the plurality of elements thereof. These elements may be connected in a freely-selected way, such as to the scanning lines GL, the data lines SL, or the high level power source lines ELVDD, so as to achieve the desired function.

The TFT circuit portion 22 includes a plurality of TFTs 23 as elements such as a drive transistor, a control transistor, and a storage capacitor.

From out of these TFTs 23, a drive TFT 23*a*, which is a drive transistor to supply drive current to the EL element 40, forms a drive TFT-to-first electrode contact portion 24 by making an electrical connection to the first electrode 41 of the EL element 40 through a contact hole 32 formed in the interlayer insulating layer 31, as illustrated in FIGS. 1A and 1B.

The drive TFT-to-first electrode contact portion 24 electrically connected to the TFT circuit portion 22 and the first electrode 41 of the EL element 40 allows the EL element 40 to be supplied with, as drive current to drive the EL element 40, a fixed amount of current generated by a high level positive voltage applied from the high level power source line ELVDD and a data voltage (gradation voltage) applied from the data line SL.

The interlayer insulating layer 31 is provided on the TFT circuit portion 22.

Interlayer Insulating Layer 31

The interlayer insulating layer 31 is, as illustrated in FIG. 1B, an insulating film for electrically isolating the TFT circuit portion 22 and the first electrode 41 of the EL element 40 from each other, except at the drive TFT-to-first electrode contact portion 24.

Known materials may be employed for the material of the interlayer insulating layer 31, and examples thereof include inorganic insulating materials, such as silicon oxide ($SiO_2$), silicon nitride (SiN or $Si_2N_4$), and tantalum oxide (TaO or $Ta_2O_5$), and organic insulating materials, such as acrylic resin and resist materials.

When the display panel 2 is a top-emitting display panel, a light blocking insulating layer having light blocking properties may be formed as the interlayer insulating layer 31. This can prevent a change in TFT characteristics even if external light is incident on the TFT circuit portion 22.

Examples of materials for a light blocking interlayer insulating layer include: materials with a pigment or dye, such as phthalocyanine or quinacridone, dispersed in a polymer resin, such as polyimide; inorganic insulating material such as color resists and black matrix materials; and the like.

The interlayer insulating layer 31 may have a single layer structure, or may have a layered structure formed from a plurality of layers.

The interlayer insulating layer 31 is formed on the semiconductor substrate 20, across the entire display region of the semiconductor substrate 20.

In the interlayer insulating layer 31, at a position corresponding to the light emitting region 13 of the respective sub pixel circuit portions 12 (namely, a light emission effective area within a sub pixel), a trench having a step shape (referred to below as "step-shaped trench") 33TR is formed from a plurality of trench portions 34TR (dips, insulating trench portions) each having an indented shape serving as a plurality of walls and banks (a trench shape).

The step-shaped trench 33TR has a trench-in-trench structure (a step-shaped trench structure) in which within one trench portion 34TR, another trench portion 34TR is formed. The step-shaped trench 33TR has side walls formed in a step shape.

The step-shaped trench 33TR according to the present embodiment has a configuration in which, in plan view, within a first trench portion 34TR1 (trench portion 34TR) serving as a main trench, there is a second trench portion 34TR2 (trench portion 34TR) formed as a sub trench and having a size (namely, plan view size, referred to below as "horizontal-and-vertical size") smaller than that of the first trench portion 34TR1 in the length direction (Y direction) and width direction (X direction) of the sub pixel circuit portion 12.

As illustrated in FIG. 1B, the step-shaped trench 33TR has a cross-section profile in which the second trench portion 34TR2 is located further to the semiconductor substrate 20 side than the first trench portion 34TR1. Namely, the second trench portion 34TR2 is located further toward the semiconductor substrate 20 than the first trench portion 34TR1 in a direction perpendicular to the substrate surface of the semiconductor substrate 20.

For ease of illustration, FIG. 1A illustrates only the first trench portion 34TR1 and the second trench portion 34TR2, serving as the main trench and the sub trench, in the interlayer insulating layer 31.

The step-shaped trench 33TR is, as illustrated in FIGS. 1A and 1B, formed in a region adjacent to the region for forming the contact hole 32 to form the drive TFT-to-first electrode contact portion 24.

The interlayer insulating layer 31 having such a configuration may, for example, be formed using a photolithographic method or the like by patterning a layer formed of insulating material deposited using a method such as a chemical vapor deposition (CVD) method, a sputtering method, or a spin coating method.

The side wall of each of the trench portions 34TR preferably includes an inclined face. The angle of the inclined face (taper angle) is particularly preferably set at 45° or near 45°. This enables light being reflected at interfaces and guided within the EL layer 42 to be reflected by the reflective electrode of the EL element 40 formed in each of the trench portions 34TR, and extracted at the front face side (namely, the display face side) of the display panel 2 with good efficiency. However, the above taper angle is not limited to the above angle because light at various angles is present in the light being guided by the EL layer interfaces.

The plan view area ratio and the surface area ratio of the second trench portion 34TR2 with respect to those of the first trench portion 34TR1, and the length and width dimensions and depth of the second trench portion 34TR2 are preferably set such that the length-and-width size of the second trench portion 34TR2 does not exceed a light propagation distance limit.

To obtain the desired number of trenches-in-trenches (in other words, the step-shaped trench 33TR having the desired number of steps), the layer thickness of the interlayer insulating layer 31 may be set as appropriate according to the number of trench portions 34TR to be formed within the first trench portions 34TR1, and is not limited to a specific layer thickness.

The depth of each of the trench portions 34TR is not limited to a specific depth. However, the overall thickness of the interlayer insulating layer 31 increases the deeper the depth of the trench portions 34TR, leading to an increase in the thickness of the finally obtained sub pixel circuit portions 12 and the thickness of the display panel 2 including the sub pixel circuit portions 12. Thus, the layer thickness of the interlayer insulating layer 31 is preferably set as appropriate such that the thickness of the sub pixel circuit portions 12 is the desired thickness, within a range in which shorting does not occur between the EL element 40 and each of the lines and the TFT circuit portion 22 on the semiconductor substrate 20.

Although the thickness of the interlayer insulating layer 31 is not limited to a specific layer thickness, the interlayer insulating layer 31 is formed such that the layer thickness of the interlayer insulating layer 31 in the non-light-emitting regions outside the light emitting regions 13 (in other words, the layer thickness of the interlayer insulating layer 31 prior to forming the step-shaped trench 33TR) is generally a layer thickness in the order of a few μm.

EL Element 40

As described above, the EL element 40 has a configuration in which the first electrode 41, the EL layer 42, and the second electrode 43 are layered in this order.

The EL element 40 is layered on the step-shaped trench 33TR in the interlayer insulating layer 31 along the step-shaped trench 33TR. Thus, the EL element 40 includes a step-shaped trench 40TR (reflective trench) on the step-shaped trench 33TR of the interlayer insulating layer 31 having an indented shape in conformance with the shape of the step-shaped trench 33TR.

The step-shaped trench 40TR according to the present embodiment has a configuration in which, in plan view, within a first trench portion 40TR1 serving as a main trench, a second trench portion 40TR2 is formed as a sub trench having a length-and-width size smaller than that of the first trench portion 40TR1.

As illustrated in FIG. 1B, the step-shaped trench 40TR has an indented shape, and has a cross-section profile in which the second trench portion 40TR2 is located further to the semiconductor substrate 20 side than the first trench portion 40TR1. Namely, the second trench portion 40TR2 is located further toward the semiconductor substrate 20 than the first trench portion 40TR1 in a direction perpendicular to the substrate surface of the semiconductor substrate 20.

The step-shaped trench 40TR includes the first electrode 41, the EL layer 42, and the second electrode 43, these being layered in this order and in contact with each other, and does not include a partition (insulating layer) on a reflection structure, like that of the trench 530 in the sub pixel 510R of PTL 1.

Thus, the sub pixel circuit portion 12 according to the present embodiment has only a single light emitting region 13 and does not have a configuration such as that of PTL 1 in which the light emitting region is partitioned into a plurality of light emitting regions by non-light-emitting regions.

Therefore, the sub pixel circuit portion 12 according to the present embodiment reflects light from the light emitting region 13 using the reflective electrode without interposing an insulating layer, and so superfluous reflection such as that of PTL 1 does not occur.

Within the light emitting region 13, the first electrode 41, the EL layer 42, and the second electrode 43 configuring the step-shaped trench 40TR each have a shape in conformance with the shape of the step-shaped trench 33TR.

More specifically, the first electrode 41 includes a step-shaped trench (step-shaped trench structure) having a shape in conformance with the shape of the step-shaped trench 33TR. The EL layer 42 includes a step-shaped trench (step-shaped trench structure) having a shape in conformance with the step-shaped trench structure of the first electrode 41. The second electrode 43 also includes a step-shaped trench (step-shaped trench structure) having a shape in conformance with the step-shaped trench structure of the EL layer 42.

Accordingly, within the light emitting region 13, the first electrode 41 has a step-shaped trench structure in which, within a first trench portion 41TR1 formed as a main trench by the first electrode 41, a second trench portion 41TR2 is formed as a sub trench having a length-and-width size smaller than that of the first trench portion 41TR1.

Similarly, within the light emitting region 13, the EL layer 42 has a step-shaped trench structure in which, within a first trench portion 42TR1 formed as a main trench by the EL layer 42, a second trench portion 42TR2 is formed as a sub trench having a length-and-width size smaller than that of the first trench portion 42TR1.

Moreover, within the light emitting region 13, the second electrode 43 has a step-shaped trench structure in which, within a first trench portion 43TR1 formed as a main trench by the second electrode 43, a second trench portion 43TR2 is formed as a sub trench having a length-and-width size smaller than that of the first trench portion 43TR1.

Thus, the EL element 40 is layered on the step-shaped trench 33TR in the interlayer insulating layer 31 along the step-shaped trench 33TR. Hence, in the EL element 40, the side walls of the first electrode 41, the EL layer 42, and the second electrode 43 have respective inclined faces at the first trench portions 41TR1, 42TR1, 43TR1 and the second trench portions 41TR2, 42TR2, 43TR2. The angle (taper angle) of each of the inclined faces is set, for example, to 45° or near 45°.

Moreover, in the first electrode 41, the EL layer 42, and the second electrode 43 of the EL element 40, the plan view area ratio and the surface area ratio of each of the second trench portions 41TR2, 42TR2, 43TR2 with respect to each of the first trench portions 41TR1, 42TR1, 43TR1, and the length and width dimensions and depth of the second trench portions 41TR2, 42TR2, 43TR2, are preferably set such that the length-and-width sizes of the second trench portions 41TR2, 42TR2, 43TR2 do not exceed the light propagation distance limit.

More detailed description follows regarding the first electrode 41, the EL layer 42, and the second electrode 43.

First Electrode 41 and Second Electrode 43

The first electrode 41 serving as a lower layer electrode, and the second electrode 43 serving as an upper layer electrode, serve as a pair of electrodes, with one functioning as an anode and the other functioning as a cathode.

The anode functions as an electrode for injecting (supplying) holes into the EL layer 42. The cathode functions as an electrode for injecting (supplying) electrons into the EL layer 42.

One electrode out of the first electrode 41 and the second electrode 43 is an electrode (reflective electrode) including a reflective electrode layer (reflective electrode).

The present embodiment illustrates an example in which the first electrode 41 is the anode (specifically, a patterned anode, a pixel electrode) and the second electrode 43 is the cathode (specifically, a common cathode, a common electrode). However, the present embodiment is not limited to the configuration, and a cathode may be provided as the lower layer electrode on the semiconductor substrate 20.

Electrode materials capable of being employed as the anode and the cathode are not particularly limited to a specific material, and, for example, known electrode materials may be employed therefor.

The anode may, for example, be formed from an electrode material having a large work function (for example, approximately 4 eV or greater), such as a metal, an alloy, a conductive material, or a conductive polymer. Specific examples include aluminum, vanadium, cobalt, nickel, tungsten, palladium, silver, gold, platinum, and alloys thereof; conductive materials such as indium tin oxide (ITO), tin oxide ($SnO_2$), or indium zinc oxide (IZO); and conductive macromolecules such as poly(3-methylthiophene), polypyrrole, poly(p-phenylene), or polyfuran.

The cathode may, for example, be formed from an electrode material having a small work function (for example, approximately 4 eV or less), such as a metal, an alloy, a conductive material, or a conductive polymer. Specific examples include metals such as calcium, aluminum, silver, titanium, yttrium, sodium, ruthenium, manganese, indium, magnesium, lithium, ytterbium, or LiF; alloys such as magnesium/copper, magnesium/silver, sodium/potassium, At/$AtO_2$, potassium/aluminum, lithium/calcium/aluminum, or LiF/calcium/aluminum; the conductive materials listed above; and the conductive macromolecules listed above.

The light emitted from the EL layer 42 is extracted from one electrode side of the EL layer 42 out of the anode and cathode side. Thus, an electrode material with transparent properties (a transparent electrode material) is preferably employed for one electrode. An electrode material with reflective properties (a reflective electrode material) is preferably employed for the other electrode, in order to reflect light reflected at the interfaces and guided within the EL layer 42, as described above, and to extract the light at the front face side of the display panel 2.

Namely, although various conductive materials may be employed as the first electrode 41 and the second electrode 43, for cases in which the EL elements 40 is a top-emitting EL element, the first electrode 41 is preferably formed from a reflective electrode material such as a metal or alloy having reflectivity, and the second electrode 43 is preferably formed from a transparent electrode material which is transparent or semi-transparent. As a transparent electrode material, for example, a transparent electrode material such as ITO, $SnO_2$, or IZO may be employed, and a semi-transparent electrode material may also be employed, such as a thin film of Ag.

The first electrode 41 and the second electrode 43 may each have a single layer structure formed from one electrode material or may each have a layered structure formed from a plurality of electrode materials.

Thus, when the EL element 40 is a top-emitting EL element as described above, the first electrode 41 may have a layered structure configured by a reflective electrode formed from a reflective electrode material and a transparent electrode formed from a transparent electrode material.

The first electrode 41 and the second electrode 43 may be formed in the desired shape by, for example: forming a thin film of the electrode materials described above using a method such as vapor deposition or sputtering, and then using a known method such as photolithography or etching as a method in which the thin film is patterned in the desired shape; or by employing vapor deposition or sputtering using a mask.

The thickness of the anode (anode metal layer) and cathode (cathode metal layer) are not limited to a specific thickness, and the thickness may be set similar to that of a conventional EL element. The thickness of the anode (anode metal layer) is generally from approximately several nm to several hundreds of nm, and the thickness of the cathode (cathode metal layer) is generally from approximately several nm to several hundreds of nm.

The first electrode 41 of each of the EL elements 40 is formed on the interlayer insulating layer 31 for each of the sub pixel circuit portions 12. As described above, the first electrode 41 is electrically connected, through the drive TFT-to-first electrode contact portion 24, to the drive TFT 23a, this being a portion of the TFT circuit portion 22. The first electrode 41 is connected through the drive TFT 23a to the high level power source line ELVDD, this being the line to supply a positive voltage at the high level potential ELVDD.

The second electrode 43 of the EL element 40 is formed common to all of the sub pixel circuit portions 12. The second electrode 43 is electrically connected to the low level power source line ELVSS, this being the line to supply a negative voltage at the low level potential ELVSS. The negative voltage at the low level potential ELVSS is supplied from the TFT circuit portion 22 to the second electrode 43 through a contact hole (not illustrated) provided in the interlayer insulating layer 31.

EL Layer 42

The EL layer 42 is a light emitting unit including a light emitting layer. In the present embodiment, an organic layer including at least a light emitting layer is employed as the EL layer 42.

The light emitting layer is a layer having a function to cause holes (positive holes) injected from the anode (in the present embodiment, the first electrode 41) and electrons injected from the cathode (in the present embodiment, the second electrode 43) to recombine so as to emit light.

Various known types of light emitting material may be employed as the material of the light emitting layer (namely, a light emitting substance), and the material is not limited to a specific material. A light emitting material having a high light emitting efficiency is preferably employed therefor, such as a low molecular weight fluorescent colorant or a metal complex.

Examples of the luminescent material include: anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; a tris(8-quinolinato)aluminum complex; a bis(benzoquinolinato) beryllium complex; a tri(dibenzoylmethyl) phenanthroline europium complex; and ditoluylvinylbiphenyl.

The layer thickness of the light emitting layer is appropriately set according to the light emitting material, and is not limited to a specific value. The layer thickness is generally from approximately several nm to several hundreds of nm.

The EL layer 42 according to the present embodiment may include an organic compound as the light emitting substance, and layers other than the light emitting layer are not limited to a specific layer. Thus, any type of layer for layers that are not the light emitting layer is employed for the EL layer 42.

Typical examples of layers other than the light emitting layer include layers such as a hole injecting layer, a hole transport layer, an electron transport layer, and an electron injecting layer.

A hole injecting layer includes a material with hole injecting properties and is a layer having the function to increase the efficiency of hole injection from the anode to the light emitting layer. The hole transport layer is a layer including a material with hole transport properties and is a layer having the function to increase the efficiency of hole transport to the light emitting layer. The electron injecting layer includes a material with electron injecting properties and is a layer having the function to increase the efficiency of electron injection from the cathode to the light emitting layer. The electron transport layer includes a material having electron transport properties and is a layer having the function to increase the efficiency of electron transport to the light emitting layer.

The hole injecting layer and the hole transport layer may be formed as mutually independent layers, or may be integrated together as a hole injection-cum-transport layer. Similarly, the electron injecting layer and the electron transport layer may be formed as mutually independent layers, or may be integrated together as an electron injection-cum-transport layer. One out of the hole injecting layer and the hole transport layer may be provided alone. Similarly, one out of the electron injecting layer and the electron transport layer may be provided alone.

Moreover, other than the layers described above, the EL layer 42 may also include a carrier block layer, an intermediate layer, or the like, and may include a plurality of layers of light emitting layer.

The material of layers other than the light emitting layer is also not limited to a specific material, and known conventional materials may be employed as each such layer. Any layers other than the light emitting layer are not essential layers, and the layer thicknesses thereof is not limited to a specific value. Thus, the description thereof is omitted in the present embodiment.

Edge Cover 51

The edge cover 51 isolates the respective RGB light emitting regions 13 from each other within a single pixel (namely, the pixel circuit portion 11), and is an insulating layer functioning as a light emitting region isolation layer (element isolation layer, partition).

An opening 52 is provided in the edge cover 51 for each of the sub pixel circuit portions 12. Thus, the portion where there is no edge cover 51 present (the opening 52) is the light emitting region 13 in the respective sub pixel circuit portion 12 (namely, in the R sub pixel circuit portion 12R, the G sub pixel circuit portion 12G, and the B sub pixel circuit portion 12B).

The edge cover 51 is accordingly formed in a shape defining each of the light emitting regions 13 in the respective sub pixel circuit portions 12.

The edge cover 51 is layered on the first electrode 41 and surrounds the plurality of trench portions in the first electrode 41 (the first trench portion 41TR1 and the second trench portion 41TR2 in the present embodiment). The edge cover 51 covers the end portions (pattern end portions) of the first electrode 41 in each of the respective sub pixel circuit portions 12, where the trench portions (the first trench portion 41TR1 and the second trench portion 41TR2) are not formed.

The edge cover 51 functions as a barrier wall to prevent shorting between the first electrode 41 and the second electrode 43 in the EL elements 40 due to thinning of the EL layer 42 or to a concentration of electric field arising at the end portions (pattern end portions) of the first electrode 41.

Similar insulating materials to those of the interlayer insulating layer 31 may be employed in the edge cover 51. Thus, although the shape is different from that of the interlayer insulating layer 31, the edge cover 51 may also, similar to the interlayer insulating layer 31, be formed into a desired shape by, for example, using a photolithographic method or the like to pattern a layer formed from an insulating material deposited by a CVD method, a sputtering method, a spin-coating method, or the like.

Although the layer thickness of the edge cover 51 is not limited to a specific value, generally, the edge cover 51 is formed such that the layer thickness is the order of several μm thick.

Method for Producing Display Panel 2

Next, a description follows regarding a method for producing the display panel 2 described above, with reference to FIGS. 3A to 3J. A description follows regarding the method for producing the above display panel 2, focusing on a method for producing the sub pixel circuit portions 12 of the display panel 2.

FIGS. 3A to 3J are cross-sectional views of main portions to illustrate a sequence of processes in a process for producing the display panel 2 according to the present embodiment. FIGS. 3A to 3J illustrate cross-sectional structures of the sub pixel circuit portion 12.

Figure 3A:
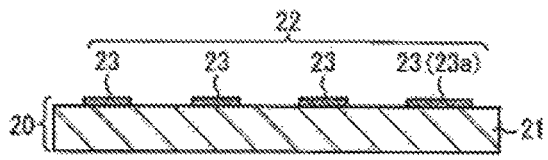
FIGS. 3A to 3J are cross-sectional views of main portions illustrating a sequence of processes in a process for producing the display panel according to the first embodiment of the present invention.
Figure 3F:
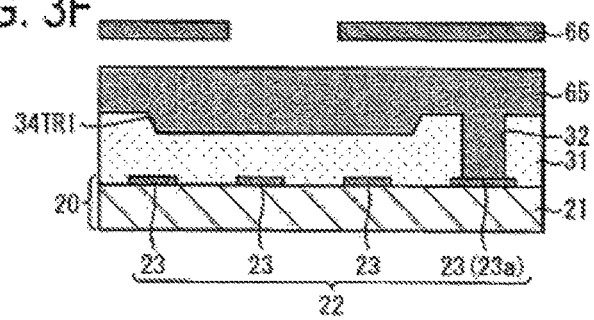

First, as illustrated in FIG. 3A, the semiconductor substrate 20 is prepared by forming, on the insulating substrate 21, a TFT circuit portion 22 including the drive TFT 23a and the various lines described above (not illustrated in the drawings), such as the scanning lines GL, the data lines SL, the high level power source lines ELVDD, the low level power source lines ELVSS, and the emission lines.

Figure 3B:
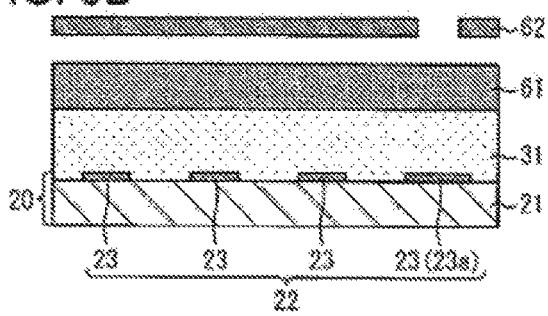

Next, as illustrated in FIG. 3B, an insulating material, such as a photosensitive resin is deposited on the above semiconductor substrate 20. As a result, the interlayer insulating layer 31 is formed across the entire display region of the semiconductor substrate 20. The insulating material may be deposited using a method such as a CVD method, a sputtering method, or a spin-coating method, as described above.

Then, as illustrated in FIG. 3B, a photosensitive resist 61 is coated onto the interlayer insulating layer 31, and the photosensitive resist 61 is exposed with a drive TFT contact photomask 62 for opening a contact hole 32 in the interlayer insulating layer 31 to form the drive TFT-to-first electrode contact portion 24 and developed.

Figure 3G:
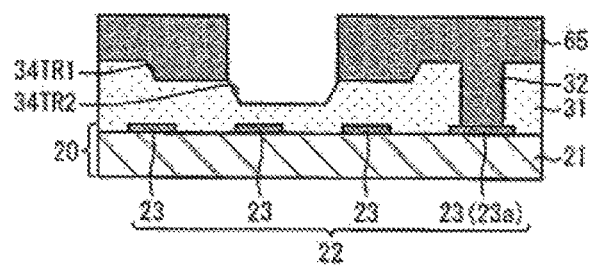
Figure 3C:
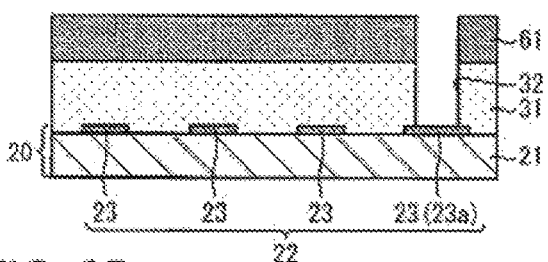

Next, as illustrated in FIG. 3C, the contact hole 32 is formed in the interlayer insulating layer 31 by etching (either dry etching or wet etching) the interlayer insulating layer 31 above the drive TFT 23a using the developed photosensitive resist 61 as a mask. As a result, the drive TFT 23a is exposed.

Figure 3H:
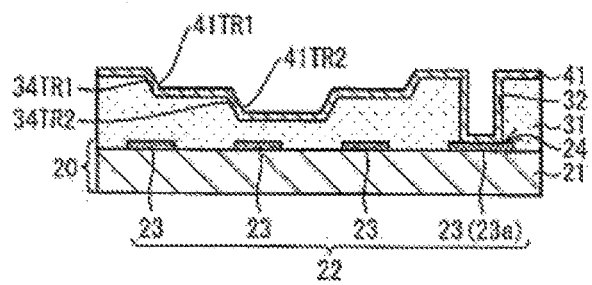
Figure 3D:
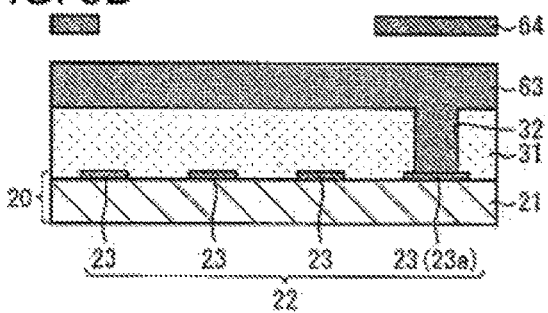

Next, as illustrated in FIG. 3D, after the photosensitive resist 61 described above has been removed, a photosensitive resist 63 is coated onto the interlayer insulating layer 31, with the photosensitive resist 63 covering the contact hole 32 and the interlayer insulating layer 31. In the present embodiment, the method for removing the photosensitive resist (the method for removing the photosensitive resist 61 in the current process) is not limited to a specific method. The photosensitive resist may normally be removed, for example, by stripping the photosensitive resist with a resist stripper and washing the substrate.

Next, as illustrated in FIG. 3D, the photosensitive resist 63 is exposed with a main trench photomask 64 for forming the first trench portion 34TR1, serving as a main trench, within a region corresponding to the light emitting region 13 and developed.

Figure 3I:
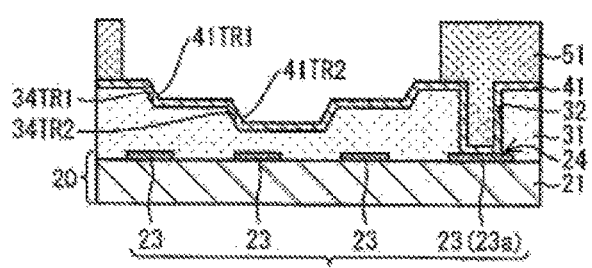
Figure 3E:
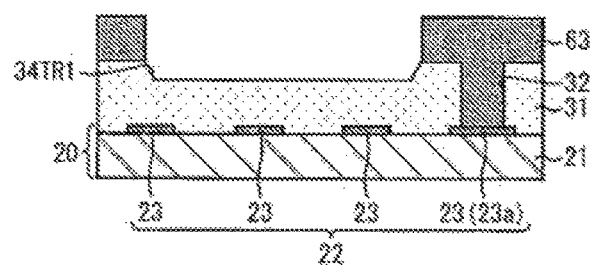

Then, as illustrated in FIG. 3E, the first trench portion 34TR1 is formed in the interlayer insulating layer 31 by half etching (dry etching or wet etching) the interlayer insulating layer 31 using the developed photosensitive resist 63 as a mask. There are no particular stipulations regarding the taper angle of the first trench portion 34TR1. However, the first trench portion 34TR1 is formed such that the taper angle is generally 45°.

Then, as illustrated in FIG. 3, after the photosensitive resist 63 has been removed, a photosensitive resist 65 is coated onto the interlayer insulating layer 31, with the photosensitive resist 65 covering the contact hole 32 and the interlayer insulating layer 31. Next, as illustrated in FIG. 3F, the photosensitive resist 65 is exposed with a sub trench photomask 66 for forming the second trench portion 34TR2 serving as a sub trench within the first trench portion 34TR1 and developed.

Next, as illustrated in FIG. 3G, the second trench portion 34TR2 is formed within the first trench portion 34TR1 of the interlayer insulating layer 31 by half etching (dry etching or wet etching) the interlayer insulating layer 31 within the first trench portion 34TR1 using the developed photosensitive resist 65 as a mask. There are no particular stipulations regarding the taper angle of the second trench portion 34TR2. However, the second trench portion 34TR2 is formed such that the taper angle is generally 45°.

Then, as illustrated in FIG. 3IH, after the photosensitive resist 65 has been removed, an electrode material for forming the first electrode 41 (anode metal layer) is deposited on the interlayer insulating layer 31 using a sputtering method, for example, with the electrode material covering the contact hole 32 and the interlayer insulating layer 31. An electrode material having reflectivity such as, for example, an Ag/Al alloy, is employed as the electrode material.

Then, as illustrated in FIG. 3H, a photosensitive resist is patterned to form a resist pattern (not illustrated) by a photolithography method, and after the layer formed from the electrode material has been etched using the resist pattern as a mask, the resist pattern is removed. The first electrode 41 including the first trench portions 41TR1 and the second trench portions 41TR2 is thereby formed. The first electrodes 41 for the sub pixel circuit portions 12 are isolated from each other. The drive TFT-to-first electrode contact portion 24 is also formed in which the drive TFT 23a and the first electrode 41 are electrically connected through the contact hole 32.

Next, as illustrated in FIG. 3I, an edge cover 51 is formed across the entire display region of the semiconductor substrate 20 in which the first electrode 41 is formed by depositing an insulating material, with the insulating material covering the first electrode 41 and the interlayer insulating layer 31. The insulating material may be deposited using a method such as a CVD method, a sputtering method, or a spin-coating method, as described above.

Then, as illustrated in FIG. 3I, a photosensitive resist is patterned to form a resist pattern (not illustrated) by a photolithography method, and after the layer formed from the insulating material has been etched using the resist pattern as a mask, the resist pattern is removed. The edge cover 51 is thereby patterned in a shape defining the light emitting region of each of the sub pixel circuit portions 12.

Then, as illustrated in FIG. 33, the EL layer 42 including the first trench portion 42TR1 and the second trench portion 42TR2 is formed on the first electrode 41 along the first trench portion 41TR1 and the second trench portion 41TR2. The EL layer 42 is formed by selectively coating the EL layer 42 for each respective color of the sub pixel circuit portions 12. For example, RGB light emitting layers are selectively coated as the EL layer 42 for each respective color of the sub pixel circuit portions 12.

The EL layer 42 may, as required, include functional layers, such as a hole injecting layer, a hole transport layer, an electron transport layer, and an electron injecting layer. When, for example, the EL layer 42 includes a hole injecting layer, a hole transport layer, an electron transport layer, and an electron injecting layer, the EL layer 42 is formed by layering the hole injecting layer, the hole transport layer, the light emitting layer, the electron transport layer, and the electron injecting layer in this order from the first electrode 41 side.

The selective coating of the EL layer 42 may, for example, be achieved by using technology such as mask vapor deposition technology or ink jet technology.

Next, the second electrode 43 (cathode metal layer) including the first trench portion 43TR1 and the second trench portion 43TR2 is formed over the entire display region of the semiconductor substrate 20 in which the EL layer 42 is formed using, for example, a sputtering method. The second electrode 43 is formed along the first trench portion 42TR1 and the second trench portion 42TR2 of the EL layer 42. Thereby, the EL element 40 including the step-shaped trench 401TR is formed within the light emitting region 13 not covered by the edge cover 51, and the step-shaped trench 40TR includes the second trench portion 40TR2 configured by the second trench portions 41TR2, 42TR2, 43TR2, formed within the first trench portion 40TR1 configured by the first trench portions 41TR1, 42TR1, 43TR1.

Then, the EL element 40 is sealed by covering the EL element 40 with a sealing substrate such as, for example, a cover glass (not illustrated), serving as a sealing member. The sealing method is not limited to a specific method, and the EL element 40 may be sealed by placing an opposing sealing substrate, such as a cover glass, over the semiconductor substrate 20 with a sealant (not illustrated) interposed therebetween. The EL element 40 may also be sealed by forming a sealing film over the EL element 40 using an inorganic film (not illustrated).

Light Emitting/Improved Light Extraction Action of Display Panel 2

A description follows regarding the light emitting action and the improved light extraction action of the sub pixel circuit portions 12 in the display panel 2 of the present embodiment.

The light emitting action of the display panel 2 is as follows.

First, when any one of the scanning lines GL is selected as illustrated in FIG. 2A, a gradation voltage is supplied from the source driver 4 to the TFT circuit portion 22. A drive current (light emission current) corresponding to the gradation voltage is thereby supplied through the drive TFT-to-first electrode contact portion 24 and the first electrode 41 to the EL element 40, and flows to the second electrode 43. As a result, a light emission phenomenon occurs within the light emitting layer of the EL layer 42 of the EL element 40.

A more specific description follows.

For example, a gate terminal of the drive TFT 23a is connected to a drain terminal of the TFT 23 serving as the control transistor out of the TFTs 23. A drain terminal of the drive TFT 23a is connected to the high level power source line ELVDD. A source terminal of the drive TFT 23a is connected to the first electrode 41, this being the anode (anode terminal) of the EL element 40.

The source terminal of the TFT 23 serving as the control transistor is connected to the data line SL, and the gate terminal of the TFT 23 serving as the control transistor is connected to the scanning line GL.

A voltage holding capacitor is, for example, provided between the drain terminal of the TFT 23 serving as the control transistor and the gate terminal of the drive TFT 23a.

Thus, when writing data, the TFT 23 serving as the control transistor is ON when the scanning line GL is H (high), namely, when the scanning line GL becomes active, and a data voltage signal from the data line SL is written into the voltage holding capacitor. The TFT 23 serving as the control transistor is OFF when the scanning line GL is L (low). The capacitor and the data line SL are thereby isolated, and the capacitor holds the data voltage (gradation voltage) signal written during data writing.

The current of the drive TFT 23a is determined by the magnitude of the voltage between the two ends of the capacitor.

Thus, the current corresponding to the gradation voltage (the light emission current) flows from the drain terminal of the drive TFT 23a connected to the high level power source line ELVDD, to the source terminal of the drive TFT 23a. The current is then supplied from the source terminal of the drive TFT 23a, through the first electrode 41 of the EL element 40, to the EL layer 42, and flows to the second electrode 43, this being the cathode (cathode terminal) connected to the low level power source line ELVSS. The EL element 40 thereby emits light at a desired luminance according to the current flowing into the second electrode 43.

At this time, a portion of light from the light generated in the light emitting layer of the EL element 40 is reflected by interfaces between the EL layer 42 and the first electrode 41, the second electrode 43, and the like, and propagates (is guided) within the EL element 40.

In the present embodiment, attenuated light, which has been attenuated by the light propagation distance limit due to such reflection at the interfaces and guiding within the EL element 40, is reflected by the trench edges of the reflective first electrode 41 toward the second electrode 43 side, this being the front face side (display face side) of the display panel 2. The light reflected by the trench edges of the first electrode 41 can thereby be externally extracted from the trench edges of the second electrode 43.

FIG. 1B illustrates a manner in which the attenuated light is reflected by the trench edges of the first electrode 41, i.e. by each side wall 41TR1a, 41TR1b of the first trench portion 41TR1 and by each side wall 41TR2a, 41TR2b of the second trench portion 41TR2, and externally extracted from the trench edges of the second electrode 43, i.e. from each side wall 43TR1a, 43TR1b of the first trench portion 43TR1 and from each side wall 43TR2a, 43TR2b of the second trench portion 43TR2.

Note that in FIG. 1B, the attenuated light is illustrated as being reflected by each of the side walls (trench edges) of the respective trench portions 41TR1, 41TR2 in the length direction (Y direction) of the sub pixel circuit portion 12. However, the attenuated light is also reflected in a similar manner by each of the side walls (trench edges) of the respective trench portions 41TR1, 41TR2 in the width direction (X direction) of the sub pixel circuit portion 12.

Namely, in the present embodiment, reflective walls are present in the trench portions 41TR1, 41TR2 of the first electrode 41 at a total of four locations in the Y direction and at a total of four locations in the X direction. The attenuated light can be reflected and externally extracted by each of the reflective walls.

Advantageous Effects

Advantage of Increasing Light Extraction Efficiency Due to not Including Insulating Layer in Reflective Trench As described above, the display device of PTL 1 has a configuration in which an insulating film is provided within the trenches 530. Accordingly, superfluous reflection occurs in which a portion of the light generated in the organic EL layer 528 may be reflected by an interface between the first electrode 525 and the insulating layer (the partition 527) forming the reflection structure 526 or the like, and propagates within the insulating layer without being externally extracted.

In contrast thereto, the sub pixel circuit portion 12 according to the present embodiment includes, within the light emitting region 13, the step-shaped trench 40TR in which the first electrode 41, the EL layer 42, and the second electrode 43 are layered in this order and in contact with each other. The step-shaped trench 40TR does not include a partition (insulating layer) on a reflection structure such as in the trenches 530 of the sub pixel 510R in PTL 1.

Thus, the sub pixels according to the present embodiment include only a single light emitting region 13 and do not have a configuration, such as in PTL 1, in which a plurality of light emitting regions are provided within a sub pixel and are isolated from each other by non-light-emitting regions (for example, the configuration in which the plurality of light emitting regions 510Ra are provided within the sub pixel 510R). Namely, the sub pixel circuit portion 12 according to the present embodiment includes only a single light emitting region 13 and does not have a configuration in which the light emitting region is partitioned into a plurality of light emitting regions by non-light-emitting regions as in PTL 1.

Therefore, the sub pixel circuit portion 12 according to the present embodiment reflects light from the light emitting region 13 using the reflective electrode without interposing an insulating layer, and so superfluous reflection such as that of PTL 1 does not occur. Thus, light generated in the EL layer 42 (the light emitting layer) can be externally extracted with good efficiency.

Advantage of Increasing the Light Extraction Efficiency Due to Forming Trench in Step Shape The organic EL display device described in PTL 1 has a configuration in which, within a single sub pixel (for example, the sub pixel 510R), there are a plurality of light emitting regions (for example, the light emitting regions 510Ra) defined by the trenches 530 provided in a straight line along the Y direction.

Therefore, the organic EL display device described in PTL 1 includes a plurality of the trenches 530 arranged in the Y direction and twice as many reflection structures 526 as the number of the trenches 530 arranged in the Y direction. However, the organic EL display device described in PTL 1 includes only two reflection structures 526 (more specifically, rows of the reflection structures 526 intermittently provided along the Y direction) provided in the X direction.

In contrast thereto, the display device of the present embodiment includes the sub pixel circuit portion 12 having a trench-in-trench structure (the step-shaped trench 40TR), and, in both the X direction and the Y direction, includes twice as many reflective walls as the number of trenches (with the reflective walls moreover being continuous along the Y direction). Thus, from the perspective of the X direction, the present embodiment has the advantage of, for example, obtaining a light extraction efficiency of about twice that of PTL 1.

Advantage of Increased Lifespan of Light Emitting Layer

As described above, as illustrated in FIG. 13B, since the partitions 527 are disposed on the first electrode 525, the organic EL layer 528 above the reflection structures 526 does not emit light (current does not flow) in PTL 1.

Thus, in PTL 1, the light emitting layer of the organic EL layer 528 on the side faces of the trenches 530 does not emit light. Accordingly, when the sub pixel 510R is exemplified, within a single sub pixel in PTL 1, the plurality of light emitting regions 510Ra, 510Ga, 510Ba are provided isolated from each other by the non-light-emitting regions.

Meanwhile, in the present embodiment, as illustrated in FIG. 1B, the side faces of each of the trench portions 43TR1, 43TR2 of the second electrode 43 (namely, the side walls 43TR1a, 43TR1b, 43TR2a, 43TR2b) are also employed as light emitting regions.

Namely, the organic EL display device 500 in PTL 1 has a structure equivalent to a structure in which the plurality of light emitting regions 510Ra. 510Ga, 510Ba are provided within the respective light emitting region 13 of the present embodiment, and non-light-emitting regions are provided between each of the light emitting regions 510Ra, 510Ga, 510Ba.

Accordingly, the present embodiment enables the light emitting regions (the light emitting surface area) to be made larger than those of PTL 1 and enables the current density required to emit light to be lower than that of PTL 1.

Generally, the lifespan of a light emitting element is said to deteriorate in inverse proportion to from 1 to 2 powers of the current density ratio. Thus, the present embodiment enables the lifespan of the sub pixel circuit portion 12, and moreover the lifespan of the display panel 2 and the display device 1 including the sub pixel circuit portions 12, to be extended.

Advantage Regarding Higher Definition in Display Panels

Moreover, in PTL 1, the surface area of light emitting regions within each of the sub pixels 510R, 510G, and 510B is defined by the size in plan view of the openings, each of the openings being defined by two partitions 527, in other words, by the surface area in plan view of the trenches 530 within each of the sub pixels 510R, 510G, and 510B.

Thus, the higher the definition of the display panel in an organic EL display device, the smaller the effective surface area of a single sub pixel and the more difficult it is to form a plurality of trenches in a single sub pixel. As a result, the advantageous effects described above cannot be obtained to a sufficient degree.

Figure 13A:
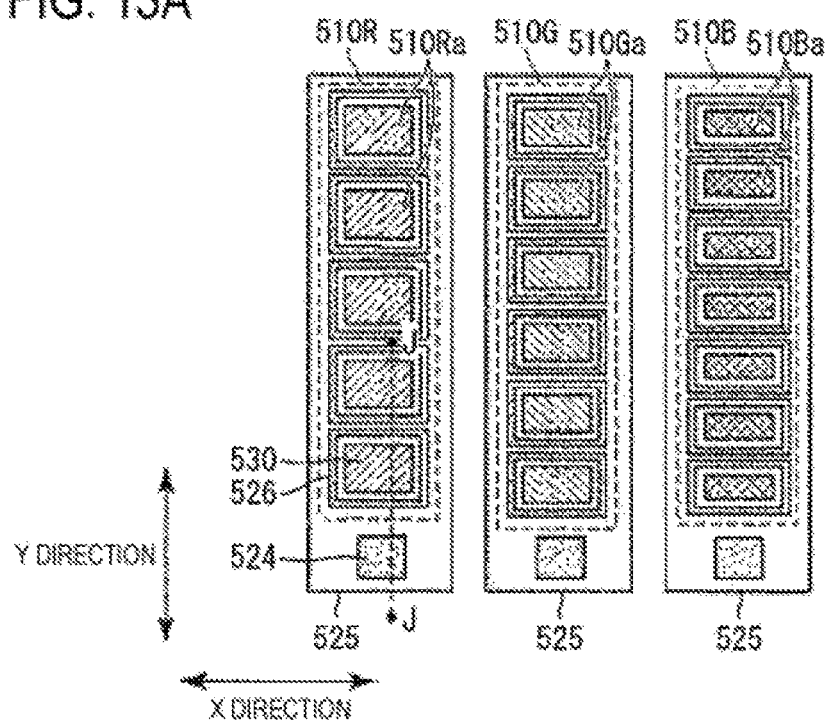
FIG. 13A is a plan view illustrating a schematic configuration of a sub pixel group of an organic EL display device described in PTL 1.

For example, a full high definition (FHD) display panel having the sub pixel size in a 5.0 inch and a scale factor of about 440 pixels per inch (ppi) has a length-to-width ratio (Y/X ratio) as illustrated in FIG. 13A of about 58 μm×19 μm. The effective region for disposing the trench shape depends on the process rules and is smaller than this size. Accordingly, it is difficult to form the plurality of trenches 530 of PTL 1 within a sub pixel in such a display panel. In such cases, the size of a single trench is a 10 μm square, as estimated from the drawings of PTL 1. Thus, it is difficult to dispose the plurality of the trenches 530 in the length (Y) direction as in PTL 1, and extremely high patterning accuracy is required.

However, in the present embodiment, a plurality of trenches are not formed in an island pattern partitioned in the horizontal direction by non-light-emitting regions as in PTL 1, but instead, a trench-in-trench structure (step-shaped trench structure) is formed within the light emitting region 13, as described above, by indenting the interlayer insulating layer 31 in a step shape.

Namely, in the present embodiment, it is sufficient to, within a first formed trench, namely, within a trench (upper-step-side trench, front-step-side trench) located in a shallow position from the surface of the sub pixel circuit portion 12 (in other words, at positions further from the surface of the semiconductor substrate 20), form a trench smaller in plan view than the above upper-step-side trench indented toward the semiconductor substrate 20 side (lower-step-side trench, rear-step-side trench).

Accordingly, as an extreme example, in the present embodiment, the lower-step-side trench may be disposed at any given position within the upper-step-side trench. For example, looking at the configuration illustrated in FIG. 1B, the second trench portion 40TR2 may be disposed at any given location within the first trench portion 40TR1.

Thus, the present embodiment does not require the high accuracy alignment technology (in particular, high accuracy alignment technology in the Y direction) such as that of PTL 1.

In the present embodiment, inter-trench spaces d11, d12 are sufficient to be produced with mask alignment in a range capable of forming the side walls (trench edges) serving as banks for reflecting the attenuated light (the light guided within the organic layer). A high accuracy grade mask is not required, enabling production cost to be lowered.

Advantage of Light Extraction Efficiency for Ultra-High Definition Panels

Generally, as display panels become higher in definition, the size of a single pixel becomes smaller the higher the definition. For example, in a display panel of ultra-high definition at a level of 600 ppi, the size of a single sub pixel is 42 μm×14 μm.

For such ultra-high definition display panels, it is difficult to secure the inter-trench space S if trenches 530 having the same size are arranged at a predetermined trench pitch P as in PTL 1.

As a result, the plurality of trenches 530 merge together to form a single trench. As a result, the desired number of trenches 530 cannot be formed.

In contrast thereto, in the present technology where the alignment accuracy of high accuracy photolithography as described above is not required, a trench-in-trench (for example, the step-shaped trench 40TR in which the second trench portion 40TR2 is formed within the first trench portion 40TR1) can be formed within the light emitting region 13 in a sub pixel area for an ultra-high definition pixel.

The present embodiment accordingly enables a plurality of reflective walls to be provided in the Y direction and the X direction even in cases in which the display panel 2 is high definition as described above.

A description follows regarding a modified example of the present embodiment.

Modified Example 1

Schematic Configuration of Display Panel 2

Figure 4A:
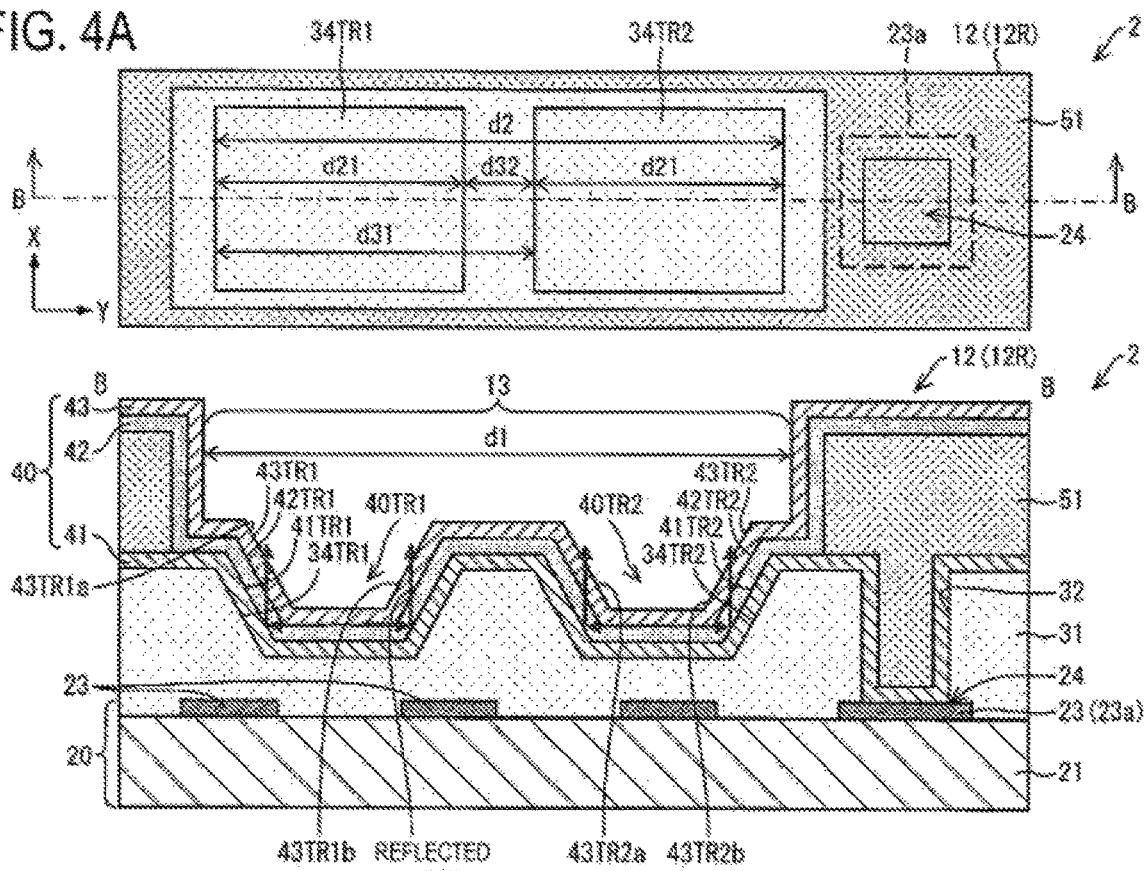
FIG. 4A is a diagram illustrating, arranged above and below, a plan view illustrating a schematic configuration of a sub pixel circuit portion according to a modified example 1 of the first embodiment of the present invention, and a cross-section arrow view taken along line B-B of the sub pixel circuit portion illustrated in the plan view.

FIG. 4A is a diagram illustrating, arranged above and below, a plan view (transparent view) of a schematic configuration of a sub pixel circuit portion 12 according to the present modified example, and a cross-section arrow view taken along line B-B of the sub pixel circuit portion illustrated in the plan view. In FIG. 4A, the top diagram illustrates a plan view, and the bottom diagram illustrates a cross-sectional view. Moreover, in the plan view (transparent view) in FIG. 4A, for ease of illustration, only a first trench portion 34TR1 and a second trench portion 34TR2 in an interlayer insulating layer 31 are illustrated as trenches.

As stated above, in the present embodiment, a description has mainly been given of an example of a case, as illustrated in FIG. 1B, in which a plurality of trenches having reflectivity are provided in the vertical direction (namely, a direction perpendicular to the substrate surface) within the light emitting region 13.

However, the present embodiment is not limited thereto. The EL element 40 may include at least one trench within the light emitting region 13. The one trench has an indented shape and includes a first electrode 41, an EL layer 42, and a second electrode 43, these being layered in this order and in contact with each other.

A description follows regarding the present modified example, for an example of a case in which a first trench portion 40TR1 and a second trench portion 40TR2 are disposed within the light emitting region 13 and side-by-side in the horizontal direction.

As an example of the present modified example, as illustrated in FIG. 4A, an example is given in which a first trench portion 34TR1 and a second trench portion 34TR2 having the same size as each other are formed in the interlayer insulating layer 31 side-by-side in the horizontal direction with a trench pitch of d31 and an inter-trench space of d32.

The display panel 2 according to the present modified example has the same configuration as that of the display panel 2 illustrated in FIGS. 1A and 1B, and FIG. 2, except in that, within the light emitting region 13 of each of the sub pixel circuit portions 12, a first trench portion 40TR1 and a second trench portion 40TR2 are provided side-by-side in the horizontal direction by forming the first trench portion 34TR1 and the second trench portion 34TR2.

Method for Producing Display Panel 2

The display panel 2 according to the present modified example can be produced by a similar method to that of FIGS. 3A to 3J, except in that the first trench portion 40TR1 and the second trench portion 40TR2 are formed in the horizontal direction.

Namely, in the present modified example, in the processes of FIGS. 3D and 3E, a photosensitive resist 63 is exposed with a photomask in which openings having the same size as each other are provide side-by-side in the horizontal direction, instead of the main trench photomask 64 and developed. The first trench portion 34TR1 and the second trench portion 34TR2 are then formed in the horizontal direction in the interlayer insulating layer 31 by etching the interlayer insulating layer 31 using the developed photosensitive resist 63 as a mask. Then, similar to the processes illustrated in FIG. 3H to FIG. 3J, after the first electrode 41, the edge cover 51, the EL layer 42, and the second electrode 43 have been formed on the interlayer insulating layer 31, the resultant EL element 40 is sealed by covering the obtained EL element 40 with a sealing member. The display panel 2 according to the present modified example can thereby be produced.

Advantage of Increasing the Light Extraction Efficiency Due to not Having an Insulating Layer within the Reflective Trench As described above, in the present modified example too, the first trench portion 40TR1 and the second trench portion 40TR2 each include the first electrode 41, the EL layer 42 and the second electrode 43, these being layered in this order and in contact with each other, and do not include a partition (insulating layer) on a reflection structure as in the trenches 530 of the sub pixel 510R in PTL 1.

Thus, in the present modified example too, the sub pixel circuit portion 12 includes only a single light emitting region 13, and do not include a configuration in which the light emitting region is partitioned into a plurality of light emitting regions by non-light-emitting regions as in PTL 1.

The sub pixel circuit portion 12 according to the present modified example also reflects light from the light emitting region 13 using the reflective electrode without interposing an insulating layer, and so superfluous reflection such as that of PTL 1 does not occur. The light generated in the EL layer 42 (light emitting layer) can accordingly be externally extracted with good efficiency.

In the present modified example too, similar to the sub pixel circuit portion 12 illustrated in FIG. 1B, an example is given of a case in which two trench portions within the light emitting region 13 are provided. The number of trenches within the light emitting region 13 is not limited thereto, and a similar number of trenches may be provided as the number in PTL 1. The present modified example enables the inter-trench space to be made smaller than that of the PTL 1 because partitions 527 are not provided within each of light emitting regions 510Ra nor between two light emitting regions 510Ra as in PTL 1, enabling the inter-trench space to be secured more easily. Thus, compared to in PTL 1, such high accuracy alignment technology as in PTL 1 (and in particular, high accuracy alignment technology in the Y direction) is not required. A high accuracy grade mask as that of PTL 1 is accordingly not required, enabling production cost to be lowered.

Advantage of Increased Lifespan of Light Emitting Layer

As described above, in the present modified example, the sub pixel circuit portion 12 does not have a configuration in which the light emitting region is partitioned into a plurality of light emitting regions by non-light-emitting regions as in PTL 1.

Moreover, in the present modified example too, as illustrated in FIG. 4A and similar to the sub pixel circuit portion 12 illustrated in FIG. 1B, the respective side faces of the trench portion 43TR1 and 43TR2 of the second electrode 43 (namely, the side walls 43TR1$a$, 43TR1$b$, 43TR2$a$, 43TR2$b$) are employed as a light emitting region.

Hence, in the present modified example too, the light emitting region (light emitting surface area) can be made larger than that of PTL 1, enabling the current density required for light emission to be lowered. Thus, the present modified example also enables the lifespan of the sub pixel circuit portions 12, and moreover the lifespan of the display panel 2 and the display device 1 including the sub pixel circuit portions 12, to be extended.

Modified Example 2

Schematic Configuration of Display Panel 2

Figure 4B:
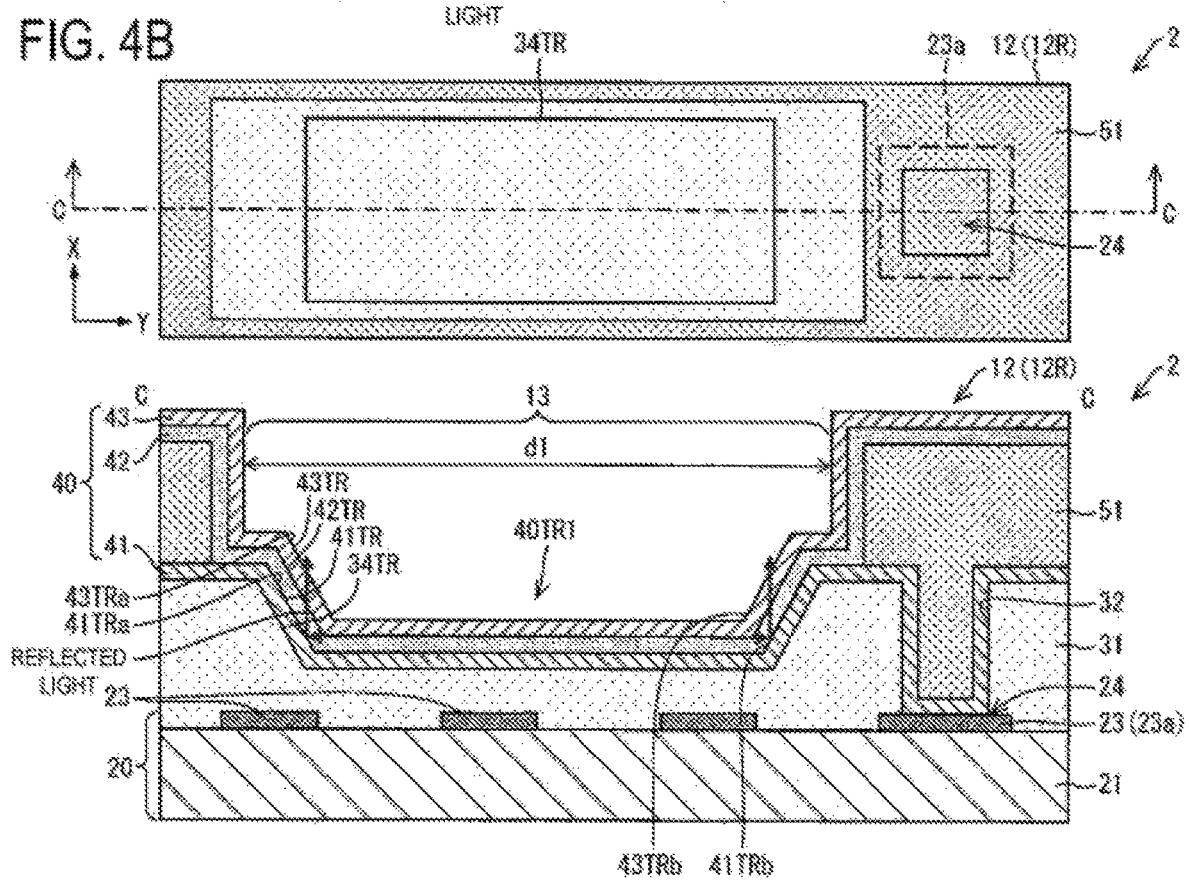
FIG. 4B is a diagram illustrating, arranged above and below, a plan view illustrating a schematic configuration of a sub pixel circuit portion according to a modified example 2 of the first embodiment of the present invention, and a cross-section arrow view taken along line C-C of the sub pixel circuit portion illustrated in the plan view.

FIG. 4B is a diagram illustrating, arranged above and below, a plan view (transparent view) of a schematic configuration of a sub pixel circuit portion 12 according to a modified example 2, and a cross-section arrow view taken along line C-C of the sub pixel circuit portion illustrated in the plan view. In FIG. 4B too, the top diagram illustrates a plan view and the bottom diagram illustrates a cross-sectional view. Moreover, in FIG. 4B too, for ease of illustration, only a trench portion 34TR in an interlayer insulating layer 31 is illustrated as a trench in a plan view (transparent view).

In the present modified example, within the light emitting region 13, only a single trench is provided as a trench having reflectivity (namely, a trench in an EL element 40). The single trench has an indented shape and includes the first electrode 41, the EL layer 42, and the second electrode 43, these being layered in this order and in contact with each other. Specifically, in the present modified example, within the light emitting region 13, only the first trench portion 40TR1 is provided as a trench having reflectivity. The first trench portion 40TR1 includes trench portions 41TR, 42TR, 43TR formed to the first electrode 41, the EL layer 42, and the second electrode 43 along a trench portion 34TR in the interlayer insulating layer 31.

The display panel 2 according to the present modified example, as illustrated in FIG. 4B, has the same configuration as the display panel 2 illustrated in FIGS. 1A and 1B, and FIG. 2, except in that only a single trench having reflectivity is provided within the light emitting region 13 of each of the sub pixel circuit portions 12 in plan view.

Method for Producing Display Panel 2

The display panel 2 according to the present modified example can be produced by a similar method to that of FIGS. 3A to 3J, except in that only the first trench portion 40TR1 is formed within the light emitting region 13.

Figure 3J:
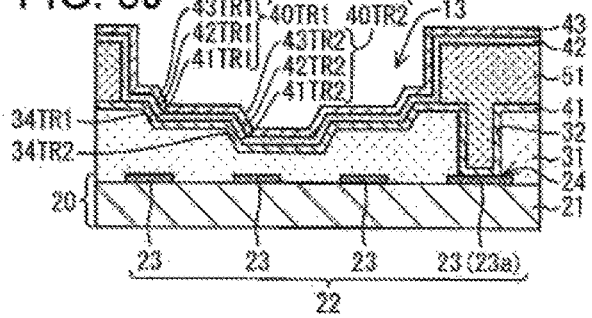

Namely, the display panel 2 of the present modified example can be produced by, for example, performing a process similar to that of FIG. 3H as the next process after the process illustrated in FIG. 3E, and then performing processes similar to the processes illustrated in FIG. 3I and FIG. 3J. The display panel 2 has only the first trench portion 40TR1 provided within the light emitting region 13, with the first trench portion 40TR1 including the trench portions 41TR, 42TR, 43TR.

Advantage of Increasing the Light Extraction Efficiency Due to not Having an Insulating Layer within the Reflective Trench In the present modified example too, the first trench portion 40TR1 includes the first electrode 41, the EL layer 42, and the second electrode 43, these being layered in this order and in contact with each other, and does not include a partition (insulating layer) on a reflection structure as in the trenches 530 of the sub pixel 510R in PTL 1.

Thus, the sub pixel circuit portion 12 according to the present modified example also includes only a single light emitting region 13 and do not have a configuration, as in PTL 1, in which the light emitting region is partitioned into a plurality of light emitting regions by non-light-emitting regions.

Therefore, the sub pixel circuit portion 12 according to the present modified example also reflects light from the light emitting region 13 using the reflective electrode without interposing an insulating layer, and so superfluous reflection such as that of PTL 1 does not occur. Thus, light generated in the EL layer 42 (the light emitting layer) can be externally extracted with good efficiency.

Advantage of Increased Lifespan of Light Emitting Layer

As described above, in the present modified example too, the sub pixel circuit portion 12 does not have a configuration, as in PTL 1, in which the light emitting region is partitioned into a plurality of light emitting regions by non-light-emitting regions.

Moreover, in the present modified example, as illustrated in FIG. 4B, the side faces of the trench portion 43TR of the second electrode 43 (namely, the side walls 43TRa, 43TRb illustrated in FIG. 4B) are also employed as light emitting regions.

Accordingly, the present modified example also enables the light emitting regions (the light emitting surface area) to be made larger than those of PTL 1 and enables the current density required to emit light to be lower than that of PTL 1. Thus, the present modified example also enables the lifespan of the sub pixel circuit portion 12, and moreover the lifespan of the display panel 2 and the display device 1 including the sub pixel circuit portions 12, to be extended.

Advantage of the Step-Shaped Trench 40TR for Modified Examples 1 and 2

A description follows regarding the advantage of the step-shaped trench 40TR for modified examples 1 and 2.

As described above, generally, as display panels become higher in definition, the size of a single pixel becomes smaller the higher the definition. For the display panel 2 with higher definition, it might be difficult to secure the inter-trench space d32 between the first trench portion 34TR1 and the second trench portion 34TR2 when, as illustrated in FIG. 4A, the first trench portion 34TR1 and the second trench portion 34TR2 are formed side-by-side in plan view within a region of the interlayer insulating layer 31 corresponding to the light emitting region 13. In this case, it might be difficult to form the first trench portion 34TR1 and the second trench portion 34TR2 isolated from each other.

However, when, as illustrated in FIGS. 1A and 1B, the second trench portion 34TR2 having a length-and-width size smaller than that of the first trench portion 34TR1 is formed as a sub trench within the first trench portion 34TR1 serving as a main trench, the inter-trench spaces d11, d12 may be secured as main trench-sub trench spaces within the first trench portion 34TR1.

A more specific description follows. A description follows regarding an example in which the width in the length direction (Y direction) of the sub pixel circuit portion 12 corresponds to a direction in which the trenches are arranged in the sub pixel circuit portion.

In the configuration illustrated in FIGS. 4A and 4B, $d1 \geq d21 \times 2 + d32 = d31 + d21$ is satisfied, wherein, as illustrated in FIG. 4A, the width in the Y direction of the light emitting region 13, this being a trench forming region, is d1, the respective widths in the Y direction of the trench portions 34TR1, 34TR2 are d21, the trench pitch is d31, and the inter-trench space is d32. So, for example, the value obtained by subtracting $d21 \times 2$ from d1 is the inter-trench space d32. Thus, when the display panel 2 is made higher definition, depending on the size of d21 with respect to d1, it becomes difficult to secure the inter-trench space d32 and it becomes difficult to form the two trench portions 34TR1, 34TR2 within the light emitting region 13.

In contrast thereto, when the step-shaped trench 40TR is formed as the reflective trench, then d1≥d2=d3+d11+d12 is satisfied, wherein, as illustrated in FIG. 1B, the width in the Y direction of the light emitting region 13, this being a trench forming region, is d1, as illustrated in FIG. 1A, the width in the Y direction of the first trench portion 34TR1 serving as the main trench according to the present embodiment is d2, the width in the Y direction of the second trench portion 34TR2 serving as the sub trench according to the present embodiment is d3, the distance in the Y direction from one end portion of the first trench portion 34TR1 to the end portion of the second trench portion 34TR2 located at the one end portion side of the second trench portion 34TR2 is d11 (a first inter-trench space), and the distance in the Y direction from the other end portion of the first trench portion 34TR1 to the end portion of the second trench portion 34TR2 located at the other end portion side of the second trench portion 34TR2 is d12 (a second inter-trench space).

Therefore, in the configuration illustrated in FIGS. 1A and 1B, for example, the value obtained by subtracting d3 from d1 (more precisely, d2) is the inter-trench spaces d11, d12. Thus, in the configuration illustrated in FIGS. 1A and 1B, to secure the inter-trench spaces d11, d12, within the first trench portion 34TR1, the second trench portion 34TR2 having a length-and-width size smaller than that of the first trench portion 34TR1 may be formed, enabling the two trench portions 34TR1, 34TR2 to be easily formed within the light emitting region 13.

As described above, as an extreme example, in the case of the configuration illustrated in FIGS. 1A and 1B, the second trench portion 34TR2 may be disposed at any given position within the first trench portion 34TR1, and high accuracy alignment technology (particularly, as a conventional high accuracy alignment technology in the Y direction) is not required. In FIGS. 1A and 1B, the inter-trench spaces d11, d12 are sufficient to be produced with mask alignment in a range capable of forming the side walls (trench edges) serving as banks for reflecting the above attenuated light (light guided within the organic layer). Accordingly, a high accuracy grade mask is not required, enabling production cost to be lowered.

Moreover, when the display panel 2 is made higher in definition, such as when the display panel 2 is made ultra-high definition at a level of 600 ppi as described above, the size of a single sub pixel is 42 μm×14 μm.

In such an ultra-high definition display panel 2, it is difficult to form the first trench portion 34TR1 and the second trench portion 34TR2 illustrated in FIG. 4A isolated from each other. As a result, the first trench portion 34TR1 and the second trench portion 34TR2 illustrated in FIG. 4A merge together, and only a single trench portion can be formed within the light emitting region 13 by forming a single trench portion 34TR, as illustrated in FIG. 4B.

As a result, only the trench portion 41TR of the first electrode 41 is formed on the trench portion 34TR in which the first trench portion 41TR1 and the second trench portion 41TR2 illustrated in FIG. 4A merge together; only the trench portion 42TR is formed on the trench portion 41TR in which the first trench portion 42TR1 and the second trench portion 42TR2 of the EL layer 42 illustrated in FIG. 4A merge together, and only the trench portion 43TR of the second electrode is formed on the trench portion 42TR in which the first trench portion 43TR1 and the second trench portion 43TR2 of the second electrode illustrated in FIG. 4A merge together. Obviously, the advantageous effects exhibited by modified example 2 can still be obtained in such cases.

However, in such cases, as illustrated in FIG. 4B, the sub pixel circuit portion includes reflective walls only at two locations in the Y direction. The reflective walls are side walls 41TRa, 41TRb of the trench portion 41TR in the Y direction. The side walls 41TRa, 41TRb are trench edges of the first electrode 41 having reflectivity in the Y direction.

Therefore, in such cases, the attenuated light attenuated within a single sub pixel by the light propagation distance limit can only be externally extracted by being reflected at the side walls 41TRa, 41TRb (trench edges) at two locations on the trench portion 41TR of the first electrode 41. The light reflected by the side wall 41TRa of the trench portion 41TR of the first electrode 41 is externally extracted via the side wall 43TRa of the trench portion 43TR of the second electrode 43. The light reflected at the side wall 41TRb of the trench portion 41TR of the first electrode 41 is externally extracted via the side wall 43TRb of the trench portion 43TR of the second electrode 43.

In contrast thereto, the configuration illustrated in FIGS. 1A and 1B does not, as described above, require an alignment accuracy of high accuracy photolithography, and enables the step-shaped trench 40TR1 with the second trench portion 40TR2 formed within the first trench portion 40TR1 to be formed within the light emitting region 13 having a sub pixel area for an ultra-high definition pixel.

Hence, as described above, when the step-shaped trench 40TR is formed as a reflective trench within the light emitting region 13, reflective walls are present in four locations in the Y direction, as illustrated in FIG. 1B: at the trench edges of the first electrode 41, i.e. at each of the Y direction side walls 41TR1$a$, 41TR1$b$ of the first trench portion 41TR1 and at each of the Y direction side walls 41TR2$a$, 41TR2$b$ of the second trench portion 41TR2. Hence, in such cases, the attenuated light reflected by the reflective walls in the four locations can be externally extracted via the trench edges of the second electrode 43, i.e. via each of the Y direction side walls 43TR1$a$. 43TR1$b$ of the first trench portion 43TR1 and via each of the Y direction side walls 43TR2$a$, 43TR2$b$ of the second trench portion 43TR2.

Accordingly, when the display panel 2 with ultra-high definition is formed as described above, the light extraction efficiency in the Y direction of the display panel 2 in which the step-shaped trench 40TR is formed as described above is about twice compared to the case illustrated in FIG. 4B. Thus, the display panel 2 in which the step-shaped trench 40TR is formed as described above can obtain a light extraction effect of about twice that of the conventional display panel in the Y direction.

Although the light extraction effect has been discussed with respect to the Y direction, obviously a similar improvement in light extraction effect can be obtained in the X direction.

Modified Example 3

In the present embodiment, as described above, an example has been described for a case in which the light emitting element is an organic EL element. However, the light emitting element is not necessarily an organic EL element, and may be an inorganic EL element.

Modified Example 4

In the present embodiment, an example has been described for a case in which the display panel 2 includes the RGB sub pixel circuit portions 12. However, the present embodiment is not limited thereto, and the display panel 2 may include sub pixel circuit portions 12 of other colors. The sub pixel circuit portions 12 may be sub pixel circuit portions formed from light emitting elements configured to exhibit, for example, light emission colors of magenta (M), yellow (Y), and cyan (C), and may be sub pixel circuit portions formed from light emitting elements configured to exhibit a light emission color of white (W).

Modified Example 5

In the present embodiment, an example has been described for a case in which the display panel 2 is an active EL panel, and the display device 1 is an active EL display device. However, the display panel 2 according to the present embodiment is not limited thereto. As stated above, the display panel 2 may be a passive EL panel, and the display device 1 may be a passive EL display device.

Modified Example 6

Examples of methods of implementing the display panel 2 employing EL elements in full color include: (1) a method in which sub pixel circuit portions, including EL elements including light emitting layers for emitting light of each color used to realize full color (each RGB color, for example), are arranged on a semiconductor substrate; (2) a method in which white-light-emitting EL elements, employing a light emitting layer with a light emission color of W, are combined with color filter (CF) layers to select the light emission color in each sub pixel; and (3) a method of realizing a full color picture display by using a light emitting layer with a light emission color of W, and incorporating a micro cavity structure for each of the respective sub pixels. Employing method (3) in combination with a CF layer enables the spectra of light emitted from the EL elements to be regulated using the CF.

In the present embodiment, an example has been described for a case in which the display panel 2 is implemented in full color by employing method (1) by coating a light emitting layer, for example, as the EL layer 42, onto each sub pixel circuit portion 12 selectively for each respective color. However, the present embodiment is not limited thereto, and any of the above methods (1) to (3) may be employed.

Although not illustrated, when a CF layer is formed in a display panel 2 as indicated in (2) or (3), which is a top-emitting display panel 2 in which light is emitted from the top side of the semiconductor substrate 20 as described above, a sealing film formed with a CF layer or a sealing substrate formed with a CF layer may be employed as the sealing film or sealing substrate. However, a bottom-emitting display panel 2 may include a CF layer formed on the semiconductor substrate 20 side of the display panel 2.

In the present embodiment, to form the EL elements 40 including light emitting layers to emit light of each respective color, the EL layer 42 is coated onto the sub pixel circuit portions 12 selectively for each respective color.

However, an EL display device combining a light emitting layer that emits W-light and a CF layer eliminates the need for coating the EL layer 42 onto the sub pixel circuit portions 12 selectively for each respective color, because the light emission color of each of the sub pixel circuit portions is changed by another method, such as by the CF layer or the micro cavity structure.

W light emission can be obtained by, for example, superposition of a plurality of light emission colors (namely, superposition of light emitting layers of a plurality of light emission colors). Examples of combinations of light emission colors include combinations such as a combination of blue light emission and orange light emission, a combination of blue light emission and yellow light emission, or the like. W light emission can also be obtained by a superposition of red light emission, blue light emission, and green light emission.

Modified Example 7

In the present embodiment, a description has been given of a case in which light emitting elements including EL elements according to the present embodiment are employed as pixel circuits (specifically, the sub pixel circuit portions 12 in the display panel 2).

The above EL elements and light emitting elements (pixel circuits) including the EL elements may, for example, be suitably employed in display panels in electronic devices, such as portable terminals of mobile phones, smartphones, tablet personal computers (PCs), mobile personal computers, or electronic papers. However, the present embodiment is not limited thereto.

The EL elements according to the present embodiment, and the light emitting elements including the EL elements according to the present embodiment, may be suitably employed in applications other than display panels of display devices. Namely, the EL elements according to the present embodiment, and the light emitting elements including the EL elements according to the present embodiment, may be suitably employed as EL elements and light emitting elements in various known electronic devices conventionally employing EL elements and light emitting elements such as illumination devices.

For the light emitting elements according to the present embodiment, the substrate on which the EL elements are mounted may accordingly have a configuration according to the application of the light emitting elements, and may include various drive circuits according to the design scheme of the electronic device in which the light emitting elements are installed.

Second Embodiment

A description follows regarding another embodiment of the present invention, with reference to FIGS. 5A to 5C and FIGS. 6A to 6F.

The present embodiment will be described by the differences between the present embodiment and the first embodiment, and components having the same function as the components described in the first embodiment are appended with the same reference signs, and the description thereof is omitted. Obviously, the same modifications as those of the first embodiment may also be applied to the present embodiment.

Display Panel 2

Figure 5A:
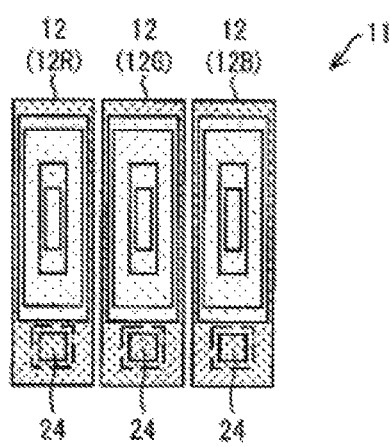
FIG. 5A is a plan view illustrating a schematic configuration of a pixel circuit portion of a display panel according to a second embodiment of the present invention.
Figure 5B:
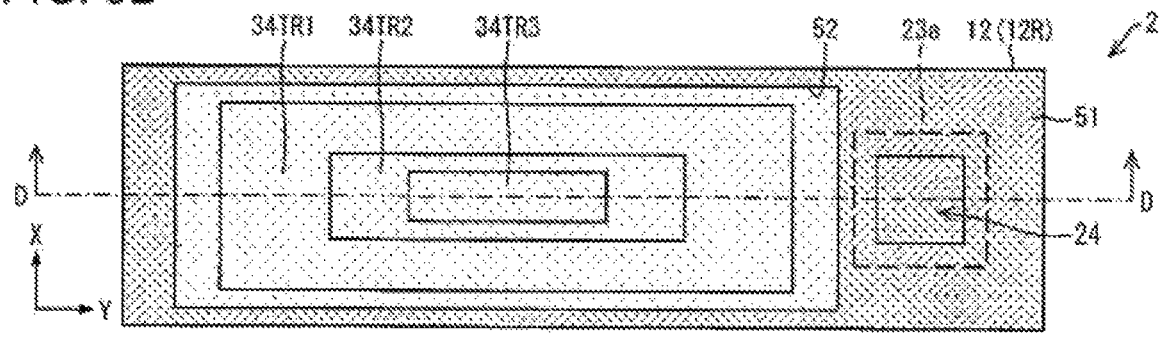
FIG. 5B is a plan view illustrating a schematic configuration of a sub pixel circuit portion of a display panel according to the second embodiment of the present invention.
Figure 5C:
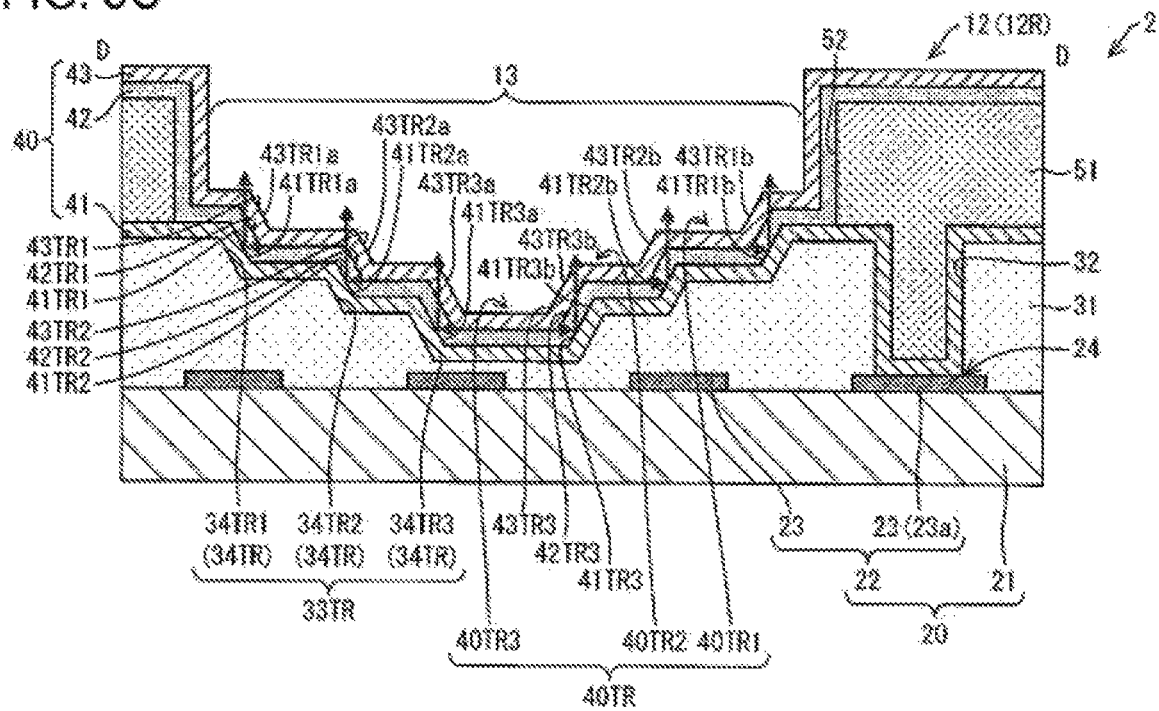
FIG. 5C is a cross-section arrow view taken along line D-D of the sub pixel circuit portion of the display panel illustrated in FIG. 5B.

FIG. 5A is a plan view (transparent view) illustrating a schematic configuration of a pixel circuit portion 11 of a display panel 2 according to the present embodiment FIG. 5B is a plan view (transparent view) illustrating a schematic configuration of a sub pixel circuit portion 12 of a display panel 2 according to the present embodiment FIG. 5C is a cross-section arrow view taken along line D-D of the sub pixel circuit portion 12 of the display panel 2 illustrated in FIG. 5B.

In the present embodiment too, as illustrated in FIG. 5A, the configuration is basically the same in the R sub pixel circuit portions 12R, the G sub pixel circuit portions 12G, and the B sub pixel circuit portions 12B.

Thus, in the present embodiment too, FIGS. 5B and 5C are diagrams illustrating a configuration of the sub pixel circuit portion 12 by employing an R sub pixel circuit portion 12R as an example of the sub pixel circuit portion 12.

The display panel 2 according to the present embodiment is, as illustrated in FIGS. 5A to 5C, the same as the display panel 2 according to the first embodiment except in the following points. The step-shaped trench 40TR includes a third trench portion 40TR3. The third trench portion 40TR3 is formed in plan view within a second trench portion 40TR2, which is in turn formed in plan view within a first trench portion 40TR1. The third trench portion 40TR3 is smaller in length-and-width size than the second trench portion 40TR2. An interlayer insulating layer 31 includes, within the light emitting region 13, a step-shaped trench 33TR having a shape corresponding to that of the step-shaped trench 40TR.

As illustrated in FIG. 5C, the step-shaped trench 40TR has an indented shape. The third trench portion 40TR3 has a cross-section profile in which the third trench portion 40TR3 is located further to the semiconductor substrate 20 side than the second trench portion 40TR2, and the second trench portion 40TR2 is located further to the semiconductor substrate 20 side than the first trench portion 40TR1.

In the present embodiment, the step-shaped trench 40TR has a shape in conformance with the shape of the step-shaped trench 33TR within the light emitting region 13.

As illustrated in FIGS. 5A to 5C, in the present embodiment, the interlayer insulating layer 31 has a trench portion 34TR including a third trench portion 34TR3. The third trench portion 34TR3 is formed in plan view within a second trench portion 34TR2, which is in turn formed in plan view within a first trench portion 34TR1. The third trench portion 34TR3 is smaller in length-and-width size than the second trench portion 34TR2. The step-shaped trench 33TR is formed by the first trench portion 34TR1, the second trench portion 34TR2, and the third trench portion 34TR3. The step-shaped trench 33TR has an indented shape with a cross-section profile in which the third trench portion 34TR3 is located further to the semiconductor substrate 20 side than the second trench portion 34TR2, and the second trench portion 34TR2 is located further to the semiconductor substrate 20 side than the first trench portion 34TR1.

A first electrode 41 has a step-shaped trench structure in which, within the light emitting region 13, a second trench portion 41TR2 is formed as a first sub trench within a first trench portion 41TR1 formed as a main trench by the first electrode 41, the second trench portion 41TR2 being smaller in length-and-width size than the first trench portion 41TR1. In the step-shaped trench structure, a third trench portion 41TR2 is formed by the first electrode 41 as a second sub trench within the second trench portion 41TR2, the third trench portion 41TR2 being smaller in length-and-width size than the second trench portion 41TR3.

Similarly, an EL layer 42 has a step-shaped trench structure in which, within the light emitting region 13, a second trench portion 42TR2 is formed as a first sub trench within a first trench portion 42TR1 formed as a main trench by the EL layer 42, the second trench portion 42TR2 being smaller in length-and-width size than the first trench portion 42TR1. In the step-shaped trench structure, a third trench portion 42TR3 is formed by the EL layer 42 as a second sub trench within the second trench portion 42TR2, the third trench portion 42TR3 being smaller in length-and-width size than the second trench portion 42TR2.

A second electrode 43 has a step-shaped trench structure in which, within the light emitting region 13, a second trench portion 43TR2 is formed as a first sub trench within a first trench portion 43TR1 formed as a main trench by the second electrode 43, the second trench portion 43TR2 being smaller in length-and-width size than the first trench portion 43TR1. In the step-shaped trench structure, a third trench portion 43TR3 is formed by the second electrode 43 as a second sub trench within the second trench portion 43TR2, the third trench portion 43TR3 being smaller in length-and-width size than the second trench portion 43TR2.

Thus, similar to the first embodiment, in the present embodiment too, the step-shaped trench 40TR includes the first electrode 41, the EL layer 42, and the second electrode 43, these being layered in this order and in contact with each other, and does not include a partition (insulating layer) on a reflection structure, like that of the trench 530 in the sub pixel 510R of PTL 1.

The sub pixel circuit portion 12 according to the present embodiment therefore also has only a single light emitting region 13 and do not have a configuration such as that of PTL 1 in which the light emitting region is partitioned into a plurality of light emitting regions by non-light-emitting regions.

The sub pixel circuit portion 12 according to the present embodiment therefore also uses the reflective electrode to reflect light from the light emitting region 13 without interposing an insulating layer, and so superfluous reflection like that in PTL 1 does not occur.

In the present embodiment, the side walls of the third trench portion 34TR3 of the interlayer insulating layer 31 preferably include inclined faces, similar to those of the first trench portion 34TR1 and the second trench portion 34TR2. The angle of the inclined faces (taper angle) is particularly preferably set at 45° or near 45°.

In the EL element 40, the first electrode 41, the EL layer 42, and the second electrode 43 of the EL element 40 are layered on the step-shaped trench 33TR of the interlayer insulating layer 31 along the step-shaped trench 33TR. The first electrode 41, the EL layer 42, and the second electrode 43 accordingly each include inclined faces at each of their side walls, i.e. at the first trench portions 41TR1, 42TR1, 43TR1, at the second trench portions 41TR2, 42TR2, 43TR2, and at the third trench portions 41TR3, 42TR3, 43TR3. The angle of each inclined face (taper angle) is set, for example, at 45° or near 45°.

The present embodiment accordingly also enables light reflected by the reflective electrode of the EL element 40 i.e. light reflected at the interfaces and guided within the EL layer 42 to be extracted at the front face side (namely, the display face side) of the display panel 2 with good efficiency. However, in the present embodiment too, the above taper angle is not limited to the above angles.

In the present embodiment too, the plan view area ratio and the surface area ratio of the second trench portions 34TR2, 41TR2, 42TR2, 43TR2 with respect to those of the first trench portions 34TR1, 41TR1, 42TR1, 43TR1 of the interlayer insulating layer 31, the first electrode 41, the EL layer 42, and the second electrode 43, and the length and width dimensions and depth of the second trench portions 34TR2, 41TR2, 42TR2, 43TR2, are suitably set such that the length-and-width sizes of the second trench portions 34TR2, 41TR2, 42TR2, 43TR2 do not exceed the light propagation distance limit.

Similarly, the plan view area ratio and the surface area ratio of the third trench portions 34TR3, 41TR3, 42TR3, 43TR3 with respect to those of the second trench portions 34TR2, 41TR2, 42TR2, 43TR2 of the interlayer insulating layer 31, the first electrode 41, the EL layer 42, and the second electrode 43, and the length and width dimensions and depth of the third trench portions 34TR3, 41TR3, 42TR3, 43TR3, are suitably set such that the length-and-width sizes of the third trench portions 34TR3, 41TR3, 42TR3, 43TR3 do not exceed the light propagation distance limit.

Method for Producing Display Panel 2

Next, a description follows regarding a method for producing the display panel 2 described above, with reference to FIGS. 6A to 6F.

FIGS. 6A to 6F are cross-sectional views of main portions to illustrate a sequence of processes in part of a process for producing the display panel 2 according to the present embodiment. FIGS. 6A to 6F illustrate processes after the process illustrated in FIG. 3G. FIGS. 6A to 6F also illustrate cross-sectional structures of the sub pixel circuit portion 12.

In the present embodiment, the second trench portion 34TR2 is formed within the first trench portion 34TR1 of the interlayer insulating layer 31 by first performing processes similar to the processes illustrated in FIGS. 3A to 3G.

In the processes for producing the display panel 2 according to the present embodiment, the processes illustrated in FIGS. 3A to 3G are the same as those in the processes for producing the display panel 2 according to the first embodiment. A description and illustration in the drawings are accordingly omitted regarding the processes illustrated in FIGS. 3A to 3G for the present embodiment.

Figure 6A:
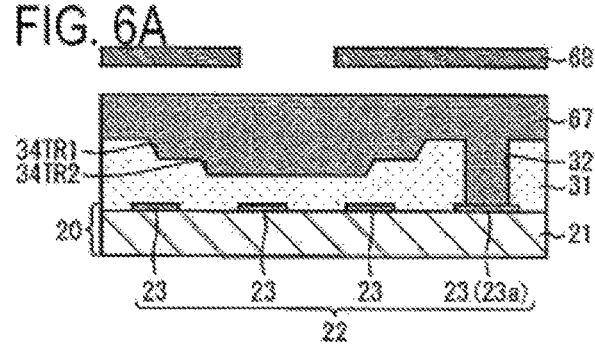
FIGS. 6A to 6F are cross-sectional views of main portions illustrating a sequence of processes in part of a process for producing a display panel according to the second embodiment of the present invention.

Next, as illustrated in FIG. 6A, the photosensitive resist 65 for forming the second trench portion 34TR2 is removed, and a photosensitive resist 67 is coated onto the interlayer insulating layer 31 in which the second trench portion 34TR2 and the contact hole 32 are formed, with the photosensitive resist 67 covering the contact hole 32 and the interlayer insulating layer 31. In the present embodiment, the method for removing the photosensitive resist is not limited to a specific method. The photosensitive resist may, for example, be removed by a similar method to that in the first embodiment.

Next, as illustrated in FIG. 6A, the photosensitive resist 67 is exposed with a second sub trench photomask 68 for forming the third trench portion 34TR3, this being the second sub trench, and developed.

Figure 6D:
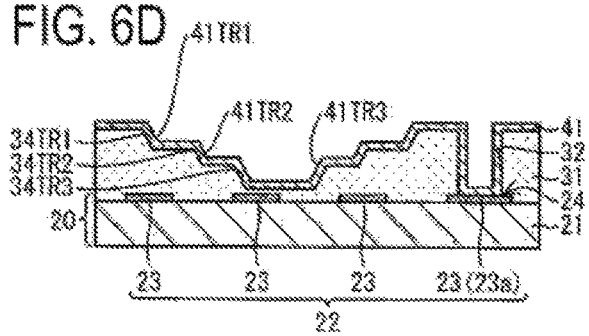
Figure 6B:
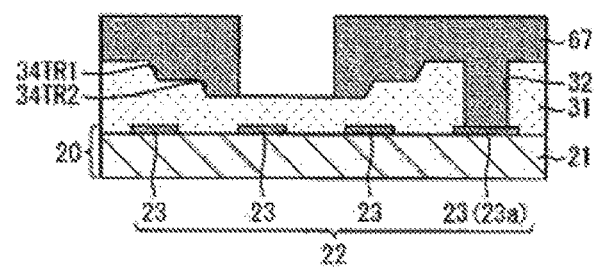

Then, as illustrated in FIG. 6B, the interlayer insulating layer 31 is half etched (by dry etching or wet etching) using the developed photosensitive resist 67 as a mask.

Figure 6E:
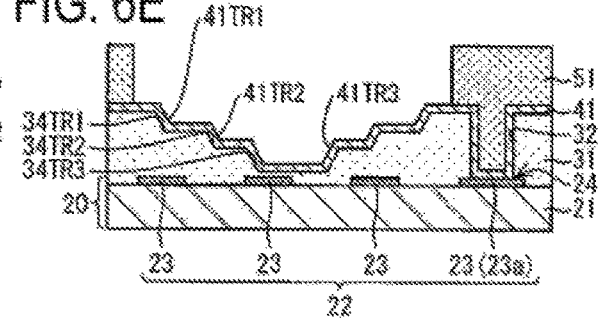
Figure 6C:
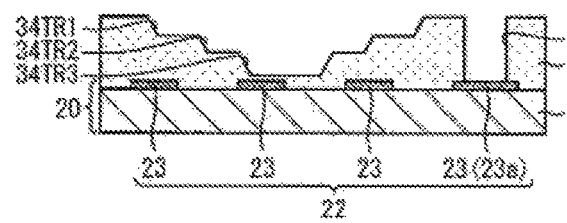

The third trench portion 34TR3 is thereby formed in the interlayer insulating layer 31, as illustrated in FIG. 6C. There are no particular stipulations regarding the taper angle of the third trench portion 34TR3. However, the taper angle is generally 45°. Then, as illustrated in FIG. 6C, the photosensitive resist 67 is removed.

Thereafter, as illustrated in FIG. 6D, similar to the first embodiment, an electrode material for forming the first electrode 41 (anode metal layer) is deposited on the interlayer insulating layer 31 using a sputtering method, for example, with the electrode material covering the contact hole 32 and the interlayer insulating layer 31.

Then, as illustrated in FIG. 6D, a photosensitive resist is patterned to form a resist pattern (not illustrated) by a photolithography method, and after the layer formed from the electrode material has been etched using the resist pattern as a mask, the resist pattern is removed. The first electrode 41 including the first trench portion 41TR1, the second trench portion 41TR2, and the third trench portion 41TR3 is thereby formed. The first electrodes 41 for the sub pixel circuit portions 12 are isolated from each other. The drive TFT-to-first electrode contact portion 24 is also formed in which a drive TFT 23a and the first electrode 41 are electrically connected through the contact hole 32.

Next, as illustrated in FIG. 6E, similar to the first embodiment, an edge cover 51 is formed across the entire display region of the semiconductor substrate 20 in which the first electrode 41 is formed by depositing an insulating material, with the insulating material covering the first electrode 41 and the interlayer insulating layer 31.

Then, as illustrated in FIG. 6E, similar to the first embodiment, a photosensitive resist is patterned to form a resist pattern (not illustrated) by a photolithography method, and after the layer formed from the insulating material has been etched using the resist pattern as a mask, the resist pattern is removed. The edge cover 51 is thereby patterned in a shape defining the light emitting region of each of the sub pixel circuit portions 12.

Figure 6F:
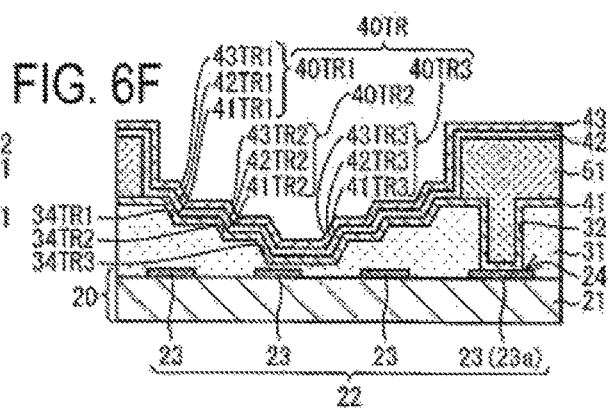

Thereafter, as illustrated in FIG. 6F, similar to the first embodiment, the EL layer 42 including the first trench portion 42TR1, the second trench portion 42TR2, and the third trench portion 42TR3 is formed on the first electrode 41 along the first trench portion 41TR1, the second trench portion 41TR2, and the third trench portion 41TR3.

Next, similar to the first embodiment, the second electrode 43 (cathode metal layer) including the first trench portion 43TR1, the second trench portion 43TR2, and the third trench portion 43TR3 is formed using, for example, a sputtering method, across the entire display region of the semiconductor substrate 20 in which the EL layer 42 is formed, along the first trench portion 42TR1, the second trench portion 42TR2, and the third trench portion 42TR3 of the EL layer 42. Thereby, the EL element 40 including the step-shaped trench 40TR is formed within the light emitting region 13 not covered by the edge cover 51. The step-shaped trench 40TR includes the third trench portion 40TR3 configured from the third trench portions 41TR3, 42TR3, 43TR3 formed within the second trench portion 40TR2. The second trench portion 40TR2 configured from the second trench portions 41TR2, 42TR2, 43TR2 is in turn formed within the first trench portion 40TR1 configured from the first trench portions 41TR1, 42TR1, 43TR1.

Then, similar to the first embodiment, the EL element 40 is sealed by covering the EL element 40 with a sealing member such as, for example, a cover glass (not illustrated).

Light Emitting/Improved Light Extraction Action of Display Panel 2

The light emitting action and improved light extraction action of the sub pixel circuit portion 12 in the display panel 2 according to the present embodiment is basically the same as that of first embodiment.

In the present embodiment too, attenuated light, which has been attenuated by the light propagation distance limit due to reflection at interfaces and guiding within the EL element 40, is reflected at the trench edges of the reflective first electrode 41 toward the second electrode 43 side, this being the front face side (display face side) of the display panel 2. The light reflected by the trench edges of the first electrode 41 can thereby be externally extracted from the trench edges of the second electrode 43.

However, in the present embodiment, reflective walls are present in the trench portions 41TR1, 41TR2, 41TR3 of the first electrode 41 at a total of six locations in the Y direction and a total of six locations in the X direction, enabling the attenuated light to be reflected by each of the reflective walls and externally extracted.

In the present embodiment, FIG. 5C illustrates a manner in which the attenuated light is reflected by the trench edges of the first electrode 41, i.e. by each side wall 41TR1a, 41TR1b of the first trench portion 41TR1, by each side wall 41TR2a, 41TR2b of the second trench portion 41TR2, and by each side wall 41TR3a, 41TR3b of the third trench portion 41TR3. The attenuated light is externally extracted from the trench edges of the second electrode 43, i.e. from each side wall 43TR1a, 43TR1b of the first trench portion 43TR1, from each side wall 43TR2a, 43TR2b of the second trench portion 43TR2, and from each side wall 43TR3a, 43TR3b of the third trench portion 43TR3.

Thus, the attenuated light is illustrated in FIG. 5C as being reflected by each of the side walls (trench edges) of the respective trench portions 41TR1, 41TR2, 41TR3 in the length direction (Y direction) of the sub pixel circuit portion 12. However, the attenuated light is also reflected in a similar manner by each of the side walls (trench edges) of the respective trench portions 41TR1, 41TR2, 41TR3 in the width direction (X direction) of the sub pixel circuit portion 12.

Advantageous Effects

As described above, similar to the first embodiment, the present embodiment does not adopt a trench shape serving as walls and banks for reflecting light and formed in an island pattern partitioned in the horizontal direction by non-light-emitting regions as in PTL 1, but instead, the step-shaped trench 40TR is provided within the light emitting region 13. The step-shaped trench 40TR has a step-shaped at the inside and does not include an insulating layer between the first electrode 41 and the second electrode 43.

Accordingly, the present embodiment can also obtain similar advantageous effects to those of the first embodiment.

The present embodiment enables the number of reflection points to be increased compared to in the first embodiment by providing the third trench portion 34TR3 within the second trench portion 34TR2.

A more detailed description follows regarding an advantage related to the number of reflection points, with reference to modified examples 1 and 2 of the first embodiment.

As described in the first embodiment, generally, as display panels become higher in definition, the size of a single pixel becomes smaller the higher the definition. For the display panel 2 with higher definition, it might be difficult to secure the inter-trench space d32 when, as illustrated in FIG. 4A, the first trench portion 34TR1 and the second trench portion 34TR2 are formed side-by-side in the length direction (Y direction) in plan view within a region of the interlayer insulating layer 31 corresponding to the light emitting region 13.

Thus, as illustrated in FIG. 4A, depending on the size of the light emitting region 13, the minimum number of divided trenches in the Y direction due to the limitations of photolithography is two. Namely, reflection points for the light attenuated by the light propagation distance limit inside each of the sub pixels are present at four locations in the Y direction of the first electrode 41.

However, in the present embodiment, as illustrated in FIG. 5C, due to forming the double sub trench structure including the first sub trench and the second sub trench within the main trench, the reflection points for the light attenuated by the light propagation distance limit can be increased to six locations in the Y direction of the first electrode 41. Thus, the sub pixel circuit portion 12 of the present embodiment can obtain a light extraction effect of 1.5 times that of the sub pixel circuit portion 12 illustrated in FIG. 4A in the Y direction. The sub pixel circuit portion 12 of the present embodiment can also obtain a light extraction effect of about three times that of the sub pixel circuit portion 12 illustrated in FIG. 4B.

Although the effect on light extraction has been discussed with respect to the Y direction, obviously a similar improvement in light extraction effect can be obtained in the X direction.

Basically, the light extraction effect can be increased as the number of reflective wall of the trenches is increased. Accordingly, the present embodiment enables the light extraction effect to be improved more that in the first embodiment.

Modified Example 1

In the present embodiment, an example has been described for a case in which the number of reflection points for the light attenuated by the light propagation distance limit is increased in the Y direction of the first electrode 41 by forming the double sub trench structure including the first sub trench and the second sub trench within the main trench.

However, the method for increasing the number of sub trenches within the main trench is not limited to the above method.

In cases in which Z trenches (Z being a freely-selected integer of 1 or greater) are formed within the light emitting region 13, each of the trenches is preferably formed such that the zth sub trench (z being any integer of from 2 to Z) is formed in the z−1th trench, as in the present embodiment, for the reasons described in the first and second embodiments, and in particular from the viewpoint of the limitations of photolithography.

However, as stated above, the plan view area ratio and the surface area ratio of the zth trench (for example, the second trench portion 34TR2) with respect to the z−1th trench (for example, the first trench portion 34TR1), and the length and width dimensions and depth of the zth trench are preferably set such that the length-and-width size of the zth trench does not exceed the light propagation distance limit.

Thus, a plurality of sub trenches may be provided side-by-side inside the main trench, depending on the minimum number of divided trenches in the Y direction due to the limitations of photolithography and the light propagation distance limit.

For example, when the minimum number of divided trenches in the Y direction due to the limitations of photolithography is two, then two sub trenches may be provided side-by-side in the main trench, and these two sub trenches provided side-by-side may each be formed in a step shape. Namely, a configuration may be adopted in which there are a plurality of step-shaped trenches provided side-by-side in plan view within a step-shaped trench.

Modified Example 2

The method for increasing the number of trenches within the light emitting region 13 is not limited to the method described above. In cases in which the minimum number of divided trenches in the Y direction due to the limitations of photolithography is two, as described above, the first trench portion 34TR1 and the second trench portion 34TR2 may, as illustrated in FIG. 4A, be provided side-by-side in plan view within the light emitting region 13, and these two trenches provided side-by-side may each be formed in a step shape.

Namely, a configuration may be adopted in which there are a plurality of step-shaped trenches provided side-by-side in plan view within the light emitting region 13.

For example, a configuration may be adopted in which a third trench portion 40TR3 smaller in length-and-width size than the first trench portion 34TR1 is provided in the first trench portion 34TR1 in FIG. 4A, and a similar trench portion to the third trench portion 40TR3 and having a length-and-width size smaller than the second trench portion 34TR2 is provided within the second trench portion 34TR2 in FIG. 4A.

Obviously, a step-shaped trench may be provided in only one out of the first trench portion 34TR1 and the second trench portion 34TR2 in FIG. 4A, and the first trench portion 34TR1 and the second trench portion 34TR2 may be different in size from each other.

Namely, a plurality of main trenches may be provided in the horizontal direction. Reference here to main trench is not restricted by size or number, and merely indicates a trench furthest to the outside (having the outermost outline) in plan view in a step-shaped trench having another trench as a sub trench inside the main trench.

Third Embodiment

A description follows regarding yet another embodiment of the present invention, with reference to FIGS. 7A to 7C and FIGS. 8A to 8I.

The present embodiment will be described by the differences between the present embodiment and the first embodiment. Components having the same function as the components described in the first embodiment are appended with the same reference signs, and the description thereof is omitted. Obviously, similar modifications to those of the first and second embodiments may also be applied to the present embodiment.

Display Panel 2

Figure 7A:
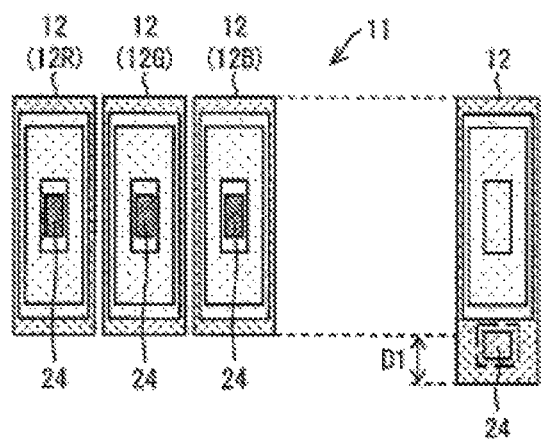
FIG. 7A is a plan view illustrating a schematic configuration of a pixel circuit portion of a display panel according to a third embodiment of the present invention, illustrated alongside a sub pixel circuit portion of the first embodiment of the present invention for comparison purposes.
Figure 7B:
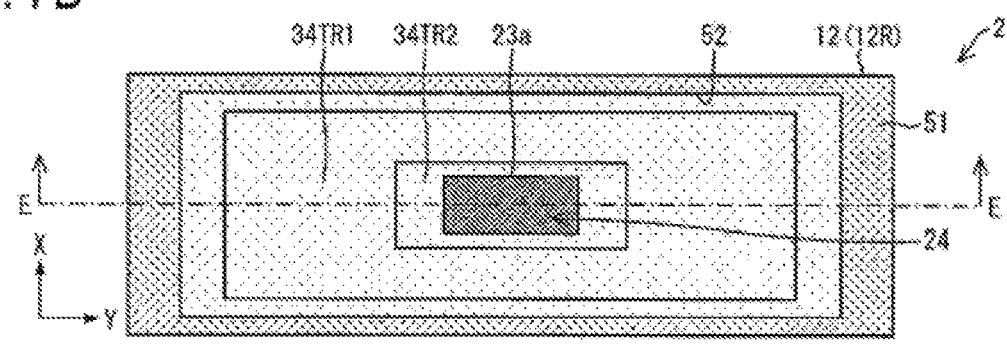
FIG. 7B is a plan view illustrating a schematic configuration of a sub pixel circuit portion of a display panel according to the third embodiment of the present invention.
Figure 7C:
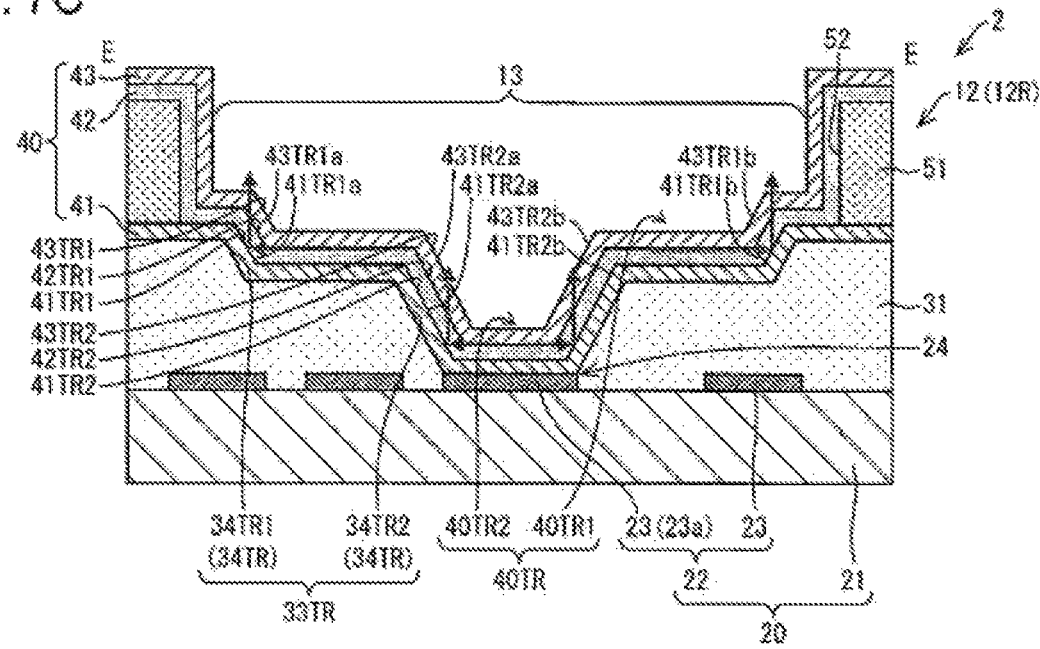
FIG. 7C is a cross-section arrow view taken along line E-E of the sub pixel circuit portion of the display panel illustrated in FIG. 7B.

FIG. 7A is a plan view (transparent view) of a schematic configuration of a pixel circuit portion 11 of a display panel 2 according to the present embodiment, illustrated alongside the sub pixel circuit portion 12 of the first embodiment for comparison purposes. FIG. 7B is a plan view (transparent view) illustrating a schematic configuration of a sub pixel circuit portion 12 of a display panel 2 according to the present embodiment. FIG. 7C is a cross-section arrow view taken along line E-E of the sub pixel circuit portion 12 of the display panel 2 illustrated in FIG. 7B.

In the present embodiment, as illustrated in FIG. 7A, the configuration is also basically the same in the R sub pixel circuit portions 12R, the G sub pixel circuit portions 12G, and the B sub pixel circuit portions 12B.

Thus, in the present embodiment too, FIGS. 7B and 7C are diagrams illustrating a configuration of the sub pixel circuit portion 12 by employing an R sub pixel circuit portion 12R as an example of the sub pixel circuit portion 12.

The display panel 2 according to the present embodiment is, as illustrated in FIGS. 7A to 7C, the same as the display panel 2 according to the first embodiment except in the following points. In each sub pixel circuit portions 12, a drive TFT-first electrode contact portion 24 is provided in a sub trench area (sub trench portion). A drive TFT-first electrode contact portion 24 is not provided outside the light emitting region 13.

Namely, in the present embodiment, a drive TFT 23a is disposed within a second trench portion 34TR2 of an interlayer insulating layer 31, and a first electrode 41 is electrically connected to the drive TFT 23a at a second trench portion 41TR2 in the first electrode 41.

Accordingly, the present embodiment eliminates the need for providing a drive TFT-first electrode contact portion 24 in a non-light-emitting region outside the light emitting region 13. The sub pixel circuit portion 12 of the present embodiment has a configuration in which the region provided outside the light emitting region 13 for forming the drive TFT-first electrode contact portion 24 in the sub pixel circuit portion 12 according to the first embodiment has been removed.

Method for Producing Display Panel 2

A description follows regarding a method for producing the display panel 2, with reference to FIGS. 8A to 8I.

FIGS. 8A to 8I are cross-sectional views of main portions to illustrate a sequence of processes in a process for producing the display panel 2 according to the present embodiment. Note that FIGS. 8A to 8I illustrate cross-sectional structures of the sub pixel circuit portion 12.

Figure 8A:
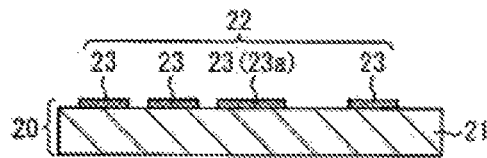
FIGS. 8A to 8I are cross-sectional views of main portions illustrating a sequence of processes in a process for producing a display panel according to the third embodiment of the present invention.

First, as illustrated in FIG. 8A, the semiconductor substrate 20 is prepared by forming, on an insulating substrate 21, a TFT circuit portion 22 including the drive TFT 23a and the various lines described above (not illustrated in the drawings), such as scanning lines GL, data lines SL, high level power source lines ELVDD, low level power source lines ELVSS, and emission lines.

At this time, the drive TFT 23a in the present embodiment is disposed within the region for forming the second trench portion 43TR2 such that the first electrode 41 forms the drive TFT-first electrode contact portion 24 in the second trench portion 41TR2.

Figure 8F:
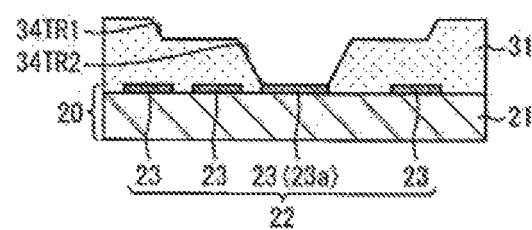
Figure 8B:
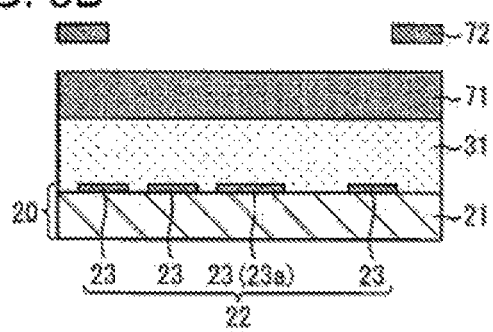

Next, as illustrated in FIG. 8B, the interlayer insulating layer 31 is formed on the semiconductor substrate 20 similar to the first embodiment by depositing an insulating material, such as a photosensitive resin, across the entire display region of the semiconductor substrate 20.

Then, as illustrated in FIG. 8B, a photosensitive resist 71 is coated onto the interlayer insulating layer 31, and the photosensitive resist 71 is exposed with a main trench photomask 72 for forming the first trench portion 34TR1 as a main trench in the interlayer insulating layer 31 and developed.

Figure 8G:
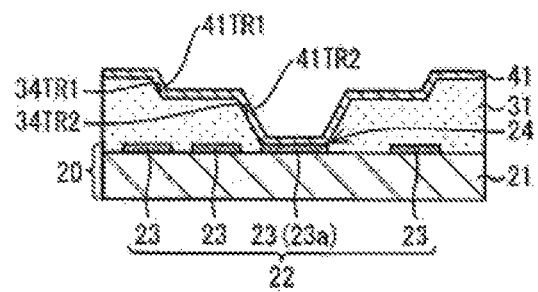
Figure 8C:
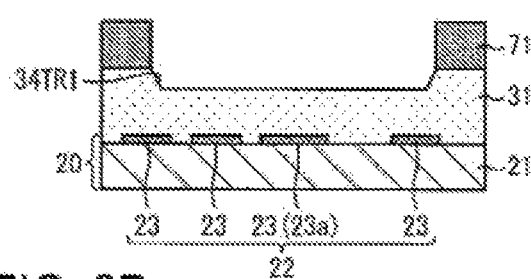

Next, as illustrated in FIG. 8C, similar to the first embodiment, the first trench portion 34TR1 is formed in the interlayer insulating layer 31 by half etching (either dry etching or wet etching) the interlayer insulating layer 31 using the developed photosensitive resist 71 as a mask. The taper angle of the first trench portion 34TR1 in the present embodiment is also not limited to a specific angle. However, the taper angle is generally 45°.

Figure 8H:
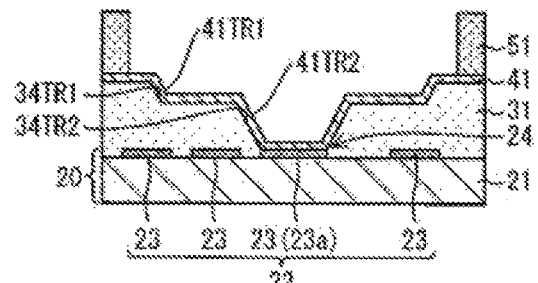
Figure 8D:
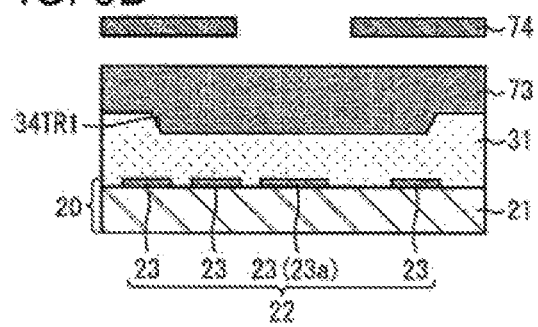

Next, as illustrated in FIG. 8D, after the photosensitive resist 71 has been removed, a photosensitive resist 73 is coated onto the interlayer insulating layer 31, with the photosensitive resist 73 covering the interlayer insulating layer 31. Next, as illustrated in FIG. 8D, the photosensitive resist 73 is exposed with a sub trench photomask 74 for forming the second trench portion 34TR2 employed as a contact hole to form the drive TFT-first electrode contact portion 24 within the first trench portion 34TR1 and developed.

Then, as illustrated in FIG. 8K after the interlayer insulating layer 31 above the drive TFT 23a is etched (dry etching or wet etching) using the developed photosensitive resist 73, the developed photosensitive resist 73 is removed.

Then, as illustrated in FIG. 8F, the second trench portion 34TR2 is formed within the first trench portion 34TR1 in the interlayer insulating layer 31, and the drive TFT 23a is exposed. Similar to the first embodiment, the taper angle of the second trench portion 34TR2 is not limited to a specific angle in cases in which the second trench portion 34TR2 is also used as a contact hole to form the drive TFT-first electrode contact portion 24 in this manner too. However, the taper angle is generally 45°.

Then, as illustrated in FIG. 8G, similar to the first embodiment, an electrode material for forming the first electrode 41 (anode metal layer) is deposited on the interlayer insulating layer 31 using a sputtering method, for example, with the electrode material covering the drive TFT 23a and the interlayer insulating layer 31.

Next, as illustrated in FIG. 8G, a photosensitive mask is patterned to form a resist pattern (not illustrated) by a photolithography method, and after the layer formed from the electrode material has been etched using the resist pattern as a mask, the resist pattern is removed. The first electrode 41 including the first trench portion 41TR1 and the second trench portion 41TR2 is thereby formed. The first electrodes 41 for the sub pixel circuit portions 12 are isolated from each other. The drive TFT-to-first electrode contact portion 24 is thereby formed with the drive TFT 23a and the first electrode 41 electrically connected to each other at the second trench portion 41TR2.

Figure 8I:
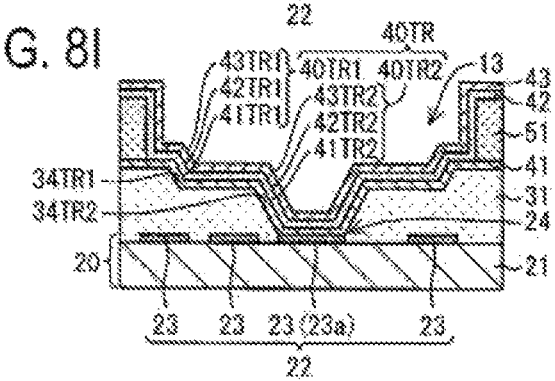
Figure 8E:
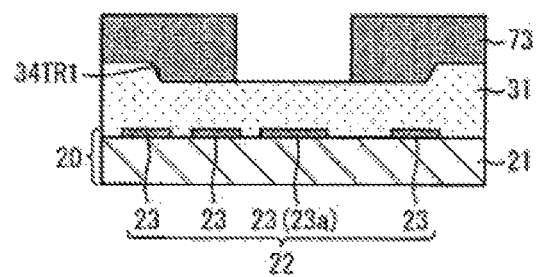

Next, as illustrated in FIG. 8I, an edge cover 51 is formed similarly to the first embodiment across the entire display region of the semiconductor substrate 20 in which the first electrode 41 is formed by depositing an insulating material, with the insulating material covering the first electrode 41 and the interlayer insulating layer 31.

Then, as illustrated in FIG. 8H, similar to the first embodiment, a photosensitive resist is patterned to form a resist pattern (not illustrated) by a photolithography method, and after the layer formed from the insulating material has been etched using the resist pattern as a mask, the resist pattern is removed, and the edge cover 51 is thereby patterned in a shape defining the light emitting region of each of the sub pixel circuit portions 12.

Then, as illustrated in FIG. 8I, similar to the first embodiment, the EL layer 42 including the first trench portion 42TR1 and the second trench portion 42TR2 is formed on the first electrode 41 along the first trench portion 41TR1 and the second trench portion 41TR2.

Next, similar to the first embodiment, the second electrode 43 (cathode metal layer) including the first trench portion 43TR1 and the second trench portion 43TR2 is formed over the entire display region of the semiconductor substrate 20 in which the EL layer 42 is formed, using, for example, a sputtering method, along the first trench portion 42TR1 and the second trench portion 42TR2 of the EL layer 42. Thereby, the EL element 40 including the step-shaped trench 40TR is formed within the light emitting region 13 not covered by the edge cover 51. The step-shaped trench 40TR includes the second trench portion 40TR2 formed within the first trench portion 40TR1.

Then, similar to the first embodiment, the EL element 40 is sealed by covering the EL element 40 with a sealing member such as, for example, a cover glass (not illustrated).

Light Emitting/Improved Light Extraction Action of Display Panel 2

The light emitting action and improved light extraction action of the sub pixel circuit portion 12 in the display panel 2 according to the present embodiment are the same as those of first embodiment. Thus, the description thereof is omitted in the present embodiment.

Advantageous Effects

As described above, the display panel 2 according to the present embodiment is the same as the display panel 2 according to the first embodiment, except in that the drive TFT-first electrode contact portion 24 is formed in each of the sub pixel circuit portions 12 by the first electrode 41 of the first trench portion 43TR1. The present embodiment, similar to the first and second embodiments, does not adopt a trench shape serving as walls and banks for reflecting light and formed in an island pattern partitioned in the horizontal direction by non-light-emitting regions as in PTL 1, but instead, the step-shaped trench 40TR is provided within the light emitting region 13. The step-shaped trench 40TR has a step shape at the inside and does not include an insulating layer between the first electrode 41 and the second electrode 43.

Accordingly, the present embodiment can also obtain similar advantageous effects to those of the first embodiment.

Figure 13B:
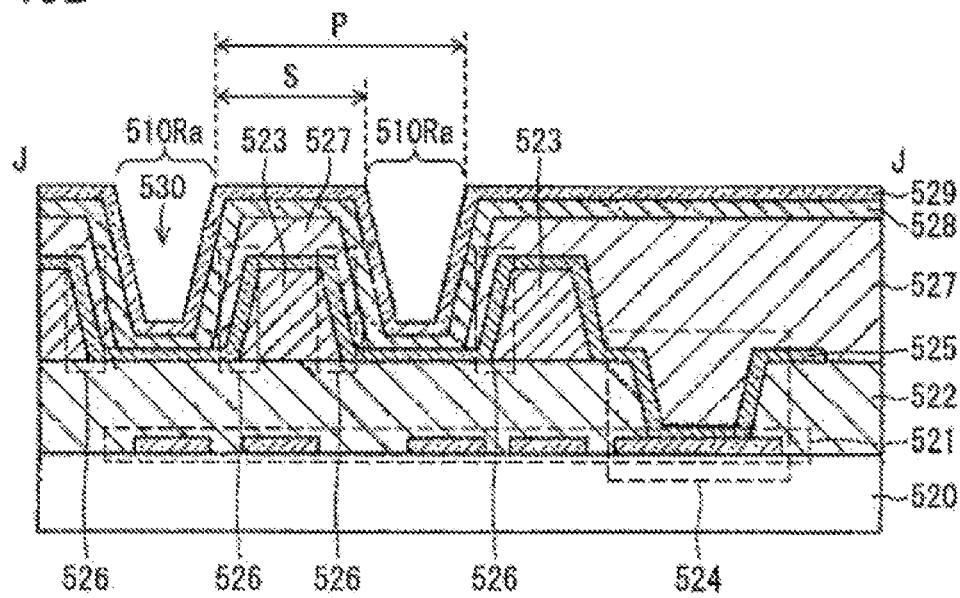
FIG. 13B is a cross-sectional view taken along line J-J of a sub pixel illustrated in FIG. 13A.

The present embodiment can obtain the following advantageous effects, in addition to advantageous effects similar to those of the first embodiment. A description follows regarding additional effects of the present embodiment, with reference to FIGS. 4A and 4B. FIG. 7A, and FIGS. 13A and 13B.

In the present embodiment, as described above, the drive TFT-first electrode contact portion 24 is provided in a sub trench area formed within the light emitting region. The present embodiment accordingly enables the effective size of a single sub pixel to be smaller than that of the sub pixel circuit portion 12 according to the first embodiment, as illustrated in FIG. 7A.

For example, as illustrated in FIG. 7A, take a length D1 as a length in the length direction (Y direction) of the sub pixel circuit portion 12 needed in the sub pixel circuit portion 12 according to the first embodiment for the drive TFT-first electrode contact portion 24. In cases in which D1 occupies ⅕ the overall length of the sub pixel circuit portions 12 in the Y direction (namely, the length dimension of the sub pixel circuit portions 12), the present embodiment can reduce the length dimension of the sub pixel circuit portions 12 by ⅕ that of the first embodiment. In such cases, the pixel size can be reduced by 20% lengthwise. Accordingly, the present embodiment can provide a display panel 2 having higher definition than that of the first embodiment.

For similar reasons, the present embodiment also enables a reduction in pixel size compared to the sub pixel circuit portion 12 illustrated in FIGS. 4A and 4B, and to the sub pixels 510R, 510G, and 510B of PTL 1 illustrated in FIGS. 13A and 13B. Accordingly, the present embodiment can provide a display panel 2 with higher definition than that of the conventional display panel.

As described in the first embodiment, the present technology enables a plurality of trench portions to be formed within the light emitting region 13, even in case of the display panel 2 with ultra-high definition. Accordingly, similar to the sub pixel circuit portion 12 illustrated in, for example, FIGS. 1A and 1B, the present embodiment also enables reflection points for light attenuated by the light propagation distance limit inside the sub pixels to be secured at, for example, four locations in the Y direction of the first electrode 41. Accordingly, the present embodiment enables about twice the light extraction effect to be obtained in the Y direction compared to cases in which there are, within the light emitting region 13, two trench portions provided side-by-side in the horizontal direction, as in, for example, the sub pixel circuit portion 12 illustrated in FIG. 4A. The present embodiment can also obtain about double the light extraction effect while reducing the sub pixel size by providing the drive TFT-first electrode contact portion 24 at the sub trench area as described above.

The present embodiment also enables production processes to be simplified because the present embodiment eliminates the need for forming in the interlayer insulating layer 31 a separate contact hole 32 to form the drive TFT-first electrode contact portion 24.

Modified Example 1

An example has been described in the present embodiment of a case in which the first electrode 41 is electrically connected to the drive TFT 23a at the first trench portion 41TR1 in the first electrode 41. However, the present embodiment is not limited thereto.

For example, in cases in which the sub pixel circuit portion 12 has a first sub trench and a second sub trench provided as sub trenches as in the second embodiment, the drive TFT-first electrode contact portion 24 may be provided in the second sub trench area.

Namely, in the second embodiment, a configuration may be made such that the drive TFT 23a is disposed within the third trench portion 34TR3 in the interlayer insulating layer 31, and the first electrode 41 is electrically connected to the drive TFT 23a at the third trench portion 41TR3 of the first electrode 41. In such cases, a light extraction effect of three times that of the sub pixel circuit portion 12 illustrated in FIG. 4B can be obtained with the sub pixel size being reduced.

In such cases, in the second embodiment, the drive TFT 23a is disposed in the region of the interlayer insulating layer 31 for forming the third trench portion 34TR3. The interlayer insulating layer 31 is etched, and the drive TFT 23a is exposed at the third trench portion 34TR3. As a result of the processes and the like, the drive TFT 23a is disposed within the third trench portion 34TR3, and the first electrode 41 is formed on the third trench portion 34TR3. As a result, the sub pixel circuit portion 12 can be formed.

Irrespective of the number of trenches (the number of trench steps) in the step-shaped trench 33TR of the interlayer insulating layer 31, the present embodiment enables the light extraction effect to be increased, while reducing the sub pixel size, due to forming the drive TFT 23a in a bottom portion of the step-shaped trench 33TR in the interlayer insulating layer 31.

Modified Example 2

The drive TFT-first electrode contact portion 24 configured as described above is preferably formed in a bottom portion of the step-shaped trench 33TR in the interlayer insulating layer 31 in order to allow the drive TFT-first electrode contact portion 24 to be formed simply within the light emitting region 13 and in order to achieve a simple configuration. However, the present embodiment is not limited thereto. The drive TFT-first electrode contact portion 24 may be disposed within the light emitting region 13 by separately forming a contact hole to form the drive TFT-first electrode contact portion 24 within the step-shaped trench 33TR. Namely, the drive TFT-first electrode contact portion 24 may be provided in a region of the step-shaped trench 33TR other than at the bottom portion of the step-shaped trench 33TR.

Modified Example 3

The sub pixel size can be reduced by providing the drive TFT-first electrode contact portion 24 in a trench portion as described above. Accordingly, the sub pixel size can also be reduced in the sub pixel circuit portion 12 illustrated in FIG. 4A by connecting the first electrode 41 to the drive TFT 23a at one trench portion out of the first trench portion 40TR1 and the second trench portion 40TR2 (namely, connecting the first electrode 41 and the drive TFT 23a together at one trench portion out of the first trench portion 40TR1 and the second trench portion 40TR2).

Similarly, the sub pixel size can also be reduced in the sub pixel circuit portion 12 illustrated in FIG. 4B by connecting the first electrode 41 to the drive TFT 23a at the first trench portion 40TR1.

Fourth Embodiment

A description follows regarding yet another embodiment of the present invention, with reference to FIGS. 9A and 9B to FIGS. 11A and 11B.

The present embodiment will be described by the differences between the present embodiment and the third embodiment. Components having the same function as the components described in the third embodiment are appended with the same reference signs, and the description thereof is omitted. Obviously, the same modifications as those of the first to the third embodiments may also be applied to the present embodiment.

Display Panel 2

Figure 9A:
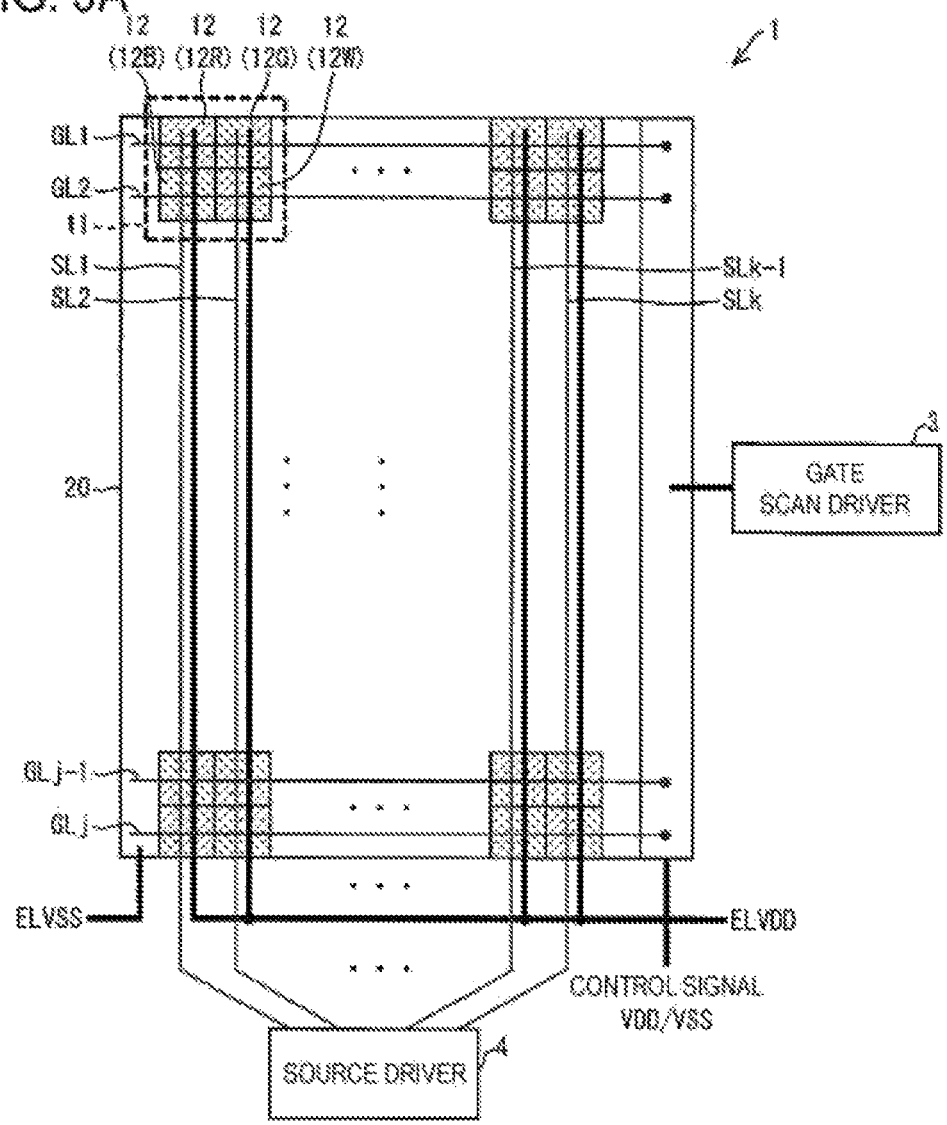
FIG. 9A is a plan view illustrating a schematic configuration of a display device according to a fourth embodiment of the present invention.
Figure 9B:
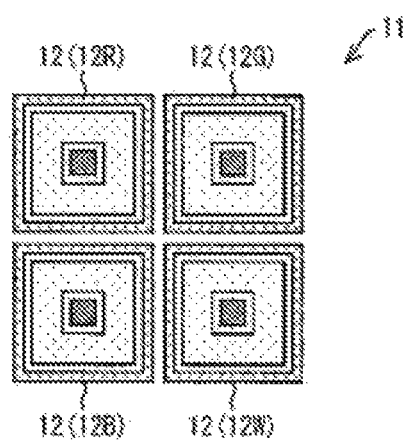
FIG. 9B is a plan view illustrating a schematic configuration of the pixel circuit portion illustrated in FIG. 9A.

FIG. 9A is a plan view (transparent view) illustrating a schematic configuration of a display device 1 according to the present embodiment. FIG. 9B is a plan view illustrating a schematic configuration of one of the pixel circuit portions 11 illustrated in FIG. 9B.

Figure 10A:
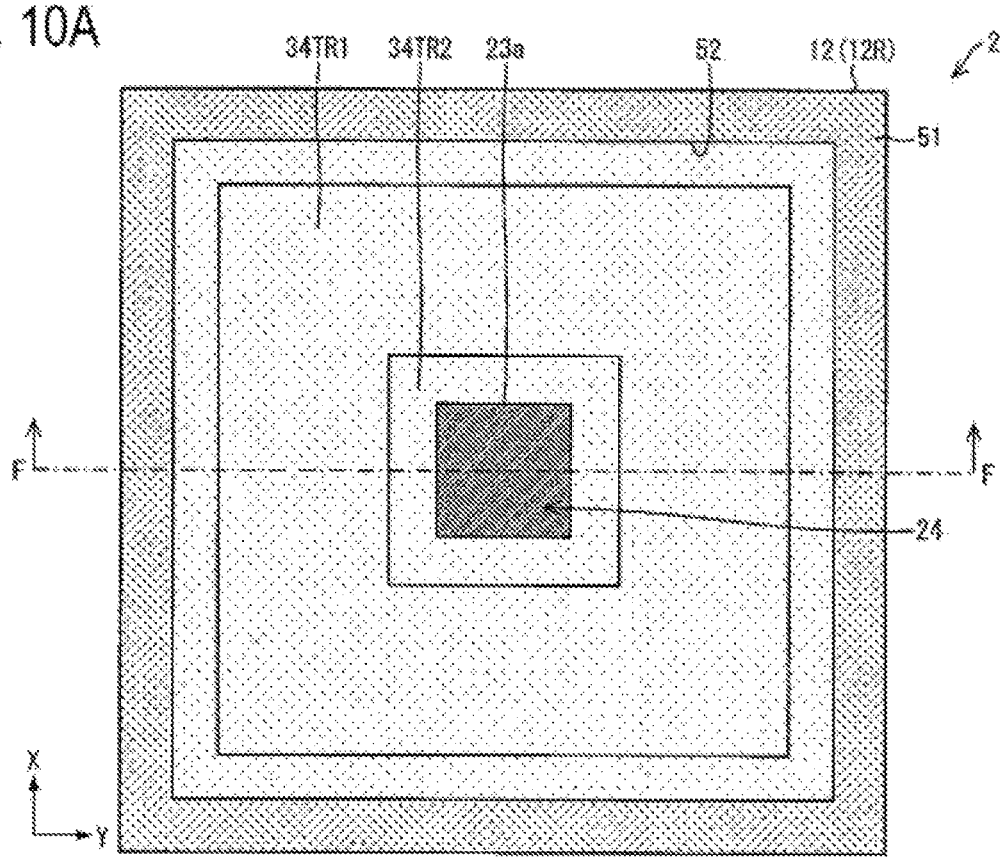
FIG. 10A is a plan view illustrating a schematic configuration of a sub pixel circuit portion of a display panel according to the fourth embodiment of the present invention.
Figure 10B:
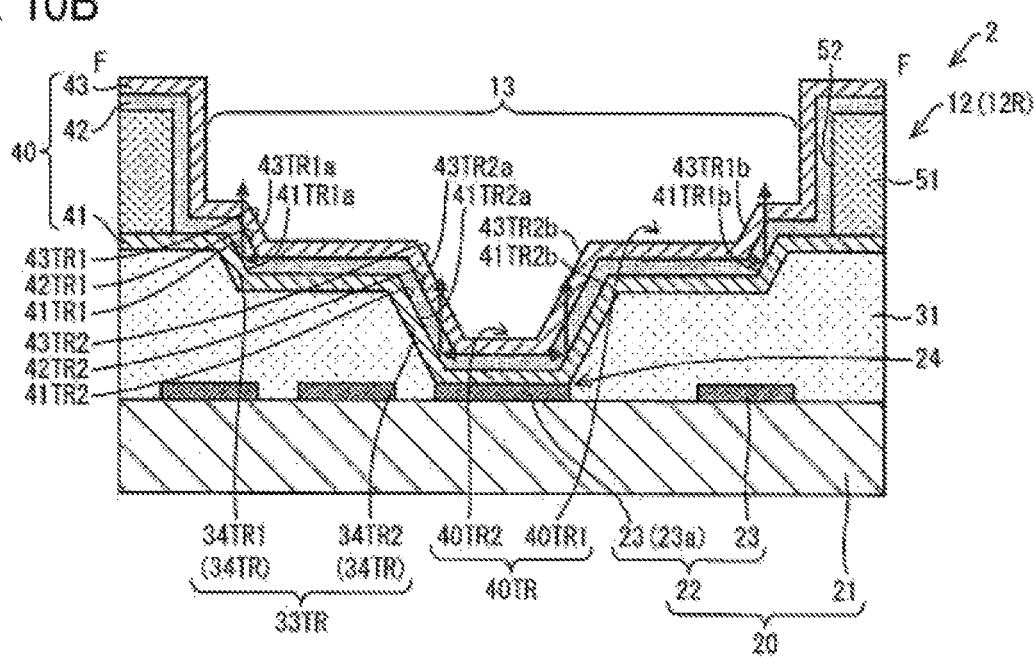
FIG. 10B is a cross-section arrow view taken along line F-F of the sub pixel circuit portion of the display panel illustrated in FIG. 10A.

FIG. 10A is a plan view (transparent view) illustrating a schematic configuration of a sub pixel circuit portion 12 of a display panel 2 according to the present embodiment. FIG. 10B is a cross-section arrow view taken along line F-F of the sub pixel circuit portion 12 of the display panel 2 illustrated in FIG. 10A.

The display panel 2 according to the present embodiment includes a plurality of (j) scanning lines GL1 to GLj and a plurality of (k) data lines SL1 to SLk orthogonal to the scanning lines GL1 to GLj, the plurality of scanning lines GL1 to GLj and the plurality of data lines SL1 to SLk being provided in a predetermined position. In the present embodiment, j and k are both integers of 2 or greater.

In the present embodiment, similar to the first to the third embodiments, when there is no particular need to discriminate, the scanning lines GL1 to GLj are referred to collectively as "scanning lines GL", and the data lines SL1 to SLk are referred to collectively as "data lines SL".

The display panel 2 includes a plurality of (j×k) sub pixel circuit portions 12 provided as respective sub pixels corresponding to intersection points in which the scanning lines GL (scanning lines GL1 to GLj) and the data lines SL (data lines SL1 to SLk) intersect.

In the present embodiment, the display panel 2 includes, as illustrated in FIGS. 9A and 9B, pixel circuit portions 11, each formed from the four sub pixel circuit portions 12 (light emitting elements, pixel circuits) for each respective color.

The four sub pixel circuit portions exhibit four different colors RGBW, respectively. The pixel circuit portions 11 are provided as pixels in a matrix pattern, as illustrated in FIG. 9A.

In the display panel 2 according to the present embodiment, as illustrated in FIGS. 9A and 9B and FIGS. 10A and 10B, a single pixel includes four sub pixels provided corresponding to intersections (each intersection point) between two adjacent scanning lines GL and two adjacent data lines SL. Each of the sub pixels is the same as those of the display panel 2 according to the third embodiment, except in that the sub pixel has a square shape.

Namely, the display panel 2 according to the present embodiment is the same as the display panel 2 according to the third embodiment, except in that, as illustrated in FIGS. 9A and 9B, the pixel circuit portions 11 configuring the pixels are each configured by four sub pixel circuit portions 12 (pixel circuits, light emitting elements), configured to exhibit different display colors and arranged above and below and to left and right in a four pane window shape.

In the present embodiment, due to the sub pixel circuit portions 12 being arranged in a four pane window shape, the R sub pixel circuit portions 12R and the G sub pixel circuit portions 12G are arranged side-by-side repeatedly in the extension direction of the odd numbered rows of the scanning lines GL, for example, and the B sub pixel circuit portions 12B and the W sub pixel circuit portions 12W are arranged side-by-side repeatedly in the extension direction of the even numbered rows of the scanning lines GL, for example. The R sub pixel circuit portions 12R and the B sub pixel circuit portions 12B are also arranged side-by-side repeatedly in the extension direction of odd numbered columns of the data lines SL, and the G sub pixel circuit portions 12G and the W sub pixel circuit portions 12W are arranged side-by-side repeatedly in the extension direction of even numbered columns of the data lines SL, for example.

In the present embodiment, due to the sub pixel circuit portions 12 being arranged in a four pane window shape in this manner, the number of scanning lines GL is twice the number of sub pixels in a single pixel. However, the number of data lines SL can be ½ the number of sub pixels in a single pixel.

In the present embodiment too, the sub pixel circuit portions 12 configuring the R sub pixels are also referred to as "R sub pixel circuit portions 12R", the sub pixel circuit portions 12 configuring the G sub pixels are also referred to as "G sub pixel circuit portions 12G", and the sub pixel circuit portions 12 configuring the B sub pixels are also referred to as "B sub pixel circuit portions 12B". The sub pixel circuit portions 12 configuring the W sub pixels are also referred to below as "W sub pixel circuit portions 12W".

As illustrated in FIG. 9B, the configuration is also basically the same in the R sub pixel circuit portions 12R, the G sub pixel circuit portions 12G, the B sub pixel circuit portions 12B, and the W sub pixel circuit portions 12W.

Thus, in the present embodiment too, FIGS. 10A and 10B are diagrams illustrating the configuration of the sub pixel circuit portion 12 by employing an R sub pixel circuit portion 12R as an example of the sub pixel circuit portion 12.

In the present embodiment too, as illustrated in FIGS. 10A and 10B and similar to the third embodiment, a drive TFT first electrode contact portion 24 is provided in a sub trench area (sub trench portion) in each of the sub pixel circuit portions 12.

Accordingly, the sub pixel circuit portion 12 according to the present embodiment is the same as the sub pixel circuit portion 12 according to the third embodiment except in that the sub pixel circuit portion 12 has a square shape as described above.

Method for Producing Display Panel 2

The method for producing the display panel 2 according to the present embodiment is the same as that of the third embodiment, except in that the sub pixel circuit portions 12 are disposed in a four pane window shape as described above.

Therefore, although the sub pixel circuit portion 12 according to the present embodiment has a square shape in plan view, the cross-sectional structures of the sub pixel circuit portions 12 in each of the production processes are the same as those of FIGS. 8A to 8I. The sub pixel circuit portion 12 according to the present embodiment can also be produced by a similar method to that of the third embodiment, except in that in the process for forming the EL layer 42, light emitting layers for each of the colors RGBW are formed by selectively coating by an RGBW selective coating method, instead of performing RGB selective coating.

Accordingly, in the present embodiment, an illustration of the cross-sectional structures of the sub pixel circuit portions 12 in each of the production processes and a description thereof are omitted, and the description of FIGS. 8A to 8I should be substituted for the description of the method of producing the display panel 2 according to the present embodiment.

Advantageous Effects

As described above, similar to the first embodiment, the present embodiment also does not adopt a trench shape serving as walls and banks for reflecting light and formed in an island pattern partitioned in the horizontal direction by non-light-emitting regions as in PTL 1, but instead, the step-shaped trench 40TR is provided within the light emitting region 13. The step-shaped trench 40TR has a step shape at the inside and does not include an insulating layer between the first electrode 41 and the second electrode 43.

Accordingly, the present embodiment can also obtain similar advantageous effects to those of the first embodiment.

Modified Example 1

Schematic Configuration of Display Panel 2

Figure 11A:
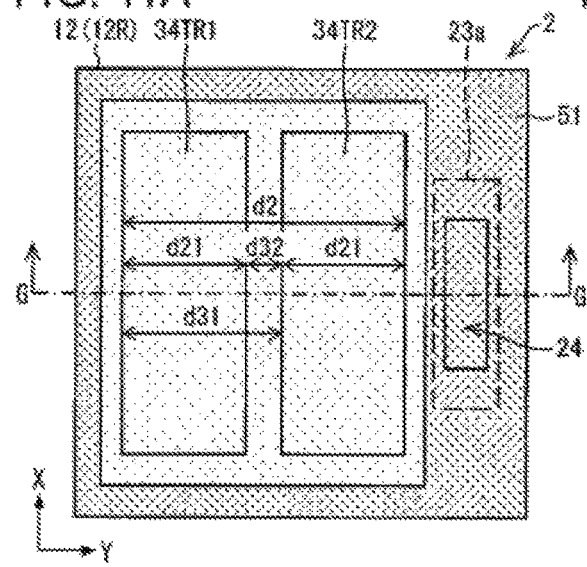
FIG. 11A is a diagram illustrating, arranged above and below, a plan view illustrating a schematic configuration of a sub pixel circuit portion according to a modified example 1 of the fourth embodiment of the present invention, and a cross-section arrow view taken along line G-G of the sub pixel circuit portion illustrated in the plan view.
Figure 11A:
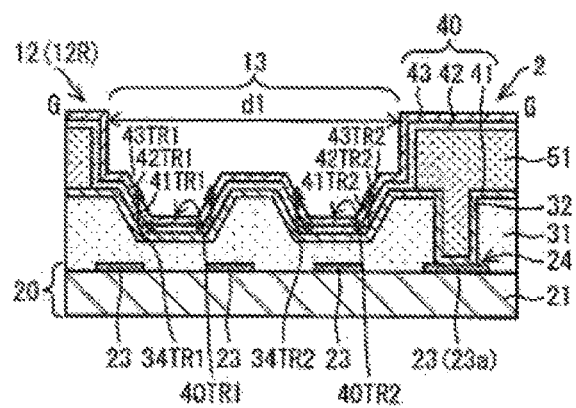
Figure 11B:
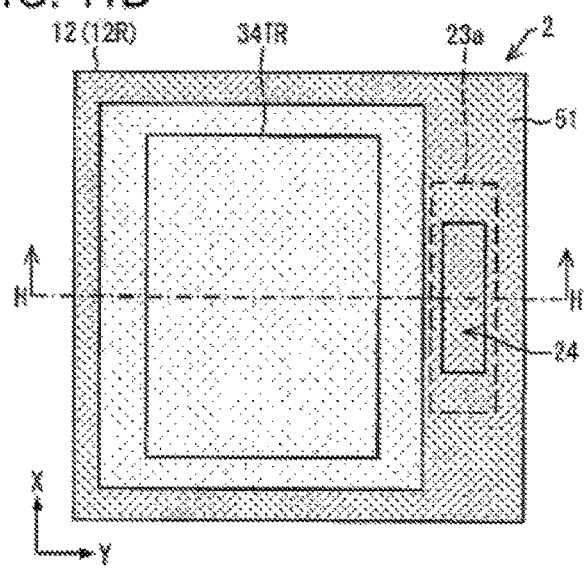
FIG. 11B is a diagram illustrating, arranged above and below, a plan view illustrating a schematic configuration of a sub pixel circuit portion according to a modified example 2 of the fourth embodiment of the present invention, and a cross-section arrow view taken along line H-H of the sub pixel circuit portion illustrated in the plan view.
Figure 11B:
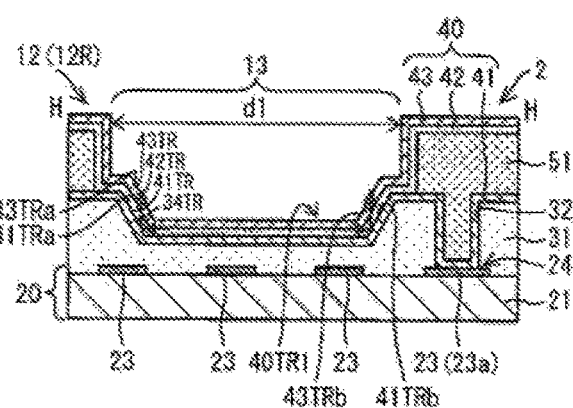

FIG. 11A is a diagram illustrating, arranged above and below, a plan view (transparent view) illustrating a schematic configuration of a sub pixel circuit portion 12 according to the present modified example and a cross-section arrow view taken along line G-G of the sub pixel circuit portion illustrated in the plan view. In FIG. 11A, the plan view is illustrated at the top of the diagram, and the cross-sectional view is illustrated at the bottom of the diagram. In FIGS. 11A and 11B, plan view is illustrated at the top of the diagram, and cross-sectional view is illustrated at the bottom of the diagram. For ease of illustration, the plan view (transparent view) in FIG. 11A also illustrates only the first trench portion 34TR1 and the second trench portion 34TR2 as trenches in the interlayer insulating layer 31.

Thus, in cases in which the sub pixel circuit portions 12 are disposed in a four pane window shape too, the EL element 40 may include, within the light emitting region 13, at least one trench having an indented shape and include the first electrode 41, the EL layer 42, and the second electrode 43, these being layered in this order and in contact with each other.

FIG. 11A illustrates, as an example of the present modified example, a first trench portion 34TR1 and a second trench portion 34TR2 having the same size as each other and formed side-by-side in the interlayer insulating layer 31 to give a trench pitch of d31 and an inter-trench space of d32.

The display panel 2 according to the present modified example has the same configuration as that of the display panel 2 illustrated in FIGS. 1A and 1B and FIG. 2, except in that, within the light emitting region 13 of each of the sub pixel circuit portions 12, a first trench portion 40TR1 and a second trench portion 40TR2 are provided side-by-side in the horizontal direction by forming the first trench portion 34TR1 and the second trench portion 34TR2.

Thereby, the display panel 2 according to the present modified example has the same configuration as that of the display panel 2 illustrated in FIGS. 9A and 9B and in FIGS. 10A and 10B, except in that, within the light emitting region 13 of each of the sub pixel circuit portions 12, the first trench portion 40TR1 and the second trench portion 40TR2 are provided side-by-side in the horizontal direction by forming the first trench portion 34TR1 and the second trench portion 34TR2.

Method for Producing Display Panel 2

The display panel 2 according to the present modified example can be produced by a similar method to that of the display panel 2 illustrated in FIGS. 9A and 9B and FIGS. 10A and 10B, except in that the first trench portion 40TR1 and the second trench portion 40TR2 are formed in the horizontal direction and the drive TFT-first electrode contact portion 24 is provided outside the light emitting region 13.

In other words, the method for producing the display panel 2 according to the present modified example is the same as that of the modified example 1 in the first embodiment, except in that the sub pixel circuit portions 12 are disposed in a four pane window shape as described above. Accordingly, a description thereof is omitted.

Advantageous Effects

In the present modified example too, the first trench portion 40TR1 and the second trench portion 40TR2 each include the first electrode 41, the EL layer 42, and the second electrode 43, these being layered in this order and in contact with each other, and each does not include a partition (insulating layer) on a reflection structure, like that of the trench 530 in the sub pixel 510R of PTL 1.

The display panel 2 according to the present modified example is the same as that of the modified example 1 of the first embodiment, except in that the sub pixel circuit portions 12 are disposed in a four pane window shape. Accordingly, the present modified example can obtain similar advantageous effects to those of the modified example 1 of the first embodiment.

Modified Example 2

FIG. 11B is a diagram illustrating, arranged above and below, a plan view (transparent view) illustrating a schematic configuration of a sub pixel circuit portion 12 according to the present modified example 2 and a cross-section arrow view taken along line H-H of the sub pixel circuit portion illustrated in the plan view. In FIG. 11B also, the plan view is illustrated at the top of the diagram, and the cross-sectional view is illustrated at the bottom of the diagram. Moreover, in FIG. 11B too, for ease of illustration, only a trench portion 34TR in an interlayer insulating layer 31 is illustrated as a trench in a plan view (transparent view).

The display panel 2 according to the present modified example is the same as that of the modified example 2 of the first embodiment, except in that the sub pixel circuit portions 12 are disposed in a four pane window shape. The present modified example can accordingly obtain similar advantageous effects to those of the modified example 1 of the first embodiment.

The method for producing the display panel 2 according to the present modified example is the same as that of modified example 2 of the first embodiment, except in that the sub pixel circuit portions 12 are disposed in a four pane window shape as described above.

Thus, the description thereof is omitted in the present modified example. A description follows regarding the advantages of the display panel 2 illustrated in FIGS. 10A and 10B over the modified examples 1 and 2 described above.

Advantages of Display Panel 2 Illustrated in FIGS. 10A and 10B Over Modified Examples 1 and 2 of Present Embodiment As stated above, as display panels become higher in definition, the size of a single pixel becomes smaller the higher the definition. Thus, even in cases in which the sub pixel circuit portions 12 are formed in a square shape as illustrated in FIGS. 11A and 11B, it might be difficult to secure the inter-trench space d32 when, as the conventional display panel, trench portions of the same size as each other are formed side-by-side at a predetermined trench pitch (trench pitch d31). In such cases, similar to the sub pixel circuit portions 12 illustrated in FIGS. 4A and 4B, it might be difficult to form the first trench portion 34TR1 and the second trench portion 34TR2 isolated from each other.

However, the present embodiment, similar to the first to third embodiments, does not adopt a trench shape serving as walls and banks for reflecting light and formed in an island pattern partitioned in the horizontal direction by non-light-emitting regions as in PTL 1, but instead, a step-shaped trench is provided within the light emitting region 13, with the step-shaped trench having a step shape at the inside. Thus, in the display panel 2 illustrated in FIGS. 10A and 10B too, similar advantageous effects to those of the display panel 2 illustrated in FIGS. 1A and 1B can be obtained.

Moreover, similar to the third embodiment, the display panel 2 illustrated in FIGS. 10A and 10B includes a drive TFT first electrode contact portion 24 provided in a sub trench area (sub trench portion) in each of the sub pixel circuit portions 12. Namely, in the display panel 2 illustrated in FIGS. 10A and 10B, the drive TFT 23a is disposed within the second trench portion 34TR2 of the interlayer insulating layer 31, and the first electrode 41 is electrically connected to the drive TFT 23a at the second trench portion 41TR2 of the first electrode 41.

Therefore, in the display panel 2 illustrated in FIGS. 10A and 10B, in cases in which a single pixel is configured by four sub pixels, the pixel size can be reduced compared to the examples illustrated in FIGS. 11A and 11B for a similar reason to that of the third embodiment. This enables the display panel 2 of even higher definition to be produced. The display panel 2 illustrated in FIGS. 10A and 10B thereby enables similar advantageous effects to those of the third embodiment to be obtained, in addition to similar advantageous effects to those of the first embodiment.

Fifth Embodiment

Figure 12A:
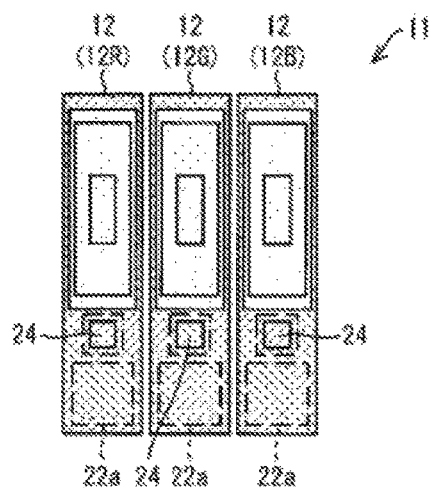
FIG. 12A is a plan view illustrating a schematic configuration of a pixel circuit portion of a display panel according to a fifth embodiment of the present invention.
Figure 12B:
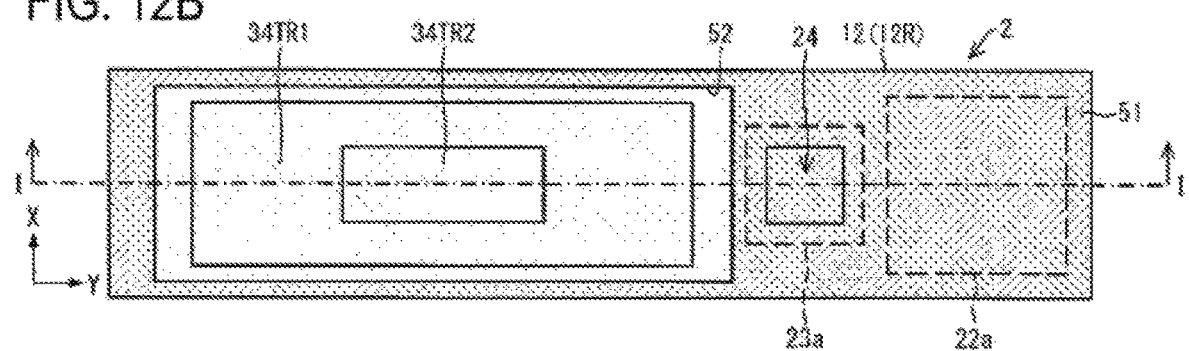
FIG. 12B is a plan view illustrating a schematic configuration of a sub pixel circuit portion of a display panel according to the fifth embodiment of the present invention.
Figure 12C:
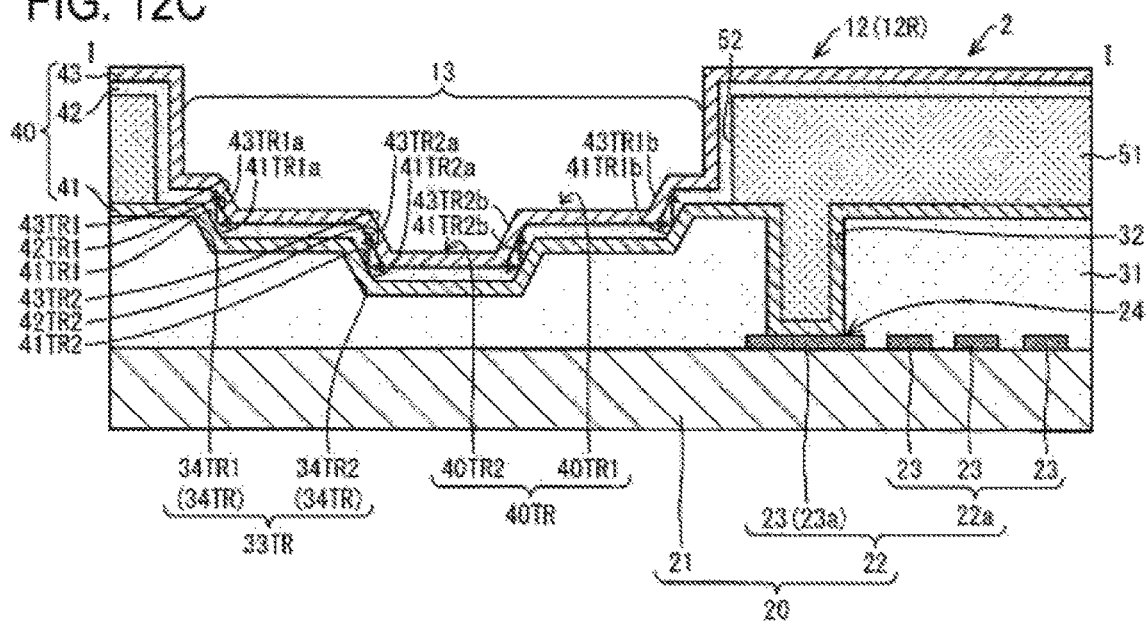
FIG. 12C is a cross-section arrow view taken along line I-I of the sub pixel circuit portion of the display panel illustrated in FIG. 12B.

A description follows regarding another embodiment of the present invention, with reference to FIGS. 12A to 12C.

The present embodiment will be described by the differences between the present embodiment and the first embodiment, and components having the same function as the components described in the first embodiment are appended with the same reference signs, and the description thereof is omitted. Obviously the same modifications as those of the first to fourth embodiments may also be applied to the present embodiment.

Display Panel 2

FIG. 12A is a plan view (transparent view) illustrating a schematic configuration of a pixel circuit portion 11 of a display panel 2 according to the present embodiment. FIG. 12B is a plan view (transparent view) illustrating a schematic configuration of a sub pixel circuit portion 12 of a display panel 2 according to the present embodiment. FIG. 12C is a cross-section arrow view taken along line I-I of the sub pixel circuit portion 12 of the display panel 2 illustrated in FIG. 12B. In the present embodiment too, as illustrated in FIG. 12A, the configuration is basically the same in the R sub pixel circuit portions 12R, the G sub pixel circuit portions 12C and the B sub pixel circuit portions 12B. Thus, in the present embodiment too, FIGS. 12B and 12C are diagrams illustrating a configuration of the sub pixel circuit portion 12 by employing an R sub pixel circuit portion 12R as an example of the sub pixel circuit portion 12.

In the first to fourth embodiments, an example has been described for a case in which the display device 1 is a top-emitting display device including a top-emitting display panel 2. In contrast thereto, the present embodiment describes a case in which the display device 1 is a bottom-emitting display device including a bottom-emitting display panel 2.

In the present embodiment too, a description follows regarding an example of a case in which, similar to the first to fourth embodiments, a first electrode 41 is an anode (patterned anode), and a second electrode 43 is a cathode (common cathode). However, the present embodiment is not limited thereto.

A description follows regarding differences from the first embodiment.

Semiconductor Substrate 20

The semiconductor substrate 20 employed in the present embodiment is the same as the semiconductor substrate 20 employed in the first embodiment, except in that, due to light being extracted from the back face side of the insulating substrate 21, a TFT circuit portion 22 is provided in a region other than a light emitting region 13 (namely, in a non-light-emitting region outside the light emitting region 13), as illustrated in FIGS. 12A to 12C.

More specifically, the present embodiment has the same semiconductor substrate 20 as that employed in the first embodiment except in that, as illustrated in FIGS. 12A to 12C, in the TFT circuit portion 22, a TFT circuit portion 22a formed from TFTs 23 that are not a drive TFT 23 is provided on a side opposite to the light emitting region 13 side of the drive TFT-first electrode contact portion 24.

As stated above, the insulating substrate 21 employed when the display panel 2 is a top-emitting display panel is not limited to a specific substrate. However, when the display panel 2 is a bottom-emitting display panel, as in the present embodiment, a transparent or semi-transparent substrate material, such as a glass substrate, is employed for the insulating substrate 21.

First Electrode 41 and Second Electrode 43

Moreover, when the display panel 2 is a bottom-emitting display panel, to reflect light reflected at the interfaces and guided within the EL layer 42 and to extract the light from the semiconductor substrate 20 side, the second electrode 43 is preferably formed from a reflective electrode material such as a metal or alloy having reflectivity, and the first electrode 41 is preferably formed from a transparent electrode material which is transparent or semi-transparent.

Electrode materials employed in the first electrode 41 and the second electrode 43, such as reflective electrode materials and transparent electrode materials, are the same as those of the examples given in the first embodiment. In the present embodiment too, the first electrode 41 and the second electrode 43 may also be a single layer formed from a single electrode material, or may have a layered structure formed from a plurality of electrode materials.

Thus, when the EL element 40 is a bottom-emitting EL element as described above, the second electrode 43 may have a layered structure including a reflective electrode formed from a reflective electrode material and a transparent electrode formed from a transparent electrode material.

Method for Producing Display Panel 2

A method for producing the display panel 2 according to the present embodiment is the same as that of the first embodiment, except in that, as described above, the position for forming the TFT circuit portion 22a made from the TFTs 23 that are not a drive TFT 23 is different from that of the first embodiment. Thus, the description thereof is omitted in the present embodiment.

Light Emitting/Improved Light Extraction Action of Display Panel 2

The light emitting action and the improved light extraction action of the sub pixel circuit portions 12 in the display panel 2 of the present embodiment are the same as those of the first embodiment. Thus, the description thereof is omitted in the present embodiment.

Advantageous Effects

In the present embodiment, similar advantageous effects to those of the first embodiment can be obtained, except in that a direction in which the light is extracted from the EL element 40 is different from that of the EL element 40 of the first embodiment. Thus, the present embodiment enables the provision of the EL element 40, the sub pixel circuit portion 12, the pixel circuit portion 11, the display panel 2, and the display device 1 configured as respective bottom emission types and capable of increasing the light extraction efficiency even in an ultra-high definition panel.

In the present embodiment, as a modified example to the first embodiment and as illustrated in FIGS. 12A to 12C, an example has been described for a case in which the display panel illustrated in FIGS. 1A and 18B is made as a bottom-emitting display panel. However, the present embodiment is not limited thereto, and obviously, as a modified example to the first embodiment, the display panel illustrated in FIG. 4A or 4B may, for example, be made as a bottom-emitting display panel. As stated above, similar modifications are possible for the second to fourth embodiments, and obviously, the display panels according to any of the second to fourth embodiments may also be made as a bottom-emitting display panel.

CONCLUSION

The light emitting element (sub pixel circuit portion 12) according to a first aspect of the present invention includes a substrate (the insulating substrate 21), an interlayer insulating layer 31 on the substrate, and a first electrode 41, an electroluminescent layer (the EL layer 42) including at least a light emitting layer, and a second electrode 43 layered in this order on the interlayer insulating layer 31. One electrode out of the first electrode 41 and the second electrode 43 includes a reflective electrode, and at least one trench having an indented shape (reflective trench, for example, the step-shaped trench 40TR, the first trench portion 40TR1, the second trench portion 40TR2, the third trench portion 40TR3) is provided within a single light emitting region 13. This trench includes the first electrode 41, the electroluminescent layer, and the second electrode 43, the first electrode 41, the electroluminescent layer, and the second electrode 43 being layered in this order and in contact with each other.

As described above, the display device of PTL 1 has a configuration in which an insulating film is provided within the trenches 530. Accordingly, superfluous reflection occurs in which a portion of the light generated in the organic EL layer 528 may be reflected by an interface between the first electrode 525 and the insulating layer (the partition 527) forming the reflection structure 526 or the like, and propagates within the insulating layer without being externally extracted.

In contrast thereto, the trench of the light emitting element according to the present aspect includes the first electrode 41, the EL layer 42, and the second electrode 43, these being layered in this order and in contact with each other, and does not include a partition (insulating layer) on a reflection structure, like that of the trench 530 in the sub pixel 510R of PTL 1.

Thus, the light emitting element according to the present aspect reflects light from the light emitting region 13 using the reflective electrode without interposing an insulating layer, and so superfluous reflection like that in PTL 1 does not occur. Thus, light generated in the EL layer 42 (light emitting layer) can be externally extracted with good efficiency.

Moreover, in PTL 1, as illustrated in FIG. 13B, because the partitions 527 are disposed on the first electrode 525, the organic EL layer 528 above the reflection structures 526 does not emit light (current does not flow). Thus, in PTL 1, The light emitting layer of the organic EL layer 528 on the side faces of the trenches 530 does not emit light.

Moreover, in PTL 1, the surface area of the light emitting regions within each of the sub pixels 510R, 510G, and 510B is defined by the size in plan view of openings, each of the openings being defined by two partitions 527, in other words, by the surface area in plan view of the trenches 530 within each of the sub pixels 510R. 510G, and 510B.

In contrast thereto, in the light emitting element of the present aspect, the side faces of the trench portion can also be employed as light emitting regions. In the light emitting element according to the present aspect, the light emitting region is also not partitioned by non-light-emitting regions. Hence, the above configuration enables the light emitting region to be utilized effectively.

The above configuration accordingly enables the light emitting region (light emitting surface area) to be made larger than that of PTL 1, enabling the current density required for light emission to be lowered. Thus, the above configuration enables the lifespan of the light emitting element, and moreover the lifespan of the display panel 2 and the display device 1 including the light emitting elements, to be extended.

The above configuration accordingly enables the provision of the light emitting element capable of externally extracting light generated in the light emitting layer with good efficiency.

The light emitting element (sub pixel circuit portion 12) according to the second aspect of the present invention may include the plurality of trenches provided within the light emitting region 13 of the first aspect.

As stated above, in PTL 1, the surface area of the light emitting region within each of the sub pixels 510R, 510G, and 510B is defined by the size in plan view of openings, each of the openings being defined by two partitions 527, in other words, by the surface area in plan view of the trenches 530 within each of the sub pixels 510R. 510G, and 510B.

Thus, the higher the definition of the display panel in an organic EL display device, the smaller the effective surface area of a single sub pixel. It is also difficult for the plurality of trenches to be formed in a single sub pixel.

In contrast thereto, the light emitting element according to the present aspect has a configuration in which the plurality of trenches are provided within the light emitting region 13, namely a single light emitting region 13, and does not have a configuration in which the light emitting region is partitioned into a plurality of regions by non-light-emitting regions as in PTL 1. Accordingly, the above configuration enables effective utilization of the light emitting region even in cases in which the plurality of trenches are provided as described above. The light emitting element according to the present aspect enables both the side walls of each of the trenches and the inter-trench space to be used as the light emitting region.

The light emitting element according to the present aspect enables the inter-trench space to be made smaller than that of PTL 1 because partitions 527 are not provided within each of light emitting regions 510Ra nor between each of the light emitting regions 510Ra as in PTL 1, enabling the inter-trench space to be secured more easily. Thus, compared to in PTL 1, the light emitting element according to the present aspect does not require such high accuracy alignment technology as that in PTL 1 (and in particular, high accuracy alignment technology in the trench arrangement direction). Accordingly, the above configuration does not require such a high accuracy grade mask as in PTL 1, enabling production cost to be lowered.

The light emitting element (the sub pixel circuit portion 12) according to the third aspect of the present invention may have a configuration in which, in the second aspect, the plurality of trenches are formed as step-shaped trenches (for example, the step-shaped trench 40TR) including, in plan view within a single trench (for example, the first trench portion 41TR1), at least one sub trench (for example, the second trench portion 43TR2, the third trench portion 43TR3) having a size smaller than that of the single trench.

Namely, the present aspect does not adopt a trench shape serving as walls and banks for reflecting light and formed in an island pattern partitioned in the horizontal direction by non-light-emitting regions as in PTL 1, but instead, a step-shaped trench may be provided within the light emitting region 13, the step-shaped trench including at least one sub trench provided within a main trench.

For example, the light emitting element according to the present aspect may include a step-shaped trench having a step shape at the inside in which at least one sub trench having a size smaller than that of the first trench portion 41TR1 (namely, the second trench portion 42TR1 having a length-and-width size smaller than that of the first trench portion 41TR1) is provided within a single trench, for example, within the first trench portion 41TR serving as a main trench.

Alternatively, the light emitting element according to the present aspect may include step-shaped trenches having a step shape at the inside in which, within a trench provided in the horizontal direction, for example, within at least one trench out of the first trench portion 41TR1 and the second trench portion 42TR1, at least one trench having a size smaller than that of the first trench portion 41TR1 or the first trench portion 42TR1 is provided. Namely, a plurality of main trenches may be provided in the horizontal direction.

In the conventional technology of PTL 1, for example, as electronic devices in which light emitting elements are mounted, such as display panels, become higher in definition, due to the plurality of trenches being formed in the length direction (Y direction) of the light emitting region of the light emitting element, an inter-trench space limit (a state in which two trenches are not formable within a light emitting region) is reached, and the design shape is not achievable.

However, in the light emitting element according to the present aspect, it is sufficient for example, to merely maintain a relationship in which at least one trench having a size smaller than that of a single trench is provided within the single trench, such as a main trench-to-sub trench relationship (namely, a relationship in which at least one sub trench is formed within a main trench), and conventional high accuracy mask alignment in the Y direction is not required. Accordingly, the structure of the light emitting element is a structure appropriate to electronic devices such as high definition display panels, and display devices.

In conventional technology, when only one trench is formable within each of the light emitting regions due to the inter-trench space limit, light guided within a light emitting unit can only be reflected at two locations, these being the left and right side walls of the single trench. However, in the above configuration, at least one trench having a size smaller than that of a single trench is formed within the single trench. Forming is easier than forming a plurality of (for example, two) trenches side-by-side in the length (Y direction). As a result, the plurality of trenches can be formed within the light emitting region even at high definition.

Thus, the light emitting element according to the present aspect enables guided light (attenuated light), which is being attenuated by the light propagation distance limit within the light emitting unit and is not being externally extracted, to at least be reflected by each of the trench edges at the left and right of the main trench and the sub trench, and to be externally extracted. Namely, the light emitting element according to the present aspect includes for example, reflective walls present at least four locations in each of the length direction (Y direction) and width direction (X direction) of each of the light emitting regions, and the attenuated light can be reflected and externally extracted by these reflective walls.

Accordingly, the above configuration enables light extraction efficiency to be improved even in high definition panels, and enables the provision of the light emitting element capable of extending a lifespan compared to the conventional light emitting element.

The light emitting element (sub pixel circuit portion 12) according to the fourth aspect of the present invention may have a configuration in which, in the second or third aspect, a plurality of trenches are provided side-by-side in plan view within the light emitting region 13.

As stated above, in PTL 1, the surface area of light emitting regions within each of the sub pixels 510R, 510G, and 510B is defined by the size in plan view of openings, each of the openings being defined by two partitions 527, in other words, by the surface area in plan view of the trenches 530 within each of the sub pixels 510R, 510G, and 510B.

Thus, the higher the definition of the display panel in an organic EL display device, the smaller the effective surface area of a single sub pixel. It is also difficult for the plurality of trenches to be formed in a single sub pixel.

However, the light emitting element according to the present aspect has a configuration in which the plurality of trenches are provided side-by-side in plan view within the light emitting region 13, namely within a single light emitting region 13, and does not have a configuration in which the light emitting region is partitioned into a plurality of light emitting regions by non-light-emitting regions as in PTL 1. Accordingly, the above configuration enables the light emitting region to be utilized effectively even in cases in which the plurality of trenches are provided side-by-side in the horizontal direction as described above. The light emitting element according to the present aspect enables both the side walls of each of the trenches and the inter-trench space to be used as the light emitting region.

The light emitting element according to the present aspect enables the inter-trench space to be made smaller than that of PTL 1 because partitions 527 are not provided within each of light emitting regions 510Ra nor between each of the light emitting regions 510Ra as in PT, 1, enabling the inter-trench space to be secured more easily. Thus, compared to in PTL 1, the light emitting element according to the present aspect does not require such high accuracy alignment technology (and in particular, high accuracy alignment technology in the trench arrangement direction) as that in PTL 1. Accordingly, the above configuration does not require such a high accuracy grade mask as in PTL 1, enabling production cost to be lowered.

A light emitting element (sub pixel circuit portion 12) according to a fifth aspect of the present invention may have a configuration in which, in any one of the first to fourth aspects, the interlayer insulating layer 31 includes within the light emitting region 13, a trench (the insulating trench, for example, trench portion 34TR, the first trench portion 34TR1, the second trench portion 34TR2, the third trench portion 34TR3, the step-shaped trench 33TR) having a shape corresponding to the trench; and the first electrode 41, the electroluminescent layer (the EL layer 42), and the second electrode 43 are layered on the interlayer insulating layer 31 within the light emitting region 13 along the trench in the interlayer insulating layer 31.

The above configuration enables easy forming of the above light emitting element including at least one reflective trench having an indented shape and provided within a single light emitting region 13.

A light emitting element (sub pixel circuit portion 12) according to a sixth aspect of the present invention may have a configuration in which, in the third aspect, the sub trench includes a first sub trench (for example, the second trench portion 41TR2, the second trench portion 43TR2) and a second sub trench (for example, the third trench portion 41TR3, the third trench portion 43TR3), and the second sub trench is formed within the first sub trench.

The greater the number of reflective walls of the trenches, the more the light extraction effect can be increased. Accordingly, the above configuration is able to increase the light extraction effect.

A light emitting element (sub pixel circuit portion 12) according to a seventh aspect of the present invention may have a configuration in which, in any one of the first to sixth aspects, the first electrode 41 includes the reflective electrode, and light reflected by the reflective electrode is externally extracted from the second electrode 43 side.

The above configuration enables provision of a top-emitting light emitting element capable of increasing the light extraction efficiency even in high definition panels and enables a lifespan of the light emitting element to be extended from that of the conventional light emitting element.

A light emitting element (sub pixel circuit portion 12) according to an eighth aspect of the present invention may have a configuration in which, in any one of the first to seventh aspects, a drive circuit portion (TFT circuit portion 22) is provided on the substrate (insulating substrate 21), the drive circuit portion (TFT circuit portion 22) includes a drive transistor (drive TFT 23a) connected to the first electrode 41 and configured to supply a drive current to an electroluminescent element (EL element 40) configured by the first electrode 41, the electroluminescent layer (the EL layer 42), and the second electrode 43. In such cases, the first electrode 41 may be connected to the drive transistor at one trench out of the at least one trench.

The above configuration enables a non-light-emitting region for forming the drive TFT-first electrode contact portion 24 to be eliminated i.e. the above configuration can eliminate the need for providing a separate region (the drive TFT-first electrode contact portion 24) for connecting the first electrode 41 and the drive transistor together in a non-light-emitting region outside the light emitting region 13. Accordingly, the present aspect enables the effective size of the light emitting element to be made smaller than in cases in which the drive TFT-first electrode contact portion 24 is provided in a non-light-emitting region outside the light emitting region 13.

The above configuration enables simplification of production processes because the above configuration eliminates the need for forming a separate contact hole 32 in the interlayer insulating layer 31 to form the drive TFT-first electrode contact portion 24.

A light emitting element (sub pixel circuit portion 12) according to a ninth aspect of the present invention may have a configuration in which, in the eighth aspect, the second electrode 43 includes the reflective electrode, the drive circuit portion (TFT circuit portion 22) is provided in a non-light-emitting region outside the light emitting region 13, and light reflected by the reflective electrode is externally extracted from the first electrode 41 side.

The above configuration enables provision of a bottom-emitting light emitting element capable of increasing the light extraction efficiency even in high definition panels and enables a lifespan of the light emitting element to be extended from that of the conventional light emitting element.

A display panel 2 according to a tenth aspect of the present invention may have a configuration in which a plurality of the light emitting elements according to any one of the first to ninth aspects are arranged.

The above configuration enables provision of a display panel 2 capable of externally extracting light generated in the light emitting layer with good efficiency.

The display panel 2 according to an eleventh aspect of the present invention may have a configuration in which, in the tenth aspect, pixels (the pixel circuit portions 11), each including the plurality of sub pixels (the sub pixel circuit portion 12), are arranged in a matrix pattern, and each of the sub pixels is configured by the light emitting element (the sub pixel circuit portion 12).

The above configuration enables provision of an active matrix display panel 2 capable of externally extracting light generated in the light emitting layer with good efficiency.

A display panel 2 according to a twelfth aspect of the present invention, in the eleventh aspect, may include a plurality of scanning lines GL and a plurality of data lines SL. The pixel thereof (the pixel circuit portions 11) may include four sub pixels (the sub pixel circuit portion 12) provided corresponding to respective intersection points in which two adjacent lines of the scanning lines and two adjacent lines of the data lines intersect.

The above configuration enables provision of an active matrix display panel 2 having sub pixels arranged above and below and to left and right in a four pane window shape, and capable of externally extracting light generated in the light emitting layer with good efficiency.

Due to the sub pixels being arranged in a four pane window shape as described above, the above configuration has twice as many scanning lines GL as the number of sub pixels in a single pixel and enables the number of data lines SL to be ½ the number of sub pixels in a single pixel.

A display device 1 according to a thirteenth aspect of the present invention includes the display panel 2 according to any one of the tenth to twelfth aspects.

Accordingly, the above configuration enables provision of the display device 1 capable of externally extracting light generated in the light emitting layer with good efficiency.

An electronic device (for example, the display panel 2, the display device 1, an illumination device, or the like) according to a fourteenth aspect of the present invention includes the light emitting element (sub pixel circuit portion 12) of any one of the first to ninth aspects.

Accordingly, the above configuration enables provision of an electronic device capable of externally extracting light generated in the light emitting layer with good efficiency.

A method for producing a light emitting element (the sub pixel circuit portion 12) according to a fifteenth aspect of the present invention is a method including: forming at least one trench (insulating trench, for example, the trench portion 34TR, the first trench portion 34TR1, the second trench portion 34TR2, the third trench portion 34TR3, the step-shaped trench 33TR) in an interlayer insulating layer 31 layered on a substrate (the insulating substrate 21), the at least one trench being formed in a region for forming a light emitting region 13; forming a first electrode 41 on the interlayer insulating layer 31, the first electrode 41 including a trench (for example, the first trench portion 41TR1, the second trench portion 41TR2, the third trench portion 41TR3) along the trench of the interlayer insulating layer 31; forming an edge cover 51 on the first electrode 41, the edge cover 51 surrounding the trench (for example, the first trench portion 41TR1, the second trench portion 41TR2, the third trench portion 41TR3) in the first electrode 41, covering end portions of the first electrode 41 where the trench (for example, the first trench portion 41TR1, the second trench portion 41TR2, the third trench portion 41TR3) is not formed, and including an opening at the light emitting region 13; and forming an electroluminescent layer (the EL layer 42) and a second electrode 43 on the first electrode 41, the electroluminescent layer including at least a light emitting layer, and at the trench (for example, the first trench portion 41TR1, the second trench portion 41TR2, the third trench portion 41TR3) in the first electrode 41, the first electrode 41, the electroluminescent layer, and the second electrode 43 being layered in this order and in contact with each other. In such cases, a reflective electrode is employed as one electrode out of the first electrode 41 and the second electrode 43.

As described above, the display device of PTL 1 has a configuration in which an insulating film is provided within the trenches 530. Accordingly, superfluous reflection occurs in which a portion of the light generated in the organic EL layer 528 may be reflected by an interface between the first electrode 525 and the insulating layer (the partition 527) forming the reflection structure 526 or the like, and propagates within the insulating layer without being externally extracted.

In contrast thereto, the above method enables production of a light emitting element including a trench, within the light emitting region 13, including the first electrode 41, the EL layer 42, and the second electrode 43, these being layered in this order and in contact with each other, and not including a partition (insulating layer) on a reflection structure such as in the trenches 530 of the sub pixel 510R in PTL 1.

Thus, the light emitting element obtained by the above method reflects light from the light emitting region 13 using the reflective electrode without interposing an insulating layer, and so superfluous reflection like that in PTL 1 does not occur. Thus, light generated in the EL layer 42 (the light emitting layer) can be externally extracted with good efficiency.

Moreover, in PTL 1, as illustrated in FIG. 13B, because the partitions 527 are disposed on the first electrode 525, the organic EL layer 528 above the reflection structures 526 does not emit light (current does not flow). Thus, in PTL 1, the light emitting layer of the organic EL layer 528 on the side faces of the trenches 530 does not emit light.

Moreover, in PTL 1, the surface area of the light emitting regions within each of the sub pixels 510R, 510G, and 510B is defined by the size in plan view of openings, each of the openings being defined by two partitions 527, in other words, by the surface area in plan view of the trenches 530 within each of the sub pixels 510R, 510G, and 510B.

In contrast thereto, in the light emitting element obtained by the above method, the side faces of the trench portions can also be employed as the light emitting region. The light emitting region of the light emitting element is also not partitioned by non-light-emitting regions. Accordingly, the light emitting element enables the light emitting region to be utilized effectively.

Thus, the light emitting element enables the light emitting region (light emitting surface area) to be made larger than that of PTL 1, enabling the current density required for light emission to be lowered. Accordingly, the above method enables the lifespan of the light emitting element, and moreover the lifespan of the display panel 2 and the display device 1 including the light emitting elements, to be extended.

Accordingly, the above method enables provision of a method for producing a light emitting element capable of externally extracting light generated in the light emitting layer with good efficiency.

A method for producing a light emitting element (the sub pixel circuit portion 12) according to a sixteenth aspect of the present invention may include, at the step of forming the trench in the light emitting region 13 of the interlayer insulating layer 31 in the fifteenth aspect, forming a plurality of trenches in the interlayer insulating layer in the region for forming the light emitting region 13.

As stated above, in PTL 1 the surface area of the light emitting region within each of the sub pixels 510R, 510G, and 510B is defined by the size of openings, each of the openings being defined by two partitions 527 in plan view, in other words, by the surface area in plan view of the trenches 530 within each of the sub pixels 510R, 510G, and 510B.

Thus, the higher the definition of the display panel in an organic EL display device, the smaller the effective surface area of a single sub pixel. It is also difficult for the plurality of trenches to be provided in a single sub pixel.

In contrast thereto, in the light emitting element obtained by the above method, a plurality of trenches are provided within the light emitting regions 13, namely, within a single light emitting region 13, and the light emitting region 13 does not have a configuration in which the light emitting region is partitioned into a plurality of light emitting regions by non-light-emitting regions as in PTL 1. Accordingly, the above method enables the light emitting regions to be utilized effectively even in cases in which a plurality of trenches are provided as described above. The light emitting element obtained by the above method enables both the side walls of each of the trenches and the inter-trench space to be used as light emitting regions.

The above method enables the inter-trench space to be made smaller than that of the PTL 1 because partitions 527 are not provided within each of light emitting regions 510Ra nor between the light emitting regions 510Ra as in PTL 1, enabling the inter-trench space to be secured more easily. Thus, compared to in PTL 1, the above method does not require such high accuracy alignment technology as in PTL 1 (and in particular, high accuracy alignment technology in the trench arrangement direction). Accordingly, the above method does not require a mask of such a high accuracy grade as that of PTL 1, enabling production cost to be lowered.

A method for producing a light emitting element (the sub pixel circuit portion 12) according to a seventeenth aspect of the present invention may include, at the step of forming the trench in the interlayer insulating layer 31 in the sixteenth aspect, forming a step-shaped trench (for example, the step-shaped trench 40TR) in which at least one sub trench (for example, the second trench portion 43TR2, the third trench portion 43TR3) having a size smaller than that of a single trench is provided within the single trench (for example, the first trench portion 41TR1) in plan view.

For example, the method may include, at the step of forming the trench in the interlayer insulating layer 31, forming a step-shaped trench having a step shape at the inside in which at least one sub trench (namely, the second trench portion 34TR2 smaller in length-and-width size than the first trench portion 34TR1) having a size smaller than that of the first trench portion 34TR1 is provided within a single trench, for example, the first trench portion 34RT1 serving as a main trench.

Or, the method may include, at the step of forming the trench in the interlayer insulating layer 31, forming a step-shaped trench having a step shape at the inside in which, within at least one trench from out of trenches provided in the horizontal direction, for example from out of the first trench portion 34TR1 and the second trench portion 34TR2, at least one trench having a size smaller than that of the trench is provided. Namely, a plurality of main trenches may be provided in the horizontal direction.

In the conventional technology of PTL 1, for example, as electronic devices in which light emitting elements are mounted, such as display panels, become higher in definition, due to the plurality of trenches being formed in the length direction (Y direction) of the light emitting region of the light emitting element an inter-trench space limit (a state in which two trenches are not formable within a light emitting region) is reached, and the design shape is not achievable.

However, in the above method, it is sufficient, for example, to merely maintain a relationship in which at least one trench having a size smaller than that of a single trench is provided within the single trench, such as a main trench-to-sub trench relationship (namely, a relationship in which at least one sub trench is formed within a main trench), and conventional high accuracy mask alignment in the Y direction is not required. Accordingly, the above method is appropriate to production of electronic devices such as high definition display panels and display devices.

In conventional technology, when only one trench is formable within each of the light emitting regions due to the inter-trench space limit, light guided within a light emitting unit can only be reflected at two locations, these being the left and right side walls of the single trench. However, in the above configuration, at least one trench having a size smaller than that of a single trench is formed within the single trench. Forming is easier than forming a plurality of (for example, two) trenches side-by-side in the length (Y direction). As a result, the plurality of trenches can be formed within the light emitting region even at high definition.

Thus, the light emitting element obtained by the above method enables guided light (attenuated light), which is being attenuated by the light propagation distance limit within the light emitting unit and is not being externally extracted, to at least be reflected at each of the trench edges at the left and right of the main trench and at the left and right of the sub trench, and to be externally extracted. Namely, the light emitting element obtained by the above method includes, for example, reflective walls present at least at four locations in each of the length direction (Y direction) and width direction (X direction) of each of the light emitting regions, and the attenuated light can be reflected and externally extracted by these reflective walls.

Accordingly, the above method enables provision of a method for producing a light emitting element enabling light extraction efficiency to be improved even in high definition panels, and capable of having an extended lifespan compared to the conventional light emitting element.

A method for producing a light emitting element (the sub pixel circuit portion 12) according to an eighteenth aspect of the present invention may include, at the step of forming the trench in the interlayer insulating layer 31 in the sixteenth aspect, forming a plurality of trenches formed side-by-side in plan view.

As stated above, in PTL 1 the surface area of the light emitting regions within each of the sub pixels 510R, 510G, and 510B is defined by the size of openings, each of the openings being defined by two partitions 527 in plan view, in other words, by the surface area in plan view of the trenches 530 within each of the sub pixels 510R, 510G, and 510B.

Thus, the higher the definition of the display panel in an organic EL display device, the smaller the effective surface area of a single sub pixel. It is also difficult for the plurality of trenches to be formed in a single sub pixel.

However, the light emitting element obtained by the above method has a configuration in which the plurality of trenches are provided side-by-side in plan view within the light emitting region 13, namely within a single light emitting region 13, and does not have a configuration in which the light emitting region is partitioned into a plurality of light emitting regions by non-light-emitting regions as in PTL 1. Accordingly, the above method accordingly enables a light emitting element to be obtained that is capable of effectively utilizing the light emitting regions even in cases in which the plurality of trenches are provided side-by-side in the horizontal direction as described above. The light emitting element obtained by the above method enables both the side walls of each of the trenches and the inter-trench space to be used as light emitting regions.

The above method enables the inter-trench space to be made smaller than that of PTL 1 because partitions 527 are not provided within each of light emitting regions 510Ra nor between the light emitting regions 510Ra as in PTL 1, enabling the inter-trench space to be secured more easily. Thus, compared to in PTL 1, the above method does not require such high accuracy alignment technology as in PTL 1 (and in particular, high accuracy alignment technology in the trench arrangement direction). Accordingly, the above method does not require a mask of such a high accuracy grade as that of PTL 1, enabling production cost to be lowered.

The present invention is not limited to each of the embodiments described above, and various modifications may be implemented within a range not departing from the scope of the claims. Embodiments obtained by appropriately combining technical approaches described in each of the different embodiments also fall within the scope of the technology of the present invention. Moreover, novel technical features may be formed by combining the technical approaches described in each of the embodiments.

INDUSTRIAL APPLICABILITY

The present invention is utilizable in various devices that employ organic EL elements, and, for example, is utilizable in display devices such as televisions and illumination devices.

REFERENCE SIGNS LIST

1 Display device
2 Display panel
3 Gate scan driver
4 Source driver
11 Pixel circuit portion
12 Sub pixel circuit portion (light emitting element)
12R R sub pixel circuit portion (light emitting element)
12G G sub pixel circuit portion (light emitting element)
12B B sub pixel circuit portion (light emitting element)
12W W sub pixel circuit portion (light emitting element)
13 Light emitting region
20 Semiconductor substrate
21 Insulating substrate (substrate)
22 TFT circuit portion
22a TFT circuit portion
23 TFT
24 Drive TFT-first electrode contact portion
31 Interlayer insulating layer
32 Contact hole
33TR, 40TR Step-shaped trench
34TR Trench portion
34TR1, 40TR1, 41TR1, 42TR1, 43TR1 First trench portion (main trench)
34TR2, 40TR2, 41TR2, 42TR2, 43TR2 Second trench portion (sub trench, first sub trench)
34TR3, 40TR3, 41TR3, 42TR3, 43TR3 Third trench portion (sub trench, second sub trench)
40 EL element
41 First electrode
41TR1a, 41TR1b, 41TR2a, 41TR2b, 41TR3a, 41TR3b Side wall
42 EL layer (electroluminescent layer)

43 Second electrode
43TR1*a*, 43TR1*b*, 43TR2*a*, 43TR2*b*, 43TR3*a*, 43TR3*b* Side wall
51 Edge cover
52 Opening
61, 63, 65, 67, 71, 73 Photosensitive resist
62, 64, 66, 68, 72, 74 Photomask
GL Scanning line
SL Data line

The invention claimed is:

1. A light emitting element comprising:
a substrate;
an interlayer insulating layer on the substrate;
a first electrode;
an edge cover covering an end portion of the first electrode and including an opening at a single light emitting region;
an electroluminescent layer including at least a light emitting layer; and
a second electrode,
the first electrode, the edge cover, the electroluminescent layer, and the second electrode being layered in this order on the substrate with the interlayer insulating layer interposed between the substrate and the first electrode;
one electrode out of the first electrode and the second electrode including a reflective electrode;
a first trench having an indented shape being disposed within the single light emitting region;
a second trench having an indented shape being disposed within the first trench; and
a drive circuit portion provided on the substrate, the drive circuit portion including a drive transistor connected to the first electrode and configured to supply a drive current to an electroluminescent element configured by the first electrode, the electroluminescent layer, and the second electrode,
wherein the first electrode is connected to the drive transistor through a contact hole formed in the interlayer insulating layer, the contact hole not being located in the single light emitting region, and
wherein the interlayer insulating layer includes a first plane being disposed between the first trench and the second trench;
a second plane being disposed within the second trench, being closer to the substrate than the first plane;
a third plane disposed between the opening and the first trench, being farther from the substrate than the first plane.

2. The light emitting element according to claim 1, wherein:
the first electrode comprises the reflective electrode; and
light reflected by the reflective electrode is externally extracted from the second electrode side.

3. A display panel comprising a plurality of the light emitting elements according to claim 1, the plurality of the light emitting elements are arranged on the display panel.

4. The display panel according to claim 3, wherein:
a plurality of pixels, each configured from a plurality of sub pixels, are arranged in a matrix pattern; and
each of the plurality of sub pixels is configured by the light emitting element.

5. The display panel according to claim 4, further comprising:
a plurality of scanning lines; and
a plurality of data lines, wherein
each of the plurality of pixels is configured from four sub pixels provided corresponding to intersection points, two adjacent scanning lines of the plurality of scanning lines and two adjacent data lines of the plurality of data lines being intersected at the intersection points.

6. A display device comprising the display panel according to claim 3.

7. An electronic device comprising the light emitting element according to claim 1.

8. The light emitting element according to claim 1, wherein: the third plane is formed in a region adjacent to the contact hole.

9. The light emitting element according to claim 1, further comprising:
a thin film transistor overlapping with the first plane in a plane view.

10. The light emitting element according to claim 1, further comprising:
a thin film transistor overlapping with the second plane in a plane view.

* * * * *